(12) United States Patent
Maekawa et al.

(10) Patent No.: US 7,642,973 B2
(45) Date of Patent: Jan. 5, 2010

(54) ELECTROMAGNETIC WAVE ANALYSIS APPARATUS AND DESIGN SUPPORT APPARATUS

(75) Inventors: Tomoya Maekawa, Nara (JP); Tetsuyoshi Ogura, Settsu (JP); Toru Yamada, Katano (JP)

(73) Assignee: Panasonic Corporation, Osaka (JP)

( * ) Notice: Subject to any disclaimer, the term of this patent is extended or adjusted under 35 U.S.C. 154(b) by 552 days.

(21) Appl. No.: 11/311,992

(22) Filed: Dec. 20, 2005

(65) Prior Publication Data

US 2006/0132118 A1 Jun. 22, 2006

(30) Foreign Application Priority Data

Dec. 22, 2004 (JP) ............................. 2004-371994
Mar. 31, 2005 (JP) ............................. 2005-103800

(51) Int. Cl.
G01R 29/10 (2006.01)
G01R 31/302 (2006.01)

(52) U.S. Cl. ...................................... 343/703; 324/750

(58) Field of Classification Search ................. 343/703; 324/750, 258, 632, 260, 247, 158.1, 765, 324/633, 629, 95, 96; 702/152, 153, 57
See application file for complete search history.

(56) References Cited

U.S. PATENT DOCUMENTS

| | | | |
|---|---|---|---|
| 6,456,070 B1 | 9/2002 | Kazama et al. | |
| 6,617,860 B2 * | 9/2003 | Uesaka et al. | 324/633 |
| 6,850,851 B1 * | 2/2005 | Fourestie et al. | 702/65 |
| 6,882,144 B2 * | 4/2005 | Kajiwara et al. | 324/247 |
| 7,268,564 B2 * | 9/2007 | Ozaki et al. | 324/632 |
| 7,317,319 B2 * | 1/2008 | Kazama | 324/632 |
| 2002/0040466 A1 * | 4/2002 | Khazei | 716/9 |

FOREIGN PATENT DOCUMENTS

| | | |
|---|---|---|
| JP | 8-221454 | 8/1996 |
| JP | 11-45294 | 2/1999 |
| JP | 2000-19204 | 1/2000 |
| JP | 2000-206163 | 7/2000 |

* cited by examiner

Primary Examiner—Hoang V Nguyen
Assistant Examiner—Robert Karacsony
(74) Attorney, Agent, or Firm—Hamre, Schumann, Mueller & Larson, P.C.

(57) ABSTRACT

A design support apparatus of the present invention includes the following: an antenna electromagnetic field distribution input portion that inputs data indicating an antenna electromagnetic field distribution in the vicinity of electronic equipment; a board near electromagnetic field distribution input portion that inputs data indicating a board near electromagnetic field distribution as unwanted radiation noise radiated from a board of the electronic equipment; and a correlation value generator that generates a distribution of correlation values showing a correlation between the antenna electromagnetic field and the board near electromagnetic field based on the antenna electromagnetic field distribution data and the board near electromagnetic field distribution data.

14 Claims, 23 Drawing Sheets

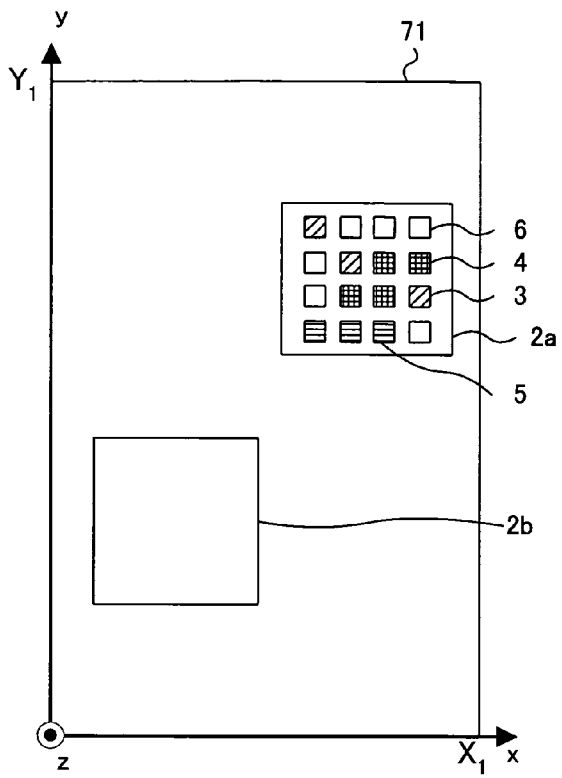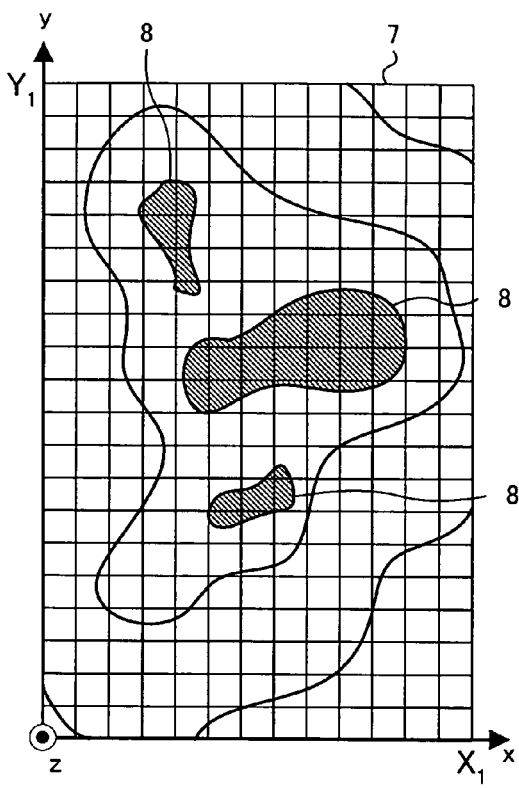
FIG. 15A    FIG. 15B
FIG. 15C
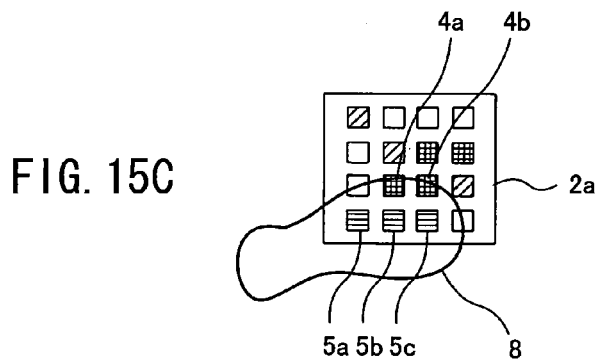
| ID | Type of mobile telephone | Band | Type of antenna |
|----|--------------------------|------|-----------------|
| 1 | W-CDMA | 700-800MHz | A type |
| 2 | PDC | 700-800MHz | C type |
| 3 | GSM | 700-800MHz | A type |
| 4 | W-CDMA | 2GHz | O type |
| ... | ... | ... | ... |
FIG. 16

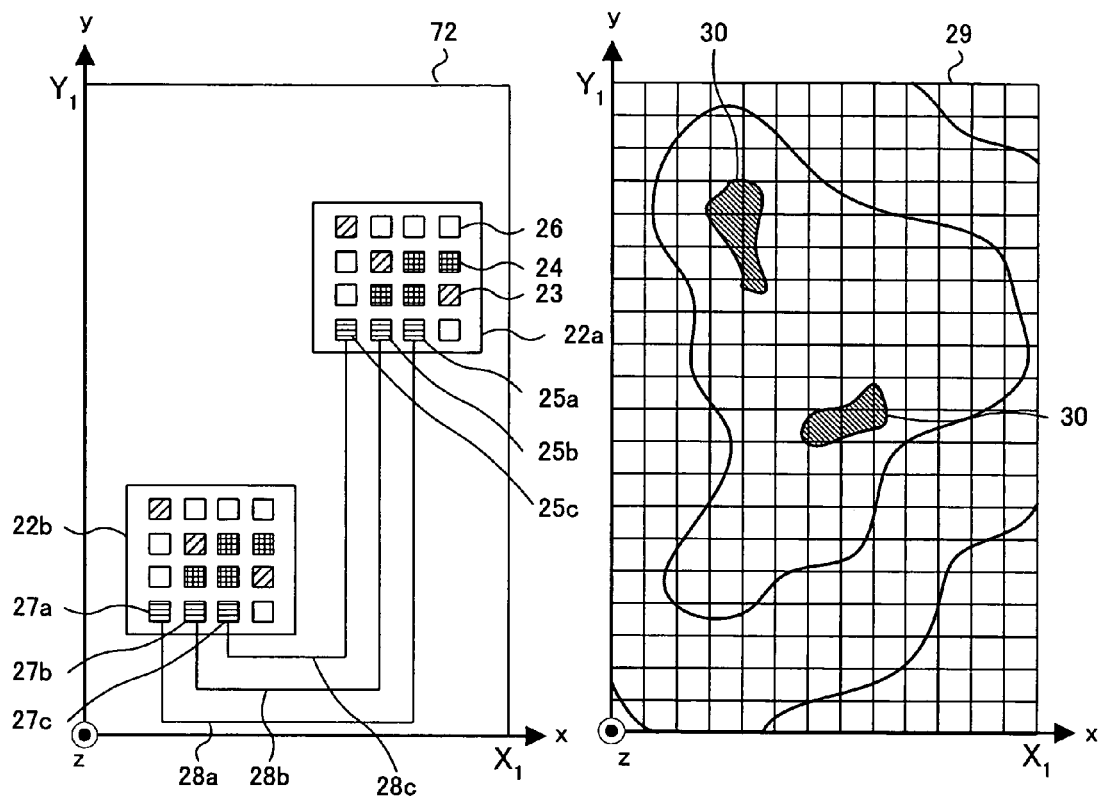
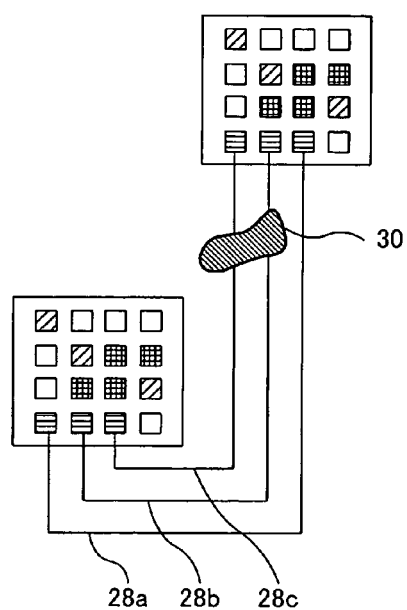
FIG. 20A  FIG. 20B
FIG. 20C

ELECTROMAGNETIC WAVE ANALYSIS APPARATUS AND DESIGN SUPPORT APPARATUS

BACKGROUND OF THE INVENTION

1. Field of the Invention

The present invention relates to an electromagnetic wave analysis apparatus, a design support apparatus, an electromagnetic wave analysis program, or a design support program that can evaluate the transmission and reception functions of electronic equipment such as a mobile telephone for transmitting and receiving electromagnetic waves.

2. Description of Related Art

In recent years, electronic equipment as typified by digital audiovisual equipment or a portable information terminal has become smaller and higher performance. As a result of reducing the size and improving the performance, the packaging density of a printed circuit board of the electronic equipment has increased. Moreover, the operating frequency of an integrated circuit (IC) mounted on the printed circuit board is very high. Thus, electromagnetic waves radiated from the printed circuit board, i.e., unwanted radiation noise may cause significant electromagnetic interference (EMI), including a transmission/reception disturbance and malfunction of the electronic equipment. An enormous amount of time and manpower is required to deal with the EMI.

As a conventional solution to the EMI problem, e.g., JP 2000-206163 A (Patent Document 1) has proposed an apparatus for measuring the intensity of an electromagnetic field in the vicinity of a circuit board of electronic equipment. This apparatus allows a loop antenna to get closer to the surrounding area of the circuit board. In such a case, an electric field and a magnetic field are present between the circuit board and the loop antenna, and currents generated by the electric field and the magnetic field are combined into a composite current that flows through the loop antenna. By measuring this composite current, it is possible to measure the electric field component and the magnetic field component of an electromagnetic field in the vicinity of the circuit board.

JP 8(1996)-221454 A (Patent Document 2) has proposed a simulation method for calculating the amount of crosstalk between the line patterns of a circuit board. In this simulation method, coupling coefficients that correspond to the combinations of coupled lines with various shapes and spaces of the line patterns are calculated and stored in a database. At the time of calculating crosstalk in any portion of a circuit to be analyzed, the coupling coefficient of a structure closest to the line patterns of the circuit is retrieved from the database.

JP 11(1999)-45294 A (Patent Document 3) has proposed a method for analyzing noise generated in the multiple lines of a circuit board. In this method, the multiple lines to be analyzed is divided into groups of two lines, and a noise waveform is calculated for each of the groups by simulation. Then, the noise waveforms of the groups of lines are synthesized to determine a noise waveform of the multiple lines.

JP 2000-19204 A (Patent Document 4) has proposed an apparatus that superimposes an intensity distribution map of noise caused by electromagnetic waves radiated from a board on image data for representation. In this apparatus, a microantenna probe for noise detection scans the board and measures noise due to the electromagnetic waves radiated from the board. The measured noise then is subjected to frequency analysis with a spectrum analyzer. The noise intensity distribution resulting from the analysis is superimposed on the image data of the board and displayed on a display.

Because of such a high-speed operating frequency of the IC mounted on the circuit board, the effect of unwanted radiation noise generated from the circuit board on the functions of transmitting and receiving electromagnetic waves of the electronic equipment cannot be ignored. However, the above conventional techniques merely propose the apparatus for measuring the electromagnetic waves generated from the electronic equipment. In other words, they do not propose an apparatus or method for obtaining information about how the unwanted radiation noise will affect the transmission and reception of electromagnetic waves by the electronic equipment. Therefore, it has been difficult to obtain information about the presence or absence of a transmission/reception disturbance due to the unwanted radiation noise or about a place where the transmission/reception disturbance occurs, e.g., in designing the electronic equipment such as a mobile telephone.

SUMMARY OF THE INVENTION

Therefore, with the foregoing in mind, it is an object of the present invention to provide an electromagnetic wave analysis apparatus, a design support apparatus, an electromagnetic wave analysis program, or a design support program that can obtain information about the effect of unwanted radiation noise of electronic equipment on the transmission and reception functions of the electronic equipment.

An electromagnetic wave analysis apparatus of the present invention examines the effect on electromagnetic waves transmitted and received via an antenna of unwanted radiation noise generated from a circuit board of electronic equipment that transmits and receives electromagnetic waves via the antenna. The electromagnetic wave analysis apparatus includes the following: an antenna electromagnetic field distribution input portion; a board near electromagnetic field distribution input portion; and a correlation value generator. The antenna electromagnetic field distribution input portion inputs antenna electromagnetic field distribution data indicating a distribution of an antenna electromagnetic field that is a magnetic field component or an electric field component of the electromagnetic waves transmitted and received via the antenna. The board near electromagnetic field distribution input portion inputs board near electromagnetic field distribution data indicating a distribution of either or both of an electric field component and a magnetic field component of a board near electromagnetic field that is unwanted radiation noise radiated from the circuit board of the electronic equipment as a result of operation of the electronic equipment. The correlation value generator generates a distribution of correlation values showing a correlation between the antenna electromagnetic field and the board near electromagnetic field based on the antenna electromagnetic field distribution data and the board near electromagnetic field distribution data.

In the electromagnetic wave analysis apparatus of the present invention, the antenna electromagnetic field distribution input portion inputs the antenna electromagnetic field distribution data for transmission and reception of the electromagnetic waves by the electronic equipment, and the board near electromagnetic field distribution input portion inputs the board near electromagnetic field distribution data as an unwanted radiation noise distribution. The correlation value generator generates a correlation value distribution based on the two distribution data. The correlation value distribution is a distribution of the correlation values showing a correlation between the antenna electromagnetic field distribution and the board near electromagnetic field distribution. Specifically, the correlation value distribution is a distribution of the values showing the effect of unwanted radiation noise on the antenna electromagnetic field, i.e., the electromagnetic waves transmitted and received by the electronic equipment. Therefore, the effect of unwanted radiation noise on the functions of transmitting and receiving electromagnetic waves of the electronic equipment can be obtained from the correlation value distribution.

Moreover, the correlation value distribution can be provided by an apparatus with a simple configuration that includes the antenna electromagnetic field distribution input portion, the board near electromagnetic field distribution input portion, and the correlation value generator. Thus, it is easy to obtain information about the effect of unwanted radiation noise on the transmission and reception functions of the electronic equipment.

An electromagnetic wave analysis program of the present invention allows a computer to execute the processes of examining the effect on electromagnetic waves transmitted and received via an antenna of unwanted radiation noise generated from a circuit board of electronic equipment that transmits and receives electromagnetic waves via the antenna. The electromagnetic wave analysis program allows the computer to execute the following processes: an antenna electromagnetic field distribution input process of inputting antenna electromagnetic field distribution data indicating a distribution of an antenna electromagnetic field that is a magnetic field component or an electric field component of the electromagnetic waves transmitted and received via the antenna; a board near electromagnetic field distribution input process of inputting board near electromagnetic field distribution data indicating a distribution of either or both of an electric field component and a magnetic field component of a board near electromagnetic field that is unwanted radiation noise radiated from the circuit board of the electronic equipment as a result of operation of the electronic equipment; and a correlation value generation process of generating a distribution of correlation values showing a correlation between the antenna electromagnetic field and the board near electromagnetic field based on the antenna electromagnetic field distribution data and the board near electromagnetic field distribution data.

Accordingly, the present invention can provide an electromagnetic wave analysis apparatus, a design support apparatus, an electromagnetic wave analysis program, or a design support program that can obtain information about the effect of unwanted radiation noise of electronic equipment on the transmission and reception functions of the electronic equipment.

BRIEF DESCRIPTION OF THE DRAWINGS

FIG. 15A shows an example of ICs arranged on a circuit board 71.

FIG. 15B shows an example of an antenna magnetic field distribution 7 around the circuit board 71. FIG. 15C shows the positions of terminals of an IC that correspond to a region 8 where an antenna magnetic field component exceeds a threshold value.

FIG. 16 shows an example of antenna magnetic field distribution data of mobile telephones that are stored in an antenna electromagnetic field distribution database 9.

FIG. 20A shows an example of lines connected between ICs on a circuit board 72. FIG. 20B shows an example of an antenna magnetic field distribution 29 around the circuit board 72. FIG. 20C is a diagram superimposing a region 30 where an antenna magnetic field component exceeds a threshold value and the arrangement of the ICs and the lines.

DETAILED DESCRIPTION OF THE INVENTION

Figure 1A:
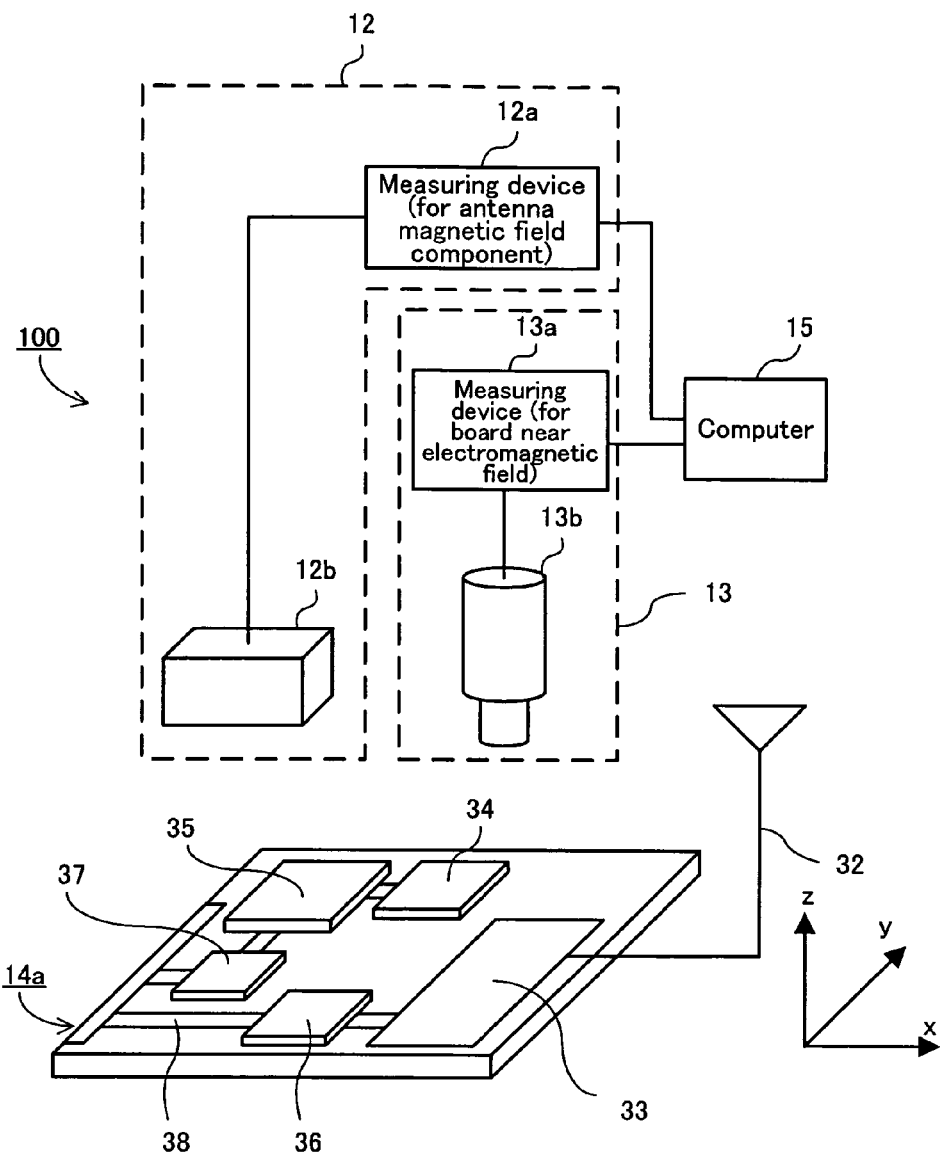
FIG. 1A is a functional block diagram showing the configuration of a design support apparatus 100 of an embodiment of the present invention.

The electromagnetic wave analysis apparatus of the present invention further may include a comparator. The comparator decides the presence or absence of a transmission/reception disturbance of the electromagnetic waves in the electronic equipment by comparing each of the correlation values in the correlation value distribution with a predetermined threshold value.

The comparator compares each of the correlation values in the correlation value distribution with a decision threshold value, and thus can decide the presence or absence of a transmission/reception disturbance of the electromagnetic waves due to unwanted radiation noise at each position in the correlation value distribution. Therefore, the location of the occurrence of the transmission/reception disturbance can be specified in the correlation value distribution. Consequently, it is possible to obtain information about whether there is a problem caused by the unwanted radiation noise in the electronic equipment and a place where the problem occurs.

In the electromagnetic wave analysis apparatus of the present invention, it is preferable that the correlation values include the product of a value of the antenna electromagnetic field and a value of the board near electromagnetic field.

The correlation values may be determined as the product of a value of the antenna electromagnetic field and a value of the board near electromagnetic field. Accordingly, the correlation values showing a correlation between the antenna electromagnetic field and the board near electromagnetic field can be obtained with a simple calculation.

In the electromagnetic wave analysis apparatus of the present invention, it is preferable that the correlation value generator further generates either or both of a maximum value and a minimum value of the correlation values as an evaluation value.

The correlation value generator generates the evaluation value, so that the effect of unwanted radiation noise generated from the circuit board of the electronic equipment on the electromagnetic waves transmitted and received via the antenna can be expressed quantitatively.

In the electromagnetic wave analysis apparatus of the present invention, it is preferable that the antenna electromagnetic field distribution data and the board near electromagnetic field distribution data are expressed as vectors with coordinates, and that the correlation value generator generates the distribution of correlation values by calculating the correlation values in such a manner that at least one component of a vector of the antenna electromagnetic field distribution data at a point with coordinates is multiplied by the at least one component of a vector of the board near electromagnetic field distribution data at a point with coordinates corresponding to the coordinates of the point.

The correlation value generator can generate a correlation value in at least one direction. Thus, the correlation values can be obtained while taking into account the directivity of the antenna electromagnetic field and the directivity of the board near electromagnetic field.

The electromagnetic wave analysis apparatus of the present invention further may include an antenna electromagnetic field distribution measurement portion and a board near electromagnetic field distribution measurement portion. The antenna electromagnetic field distribution measurement portion determines the distribution of an antenna electromagnetic field that is a magnetic field component or an electric field component of the electromagnetic waves transmitted and received via the antenna by measuring the electromagnetic field around the electronic equipment, and sends the result of the measurement to the antenna electromagnetic field distribution input portion as the antenna electromagnetic field distribution data. The board near electromagnetic field distribution measurement portion determines the distribution of either or both of an electric field component and a magnetic field component of a board near electromagnetic field that is unwanted radiation noise radiated from the circuit board of the electronic equipment as a result of operation of the electronic equipment by measuring the electromagnetic field around the electronic equipment, and then sends the result of the measurement to the board near electromagnetic field distribution input portion as the board near electromagnetic field distribution data.

The antenna electromagnetic field distribution measurement portion can provide the antenna electromagnetic field distribution data as input data to the antenna electromagnetic field distribution input portion. The board near electromagnetic field distribution measurement portion can provide the board near electromagnetic field distribution data as input data to the board near electromagnetic field distribution input portion.

The electromagnetic wave analysis apparatus of the present invention further may include an antenna electromagnetic field distribution analysis portion and a board near electromagnetic field distribution analysis portion. The antenna electromagnetic field distribution analysis portion determines the distribution of an antenna electromagnetic field that is a magnetic field component or an electric field component of the electromagnetic waves transmitted and received via the antenna by simulation through analyzing the electromagnetic field around the electronic equipment, and sends the result of the simulation to the antenna electromagnetic field distribution input portion as the antenna electromagnetic field distribution data. The board near electromagnetic field distribution analysis portion determines the distribution of either or both of an electric field component and a magnetic field component of a board near electromagnetic field that is unwanted radiation noise radiated from the circuit board of the electronic equipment as a result of operation of the electronic equipment by simulation through analyzing the electromagnetic field around the electronic equipment, and then sends the result of the simulation to the board near electromagnetic field distribution input portion as the board near electromagnetic field distribution data.

The antenna electromagnetic field distribution analysis portion can provide the antenna electromagnetic field distribution data as input data to the antenna electromagnetic field distribution input portion. The board near electromagnetic field distribution analysis portion can provide the board near electromagnetic field distribution data as input data to the board near electromagnetic field distribution input portion.

The electromagnetic wave analysis apparatus of the present invention further may include a data corrector. Each of the antenna electromagnetic field distribution data and the board near electromagnetic field distribution data indicates a distribution on at least one plane. When a distance between the plane of the distribution indicated by the antenna electromagnetic field distribution data and the circuit board differs from a distance between the plane of the distribution indicated by the board near electromagnetic field distribution data and the circuit board, the data corrector converts at least one of the antenna electromagnetic field distribution data and the board near electromagnetic field distribution data so that the distance between the plane of the distribution indicated by the antenna electromagnetic field distribution data and the circuit board is substantially equal to the distance between the plane of the distribution indicated by the board near electromagnetic field distribution data and the circuit board.

The data corrector allows the distance between the plane of the distribution indicated by the antenna electromagnetic field distribution data and the circuit board to be substantially equal to the distance between the plane of the distribution indicated by the board near electromagnetic field distribution data and the circuit board. Therefore, even if the two distances differ, the antenna electromagnetic field distribution data and the board near electromagnetic field distribution data are corrected to show substantially the same range of distribution. Consequently, the correlation values are determined using the corrected data and thus can have high reliability.

The electromagnetic wave analysis apparatus of the present invention further may include a board design data input portion and a guideline information generator. The board design data input portion inputs board design data indicating a structure of the circuit board of the electronic equipment. The guideline information generator generates information used as a guideline for designing the electronic equipment based on the decision made by the comparator and the board design data.

The guideline information generator generates information used as a guideline for a design change based on the decision made by the comparator and the board design data input by the board design data input portion. Therefore, a designer can obtain the guideline for changing the design of the electronic equipment to avoid a transmission/reception disturbance of the electromagnetic waves due to the unwanted radiation noise.

An electromagnetic wave analysis apparatus of the present invention examines the effect on electromagnetic waves transmitted and received via an antenna of components or lines provided on a circuit board of electronic equipment that transmits and receives electromagnetic waves via the antenna. The electromagnetic wave analysis apparatus includes the following: a position input portion; an antenna electromagnetic field distribution input portion; and an extraction portion. The position input portion inputs position data indicating positions of terminals of the components or positions of the lines provided on the circuit board. The antenna electromagnetic field distribution input portion inputs antenna electromagnetic field distribution data indicating a distribution of an antenna electromagnetic field that is a magnetic field component or an electric field component of the electromagnetic waves transmitted and received via the antenna. The extraction portion extracts a terminal or a line that may affect the transmission and reception functions of the electronic equipment from the terminals of the components or the lines indicated by the position data by comparing the position data with the antenna electromagnetic field distribution data.

The extraction portion compares the position data with the antenna electromagnetic field distribution data, and thus can obtain a correlation between the positions of the terminals of the components or the lines indicated by the position data and the antenna electromagnetic field. The resultant correlation shows the degree of the effect of unwanted radiation noise generated from the terminals of the components or the lines on the antenna electromagnetic field distribution. Based on the correlation, therefore, the extraction portion can extract a terminal of a component or a line that may affect the transmission and reception functions of the electronic equipment. Thus, it is possible to obtain information about the effect of the component or line arrangement of the circuit board of the electronic equipment on the antenna transmission and reception functions of the electronic equipment. In other words, it is possible to obtain information about the effect of unwanted radiation noise radiated from the components or lines of the electronic equipment on the transmission and reception functions of the electronic equipment.

In the electromagnetic wave analysis apparatus of the present invention, it is preferable that the extraction portion extracts a terminal or a line at the position corresponding to a region where the antenna electromagnetic field exceeds a predetermined threshold value in a distribution range indicated by the antenna electromagnetic field distribution data.

The extraction portion extracts a terminal of a component or a line at the position corresponding to the region where the antenna electromagnetic field exceeds a predetermined threshold value, and thus can extract a terminal of a component or a line that may affect the antenna electromagnetic field.

The electromagnetic wave analysis apparatus of the present invention further may include a frequency input portion, a frequency storage portion, and a judgment portion. The frequency input portion inputs an operating frequency as a frequency of signals transmitted through the terminals of the components or the lines indicated by the position data. The frequency storage portion stores analytic frequency data indicating a frequency to be analyzed of the electromagnetic waves transmitted and received via the antenna. The judgment portion makes a judgment on whether or not the terminals of the components or the lines indicated by the position data affect the transmission and reception functions of the electronic equipment based on the operating frequency and the analytic frequency data.

The judgment portion compares the operation frequency with the frequency of the electromagnetic waves transmitted and received via the antenna, and thus can obtain a correlation between the frequency of the signals transmitted through the components or the lines and the frequency of the electromagnetic waves transmitted and received via the antenna. The resultant correlation shows the degree of the effect of the signals transmitted through the terminals of the components or the lines on the antenna electromagnetic field distribution. Based on the correlation, therefore, the judgment portion can judge whether or not the components or lines of the circuit board may affect the electromagnetic waves transmitted and received via the antenna of the electronic equipment.

In the electromagnetic wave analysis apparatus of the present invention, it is preferable that the frequency storage portion stores data indicating a frequency band of the electromagnetic waves transmitted and received via the antenna as the analytic frequency data, and that the judgment portion makes the judgment by deciding whether or not the operating frequency and a multiple frequency component that is an integer multiple of the operating frequency are included in the frequency band of the electromagnetic waves transmitted and received via the antenna.

When the operating frequency or the multiple frequency component that is an integer multiple of the operating frequency of the terminals of the components or the lines provided on the circuit board of the electronic equipment is included in the frequency band of the electromagnetic waves transmitted and received via the antenna of the electronic equipment, it is highly likely that the unwanted radiation noise generated from the terminals of the components or the lines affects the transmission and reception functions. Therefore, the judgment portion can judge whether or not the terminals of the components or the lines affect the transmission and reception functions of the electronic equipment by deciding whether or not the operating frequency of the terminals of the components or the lines is included in the frequency band of the electromagnetic waves transmitted and received via the antenna.

In the electromagnetic wave analysis apparatus of the present invention, it is preferable that the frequency storage portion stores a frequency of the electromagnetic waves transmitted via the antenna and a frequency of the electromagnetic waves received via the antenna as the analytic frequency data, and that the judgment portion determines a difference between the frequency of the electromagnetic waves transmitted via the antenna and the frequency of the electromagnetic waves received via the antenna, and makes the judgment by comparing the difference with the operating frequency and a multiple frequency component that is an integer multiple of the operating frequency.

When the operating frequency or the multiple frequency component that is an integer multiple of the operating frequency of the terminals of the components or the lines provided on the circuit board of the electronic equipment is equal or close to a difference between the frequency of the electromagnetic waves transmitted via the antenna and the frequency of the electromagnetic waves received via the antenna of the electronic equipment, it is highly likely that the unwanted radiation noise generated from the terminals of the components or the lines affects the transmission and reception functions. Therefore, the judgment portion can judge whether or not the terminals of the components or the lines affect the transmission and reception functions of the electronic equipment by deciding whether or not the difference in frequency between the transmitting electromagnetic waves and the receiving electromagnetic waves is equal or close to the operating frequency of the terminals of the component or the lines.

In the electromagnetic wave analysis apparatus of the present invention, it is preferable that the extraction portion extracts a terminal or a line at the position corresponding to a region where the antenna electromagnetic field exceeds a predetermined threshold value in a distribution range indicated by the antenna electromagnetic field distribution data, and that the judgment portion makes the judgment about the terminal or the line extracted by the extraction portion.

The terminal or line that is located at the position corresponding to the region where the antenna electromagnetic field exceeds a predetermined threshold value in the distribution range indicated by the antenna electromagnetic field distribution data may affect the transmission and reception functions of the electronic equipment. Therefore, the judgment portion further judges the terminal or line that may affect the transmission and reception functions of the electronic equipment. Consequently, it is possible to specify the terminal or line that is more likely to affect the transmission and reception functions. Moreover, the judgment process of the terminal or line that may hardly affect the transmission and reception functions can be omitted.

The electromagnetic wave analysis apparatus of the present invention further may includes a noise characteristic input portion, a frequency storage portion, and a noise judgment portion. The noise characteristic input portion inputs noise characteristic data indicating the frequency characteristics of noise generated from the terminals of the components or the lines indicated by the position data. The frequency storage portion stores a frequency band of the electromagnetic waves transmitted and received via the antenna. The noise judgment portion makes a judgment on whether or not the terminals of the components or the lines affect the transmission and reception functions of the electronic equipment by deciding whether or not a frequency of the noise indicated by the noise characteristic data is included in the frequency band of the electromagnetic waves transmitted and received via the antenna.

When the frequency of noise generated from the terminals of the components or the lines provided on the circuit board of the electronic equipment is included in the frequency band of the electromagnetic waves transmitted and received via the antenna of the electronic equipment, it is highly likely that the unwanted radiation noise generated from the terminals of the components or the lines affects the transmission and reception functions. Therefore, the noise judgment portion can judge whether or not the terminals of the components or the lines corresponding to the noise characteristic data affect the transmission and reception functions of the electronic equipment by deciding whether or not the frequency of the noise indicated by the noise characteristic data is included in the frequency band of the electromagnetic waves transmitted and received via the antenna.

The electromagnetic wave analysis apparatus of the present invention further may include a noise characteristic input portion, a frequency storage portion, and a noise judgment portion. The noise characteristic input portion inputs noise characteristic data indicating the frequency characteristics of noise generated from the terminals of the components or the lines indicated by the position data. The frequency storage portion stores a frequency of the electromagnetic waves transmitted via the antenna and a frequency of the electromagnetic waves received via the antenna. The noise judgment portion determines a difference between the frequency of the electromagnetic waves transmitted via the antenna and the frequency of the electromagnetic waves received via the antenna, and makes a judgment on whether or not the terminals of the components or the lines affect the transmission and reception functions of the electronic equipment by comparing the difference with a frequency of the noise indicated by the noise characteristic data.

When the frequency of noise generated from the terminals of the components or the lines provided on the circuit board of the electronic equipment is equal or close to a difference between the frequency of the electromagnetic waves transmitted via the antenna and the frequency of the electromagnetic waves received via the antenna, it is highly likely that the unwanted radiation noise generated from the terminals of the components or the lines affects the transmission and reception functions. Therefore, the noise judgment portion can judge whether or not the terminals of the components or the lines corresponding to the noise characteristic data affect the transmission and reception functions of the electronic equipment by deciding whether or not the frequency of the noise indicated by the noise characteristic data is equal or close to the difference in frequency between the transmitting electromagnetic waves and the receiving electromagnetic waves.

In the electromagnetic wave analysis apparatus of the present invention, it is preferable that the extraction portion extracts a terminal or a line at the position corresponding to a region where the antenna electromagnetic field exceeds a predetermined threshold value in a distribution range indicated by the antenna electromagnetic field distribution data, and that the noise judgment portion makes the judgment about the terminal or the line extracted by the extraction portion.

The terminal or line that is located at the position corresponding to the region where the antenna electromagnetic field exceeds a predetermined threshold value in the distribution range indicated by the antenna electromagnetic field distribution data may affect the transmission and reception functions of the electronic equipment. Therefore, the noise judgment portion further judges the terminal or line that may affect the transmission and reception functions of the electronic equipment. Consequently, it is possible to specify the terminal or line that is more likely to affect the transmission and reception functions. Moreover, the judgment process of the terminal or line that may hardly affect the transmission and reception functions can be omitted.

In the electromagnetic wave analysis apparatus of the present invention, the noise characteristic data may be actual measured values obtained by measuring the unwanted radiation noise generated from a circuit board that is produced based on the position data.

By using the measured values as the noise characteristic data, the noise judgment portion judges whether or not the terminals of the components or the lines provided on the circuit board affect the transmission and reception functions of the electronic equipment based on the unwanted radiation noise actually generated from the circuit board. Consequently, it is possible to obtain the result of the noise judgment that reflects the noise actually generated from the components on the circuit board.

In the electromagnetic wave analysis apparatus of the present invention, the antenna electromagnetic field distribution data input portion may refer to a database that stores the antenna electromagnetic field distribution data of two or more pieces of electronic equipment, and may retrieve the antenna electromagnetic field distribution data of electronic equipment closest to the electronic equipment to be analyzed from the database.

Accordingly, the antenna electromagnetic field distribution data can be obtained easily by retrieval from the database that stores the antenna electromagnetic field distribution data of two or more pieces of electronic equipment.

The electromagnetic wave analysis apparatus of the present invention further may include a guideline information generator. The guideline information generator generates information used as a guideline for changing the design of the terminal or the line extracted by the extraction portion, or the terminal or the line judged by the judgment portion as affecting the transmission and reception functions of the electronic equipment, or the terminal or the line judged by the noise judgment portion as affecting the transmission and reception functions of the electronic equipment.

The guideline information generator generates information used as a guideline for a design change. Therefore, a designer can obtain the design data of the circuit board that suppresses the effect on the transmission and reception functions of the electronic equipment. This makes it easy for the designer to design a circuit board free from a transmission/reception disturbance.

In the electromagnetic wave analysis apparatus of the present invention, the electronic equipment may be a mobile telephone.

In the electromagnetic wave analysis apparatus of the present invention, the antenna electromagnetic field distribution data may indicate a distribution of an antenna current or an antenna voltage, where the magnetic field component of the electromagnetic waves transmitted and received via the antenna is expressed as a current and identified as the antenna current, and the electric field component of the electromagnetic waves is expressed as a voltage and identified as the antenna voltage.

A design support apparatus of the present invention includes the electromagnetic wave analysis apparatus of the present invention.

An electromagnetic wave analysis program stored in a recording medium of the present invention allows a computer to execute processes of examining the effect on electromagnetic waves transmitted and received via an antenna of unwanted radiation noise generated from a circuit board of electronic equipment that transmits and receives electromagnetic waves via the antenna. The electromagnetic wave analysis program allows the computer to execute the following processes: an antenna electromagnetic field distribution input process of inputting antenna electromagnetic field distribution data indicating a distribution of an antenna electromagnetic field that is a magnetic field component or an electric field component of the electromagnetic waves transmitted and received via the antenna; a board near electromagnetic field distribution input process of inputting board near electromagnetic field distribution data indicating a distribution of either or both of an electric field component and a magnetic field component of a board near electromagnetic field that is unwanted radiation noise radiated from the circuit board of the electronic equipment as a result of operation of the electronic equipment; and a correlation value generation process of generating a distribution of correlation values showing a correlation between the antenna electromagnetic field and the board near electromagnetic field based on the antenna electromagnetic field distribution data and the board near electromagnetic field distribution data.

The electromagnetic wave analysis program of the present invention may allow the computer further to execute a comparison process of deciding the presence or absence of a transmission/reception disturbance of the electromagnetic waves in the electronic equipment by comparing each of the correlation values in the correlation value distribution with a predetermined threshold value.

In the electromagnetic wave analysis program of the present invention, it is preferable that the correlation values include the product of a value of the antenna electromagnetic field and a value of the board near electromagnetic field.

The electromagnetic wave analysis program of the present invention may allow the computer further to execute the following processes: an antenna electromagnetic field distribution analysis process of determining the distribution of an antenna electromagnetic field that is a magnetic field component or an electric field component of the electromagnetic waves transmitted and received via the antenna by simulation through analyzing the electromagnetic field around the electronic equipment, and using the result of the simulation as the antenna electromagnetic field distribution data in the antenna electromagnetic field distribution input process; and a board near electromagnetic field distribution analysis process of determining the distribution of either or both of an electric field component and a magnetic field component of a board near electromagnetic field that is unwanted radiation noise radiated from the circuit board of the electronic equipment as a result of operation of the electronic equipment by simulation through analyzing the electromagnetic field around the electronic equipment, and using the result of the simulation as the board near electromagnetic field distribution data in the board near electromagnetic field distribution input process.

The electromagnetic wave analysis program of the present invention may allow the computer further to execute a data correction process. Each of the antenna electromagnetic field distribution data and the board near electromagnetic field distribution data indicates a distribution on at least one plane. When a distance between the plane of the distribution indicated by the antenna electromagnetic field distribution data and the circuit board differs from a distance between the plane of the distribution indicated by the board near electromagnetic field distribution data and the circuit board, the data correction process is performed to convert at least one of the antenna electromagnetic field distribution data and the board near electromagnetic field distribution data so that the distance between the plane of the distribution indicated by the antenna electromagnetic field distribution data and the circuit board is substantially equal to the distance between the plane of the distribution indicated by the board near electromagnetic field distribution data and the circuit board.

The electromagnetic wave analysis program of the present invention may allow the computer further to execute the following processes: a board design data input process of inputting board design data indicating a structure of the circuit board of the electronic equipment; and a guideline information generation process of generating information used as a guideline for designing the electronic equipment based on the decision made in the comparison process and the board design data.

In the electromagnetic wave analysis program of the present invention, the electronic equipment may be a mobile telephone.

An electromagnetic wave analysis program stored in a recording medium of the present invention allows a computer to execute processes of examining the effect on electromagnetic waves transmitted and received via an antenna of components or lines provided on a circuit board of electronic equipment that transmits and receives electromagnetic waves via the antenna. The electromagnetic wave analysis program allows the computer to execute the following processes: a position input process of inputting position data indicating positions of terminals of the components or positions of the lines provided on the circuit board; an antenna electromagnetic field distribution input process of inputting antenna electromagnetic field distribution data indicating a distribution of an antenna electromagnetic field that is a magnetic field component or an electric field component of the electromagnetic waves transmitted and received via the antenna; and an extraction process of extracting a terminal or a line that may affect the transmission and reception functions of the electronic equipment from the terminals of the components or the lines indicated by the position data by comparing the position data with the antenna electromagnetic field distribution data.

In the electromagnetic wave analysis program of the present invention, it is preferable that the extraction process includes extracting a terminal or a line at the position corresponding to a region where the antenna electromagnetic field exceeds a predetermined threshold value in a distribution range indicated by the antenna electromagnetic field distribution data.

The electromagnetic wave analysis program of the present invention may allow the computer further to execute the following processes: a frequency input process of inputting an operating frequency as a frequency of signals transmitted through the terminals of the components or the lines indicated by the position data; a frequency storage process of storing analytic frequency data indicating a frequency to be analyzed of the electromagnetic waves transmitted and received via the antenna; and a judgment process of making a judgment on whether or not the terminals of the components or the lines indicated by the position data affect the transmission and reception functions of the electronic equipment based on the operating frequency and the analytic frequency data.

In the electromagnetic wave analysis program of the present invention, it is preferable that the frequency storage process includes storing data indicating a frequency band of the electromagnetic waves transmitted and received via the antenna as the analytic frequency data, and that the judgment process includes making the judgment by deciding whether or not the operating frequency and a multiple frequency component that is an integer multiple of said operating frequency are included in the frequency band of the electromagnetic waves transmitted and received via the antenna.

In the electromagnetic wave analysis program of the present invention, it is preferable that the frequency storage process includes storing a frequency of the electromagnetic waves transmitted via the antenna and a frequency of the electromagnetic waves received via the antenna as the analytic frequency data, and that the judgment process includes determining a difference between the frequency of the electromagnetic waves transmitted via the antenna and the frequency of the electromagnetic waves received via the antenna, and making the judgment by comparing the difference with the operating frequency and a multiple frequency component that is an integer multiple of the operating frequency.

In the electromagnetic wave analysis program of the present invention, it is preferable that the extraction process includes extracting a terminal or a line at the position corresponding to a region where the antenna electromagnetic field exceeds a predetermined threshold value in a distribution range indicated by the antenna electromagnetic field distribution data, and that the judgment process includes making the judgment about the terminal or the line extracted in the extraction process.

The electromagnetic wave analysis program of the present invention may allow the computer further to execute the following processes: a noise characteristic input process of inputting noise characteristic data indicating the frequency characteristics of noise generated from the terminals of the components or the lines indicated by the position data; a frequency storage process of storing a frequency band of the electromagnetic waves transmitted and received via the antenna; and a noise judgment process of making a judgment on whether or not the terminals of the components or the lines affect the transmission and reception functions of the electronic equipment by deciding whether or not a frequency of the noise indicated by the noise characteristic data is included in the frequency band of the electromagnetic waves transmitted and received via the antenna.

The electromagnetic wave analysis program of the present invention may allow the computer further to execute the following processes: a noise characteristic input process of inputting noise characteristic data indicating the frequency characteristics of noise generated from the terminals of the components or the lines indicated by the position data; a frequency storage process of storing a frequency of the electromagnetic waves transmitted via the antenna and a frequency of the electromagnetic waves received via the antenna; and a noise judgment process of determining a difference between the frequency of the electromagnetic waves transmitted via the antenna and the frequency of the electromagnetic waves received via the antenna, and making a judgment on whether or not the terminals of the components or the lines affect the transmission and reception functions of the electronic equipment by comparing the difference with a frequency of the noise indicated by the noise characteristic data.

In the electromagnetic wave analysis program of the present invention, it is preferable that the extraction process includes extracting a terminal or a line at the position corresponding to a region where the antenna electromagnetic field exceeds a predetermined threshold value in a distribution range indicated by the antenna electromagnetic field distribution data, and that the noise judgment process includes making the judgment about the terminal or the line extracted in the extraction process.

A design support program of the present invention may include the electromagnetic wave analysis program of the present invention.

An electromagnetic wave analysis method of the present invention uses a computer for examining the effect on electromagnetic waves transmitted and received via an antenna of unwanted radiation noise generated from a circuit board of electronic equipment that transmits and receives electromagnetic waves via the antenna. The method includes the following steps: allowing an antenna electromagnetic field distribution input portion of the computer to input antenna electromagnetic field distribution data indicating a distribution of an antenna electromagnetic field that is a magnetic field component or an electric field component of the electromagnetic waves transmitted and received via the antenna; allowing a board near electromagnetic field distribution input portion of the computer to input board near electromagnetic field distribution data indicating a distribution of either or both of an electric field component and a magnetic field component of a board near electromagnetic field that is unwanted radiation noise radiated from the circuit board of the electronic equipment as a result of operation of the electronic equipment; and allowing a correlation value generator of the computer to generate a distribution of correlation values showing a correlation between the antenna electromagnetic field and the board near electromagnetic field based on the antenna electromagnetic field distribution data and the board near electromagnetic field distribution data.

An electromagnetic wave analysis method of the present invention uses a computer for examining the effect on electromagnetic waves transmitted and received via an antenna of components or lines provided on a circuit board of electronic equipment that transmits and receives electromagnetic waves via the antenna. The method includes the following steps: allowing a position input portion of the computer to input position data indicating positions of terminals of the components or positions of the lines provided on the circuit board; allowing an antenna electromagnetic field distribution input portion of the computer to input antenna electromagnetic field distribution data indicating a distribution of an antenna electromagnetic field that is a magnetic field component or an electric field component of the electromagnetic waves transmitted and received via the antenna; and allowing an extraction portion of the computer to extract a terminal or a line that may affect transmission and reception functions of the electronic equipment from the terminals of the components or the lines indicated by the position data by comparing the position data with the antenna electromagnetic field distribution data.

As described above, the design support apparatus of the present invention uses two distribution data: the board near electromagnetic field distribution data of unwanted radiation noise obtained by measurement or simulation; and the antenna electromagnetic distribution data for transmission and reception conducted by the electronic equipment. These two distribution data are substituted in a formula to yield a correlation value, thereby obtaining information about the effect of unwanted radiation noise on the transmission and reception functions of the electronic equipment. Moreover, the presence or absence of a problem is judged by comparing the correlation value with a decision threshold value required to prevent a transmission/reception disturbance.

Hereinafter, the present invention will be described by way of illustrative embodiments with reference to the drawings.

Embodiment 1

This embodiment is directed to a design support apparatus that evaluates the transmission and reception characteristics of electronic equipment such as a mobile telephone under conditions close to the actual operation by using two types of distribution data: a board near electromagnetic field distribution of unwanted radiation noise radiated from a printed circuit board of the electronic equipment such as radio equipment including a mobile telephone; and an antenna electromagnetic field distribution for transmission and reception conduced by the mobile telephone.

FIG. 1A is a functional block diagram showing the configuration of a design support apparatus 100 of this embodiment.

As shown in FIG. 1A, the design support apparatus 100 includes an antenna electromagnetic field distribution measurement portion 12, a board near electromagnetic field distribution measurement portion 13, and a computer 15. The antenna electromagnetic field distribution measurement portion 12 includes a measuring device (for an antenna magnetic field component) 12a and a detector (for an antenna magnetic field component) 12b. The board near electromagnetic field distribution measurement portion 13 includes a measuring device (for a board near electromagnetic field) 13a and a detector (for a board near electromagnetic field) 13b.

The antenna electromagnetic field distribution measurement portion 12 measures a distribution of the magnetic field component of electromagnetic waves radiated from a board 14a through an antenna, i.e., a distribution of the antenna magnetic field component. The antenna magnetic field component will be described in detail later. The board near electromagnetic field distribution measurement portion 13 measures a distribution of the electromagnetic field due to unwanted radiation noise radiated from the board 14a. The unwanted radiation noise will be described in detail later. The computer 15 controls the antenna electromagnetic field distribution measurement portion 12 and the board near electromagnetic field distribution measurement portion 13, and processes data output from these measurement portions.

In this embodiment, the board 14a may be, e.g., the main board of a mobile telephone terminal. The board 14a includes an antenna 32, an RF circuit block 33, a memory 34, a CPU (central processing unit) 35, power supplies 36, 37, and a line pattern 38 for connecting the components.

The transmission and reception of electromagnetic waves in the board 14a are performed via the antenna 32. For example, when a mobile telephone including the board 14a is used to make a phone call or access the Internet by radio communication, the electromagnetic waves are transmitted from or received by the antenna 32.

The antenna magnetic field component may be, e.g., the magnetic field component of the electromagnetic waves transmitted and received via the antenna 32 of the electronic equipment such as a mobile telephone. The distribution of this antenna magnetic field component is an antenna magnetic field distribution. The antenna magnetic field component is expressed as a current and referred to as an antenna current.

Figure 1B:
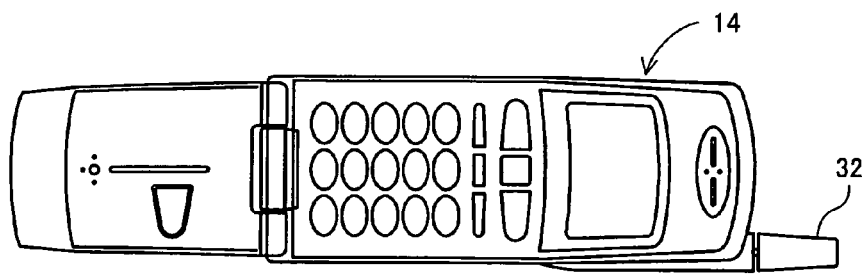
FIG. 1B is a schematic view of a mobile telephone including a case.

In the electronic equipment, the antenna may include not only a surface mounted component, but also all members that substantially function as an antenna. For example, as shown in FIG. 1B, the antenna 32 and the whole or part of the case of a mobile telephone 14 can function as an antenna.

The detector (for an antenna magnetic field component) 12b detects the antenna magnetic field component around the board 14a. The detector 12b includes, e.g., a detection antenna (not shown). When the detection antenna is located around the board 14a, a current flows through the detection antenna by electromagnetic coupling between the antenna 32 and the detection antenna. This current is measured with the measuring device 12a, so that the magnetic field component of the electromagnetic waves radiated from the antenna 32 can be measured. The magnetic field component of the electromagnetic waves and the current have a relationship expressed as $I$ (current)=$\mu B$ (magnetic flux density). Therefore, if one of the values is obtained, then the other value also can be determined by calculation.

Similarly, in the case of the electric field component of the electromagnetic waves and a voltage, if either of the two values is obtained, then the other value can be determined by calculation. In this embodiment, the antenna magnetic field component is determined by measuring the magnetic field component of the electromagnetic waves radiated from the antenna. However, an antenna electric field component may be determined by measuring the electric field component instead of the magnetic field component. The antenna electric field component is the electric field component of the electromagnetic waves radiated from the antenna. Moreover, an antenna voltage, which is the antenna electric field component expressed as a voltage, may be determined instead of the antenna electric field component.

The detector 12b may be moved around the board 14a to measure the antenna magnetic field component at two or more places, thus providing an antenna magnetic field distribution around the board 14a.

The measuring device 12a may be, e.g., a spectrum analyzer. The spectrum analyzer can output an intensity distribution for each frequency, i.e., a spectrum of the antenna magnetic field component detected by the detector 12b.

When the board 14a is in the operating state, a high-frequency current at a multiple frequency resulting from a clock frequency or a switching speed flows through the line pattern 38 that is routed between each of the functional elements of the memory 34, the CPU 35, and the power supplies 36, 37. Consequently, electromagnetic waves are radiated to the surrounding area of the board 14a via the line pattern 38. These electromagnetic waves radiated from the board 14a can act as unwanted radiation noise.

Generally, the intensity of the unwanted radiation noise is much smaller than that of the electromagnetic waves radiated from the antenna. The detector (for a board near electromagnetic field) 13b detects the electric field component and the magnetic field component of the unwanted radiation noise radiated from the board 14a. Therefore, it is preferable that the detector 13b is more suitable than the detector 12b for the measurement of a magnetic field and an electric field with a smaller intensity. In many cases, the unwanted radiation noise is measured in the vicinity of the board because of its small intensity. Thus, the distribution of the unwanted radiation noise also may be called a near electromagnetic field distribution.

The detector 13b includes, e.g., a micro antenna (not shown). When the micro antenna gets closer to the board 14a, an electrostatic coupling current generated by electrostatic coupling between the board 14a and the micro antenna and an electromagnetic coupling current generated by electromagnetic coupling between the board 14a and the micro antenna are combined into a composite current, and the composite current flows through the micro antenna. This composite current is measured with the measuring device 13a, so that the electric field component and the magnetic field component of the electromagnetic waves (unwanted radiation noise) radiated from the board can be detected.

Like the measuring device 12a, e.g., a spectrum analyzer is used as the measuring device 13a. The measuring device 13a does not necessarily need to measure both the electric field component and the magnetic field component of the unwanted radiation noise, and may measure either of the two components.

In the detectors 12b, 13b, it is preferable that the portions other than the detection antenna and the micro antenna are covered with a shield against the influence of external noise.

The antenna electromagnetic field distribution measurement portion 12 and the board near electromagnetic field distribution measurement portion 13 preferably include a transfer device (not shown) for moving the detectors 12b, 13b around the board 14a. The detectors 12b, 13b are moved around the board 14a, thereby providing an antenna magnetic field distribution around the board and a board near electromagnetic field distribution.

The design support apparatus 100 includes two measurement portions (the antenna electromagnetic field distribution measurement portion 12 and the board near electromagnetic field distribution measurement portion 13) and thus can measure the board near electromagnetic field distribution and the antenna magnetic field component simultaneously under control of the computer 15. Therefore, it is possible to use the common facilities and to reduce the measuring time.

The antenna magnetic field distribution and the board near electromagnetic field distribution may be obtained not only by moving the detectors 12b, 13b, but also, e.g., by arranging a plurality of detectors 12b, 13b in a matrix.

In this embodiment, the antenna electromagnetic field distribution measurement portion 12 and the board near electromagnetic field distribution measurement portion 13 are described merely as an example, and another measuring system also can be used to measure the antenna magnetic field distribution and the board near electromagnetic field distribution.

Figure 2:
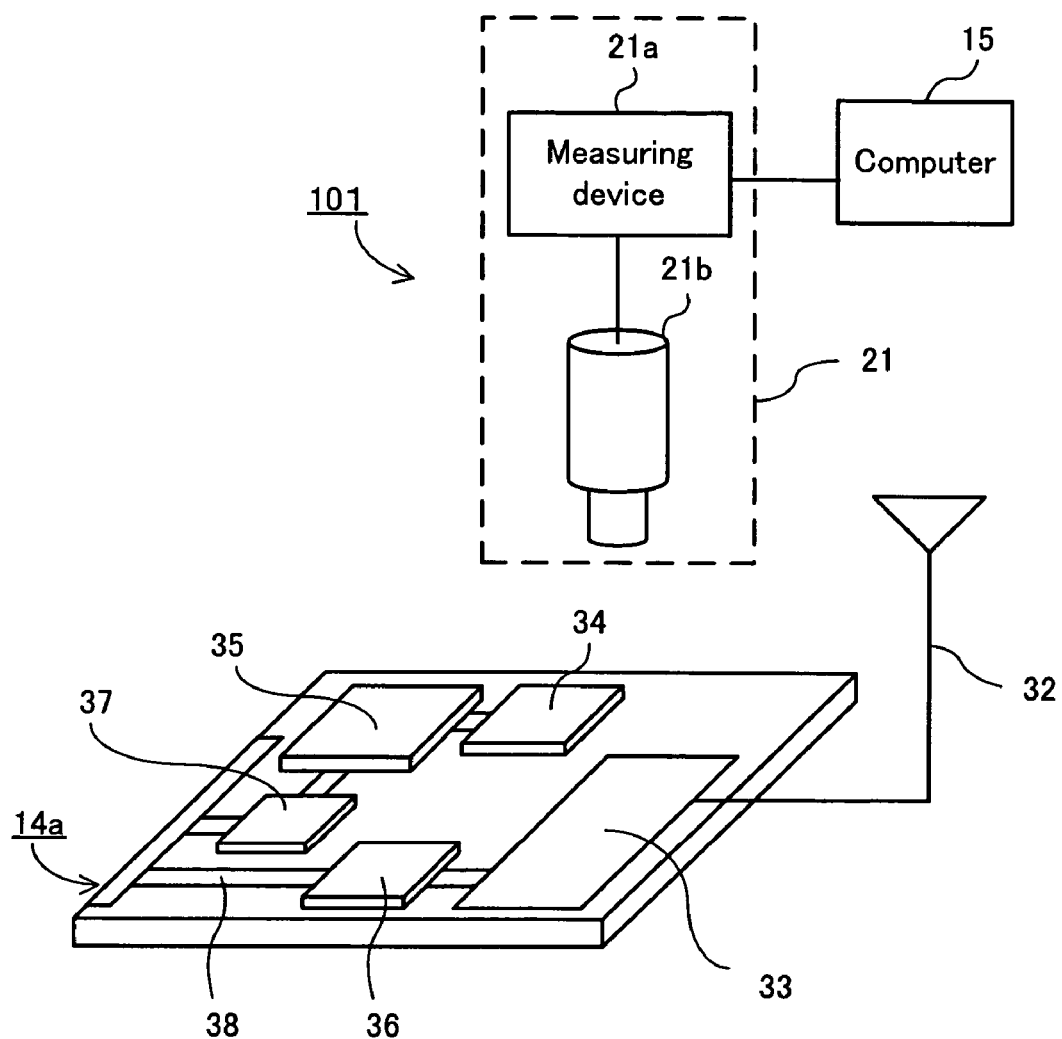
FIG. 2 is a functional block diagram showing another configuration of a measurement portion.

FIG. 2 is a functional block diagram showing an example of the configuration of another measuring system that measures the antenna magnetic field distribution and the board near electromagnetic field distribution. As shown in FIG. 2, a measurement portion 21 may include one measuring device 21a and one detector 21b for measuring the antenna magnetic field distribution and the board near electromagnetic field distribution. The detector 21b includes, e.g., a detection antenna for detecting the antenna magnetic field component and a micro antenna for detecting the board near electromagnetic field. The measuring device 21a measures the antenna magnetic field component and the board near electromagnetic field detected by the detector 21b. The measuring device 21a may be, e.g., a spectrum analyzer. The configuration in FIG. 2 can use the common facilities.

Figure 3:
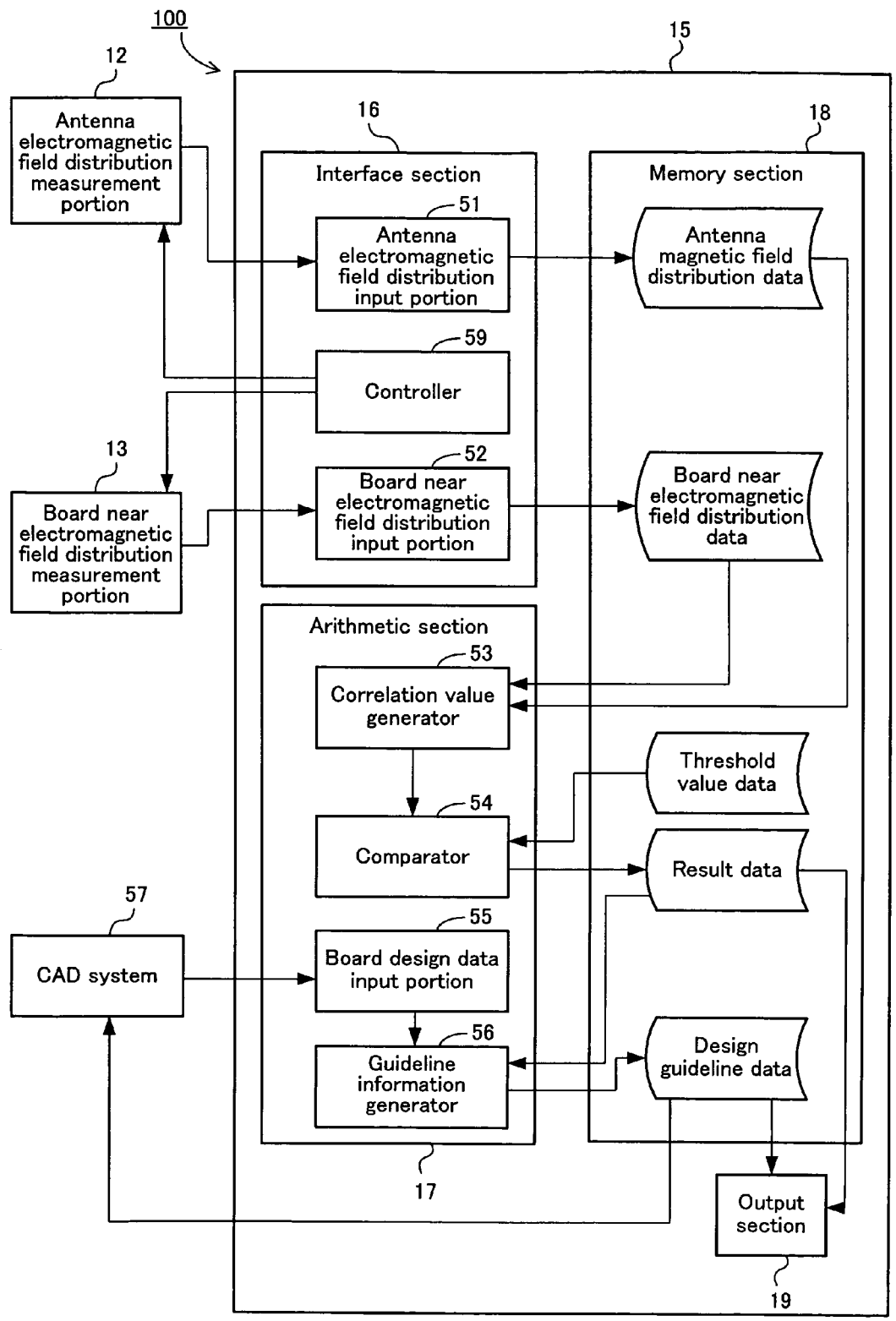
FIG. 3 is a functional block diagram showing the configuration of a computer 15 of the design support apparatus 100.

FIG. 3 is a functional block diagram showing the configuration of the computer 15 of the design support apparatus 100. As shown in FIG. 3, the computer 15 includes an interface section 16, an arithmetic section 17, a memory section 18, and an output section 19.

The interface section 16 includes an antenna electromagnetic field distribution input portion 51, a board near electromagnetic field distribution input portion 52, and a controller 59. The antenna electromagnetic field distribution input portion 51 receives antenna magnetic field distribution data from the antenna electromagnetic field distribution measurement portion 12 and stores the data in the memory section 18. The board near electromagnetic field distribution input portion 52 receives board near electromagnetic field distribution data from the board near electromagnetic field distribution measurement portion 13 and stores the data in the memory section 18. The controller 59 controls the operations of the antenna electromagnetic field distribution measurement portion 12 and the board near electromagnetic field distribution measurement portion 13. Such control is performed, e.g., by executing control software with a CPU (as will be described later) of the computer 15.

The arithmetic section 17 includes a correlation value generator 53, a comparator 54, a board design data input portion 55, and a guideline information generator 56. The correlation value generator 53 generates a correlation value based on the antenna magnetic field distribution data and the board near electromagnetic field distribution data stored in the memory section 18. The comparator 54 evaluates the mobile telephone 14 by comparing the correlation value generated by the correlation value generator 53 with a threshold value stored in the memory section 18, and then stores the evaluation data in the memory section 18. The board design data input portion 55 inputs board design data indicating a structure of the board 14a from, e.g., a CAD system 57. The guideline information generator 56 generates design guideline data used as a guideline for designing the electronic equipment (mobile telephone 14) based on the board design data and the result data stored in the memory section 18, and then stores the design guideline data in the memory section 18.

The output section 19 displays the result data or the design guideline data stored in the memory section 18 so that a designer can see them easily by means of, e.g., a display (as will be described later).

The computer 15 can be configured, e.g., by using general equipment such as EWS (engineering work station) or PC (personal computer), referred to as "PC or the like" in the following. The functions of the interface section 16 and the arithmetic section 17 can be achieved by executing a design support program with a CPU of the PC or the like. The memory section 18 may be, e.g., a hard disk contained in the PC or the like, a recording medium such as a RAM, a portable recording medium such as a flexible disk or a memory card, or a recording medium in a memory that is present on the network. The output section 19 may be, e.g., a display unit including a display of the PC or the like or an output unit such as a printer.

The computer 15 also can be constructed, e.g., by installing the design support program for achieving the functions of the interface section 16 and the arithmetic section 17 on a desired PC or the like from a recording medium such as a CD-ROM or by down load through a communication line.

The configuration of the design support apparatus 100 of this embodiment is not limited to the above example in which a general purpose device (PC or the like) is used as the computer 15. For example, the computer 15 may be a dedicated control device including a CPU and a recording medium. Moreover, the antenna electromagnetic field distribution measurement portion 12, the board near electromagnetic field distribution measurement portion 13, and the computer 15 may be integrated into a design support apparatus.

Figure 4:
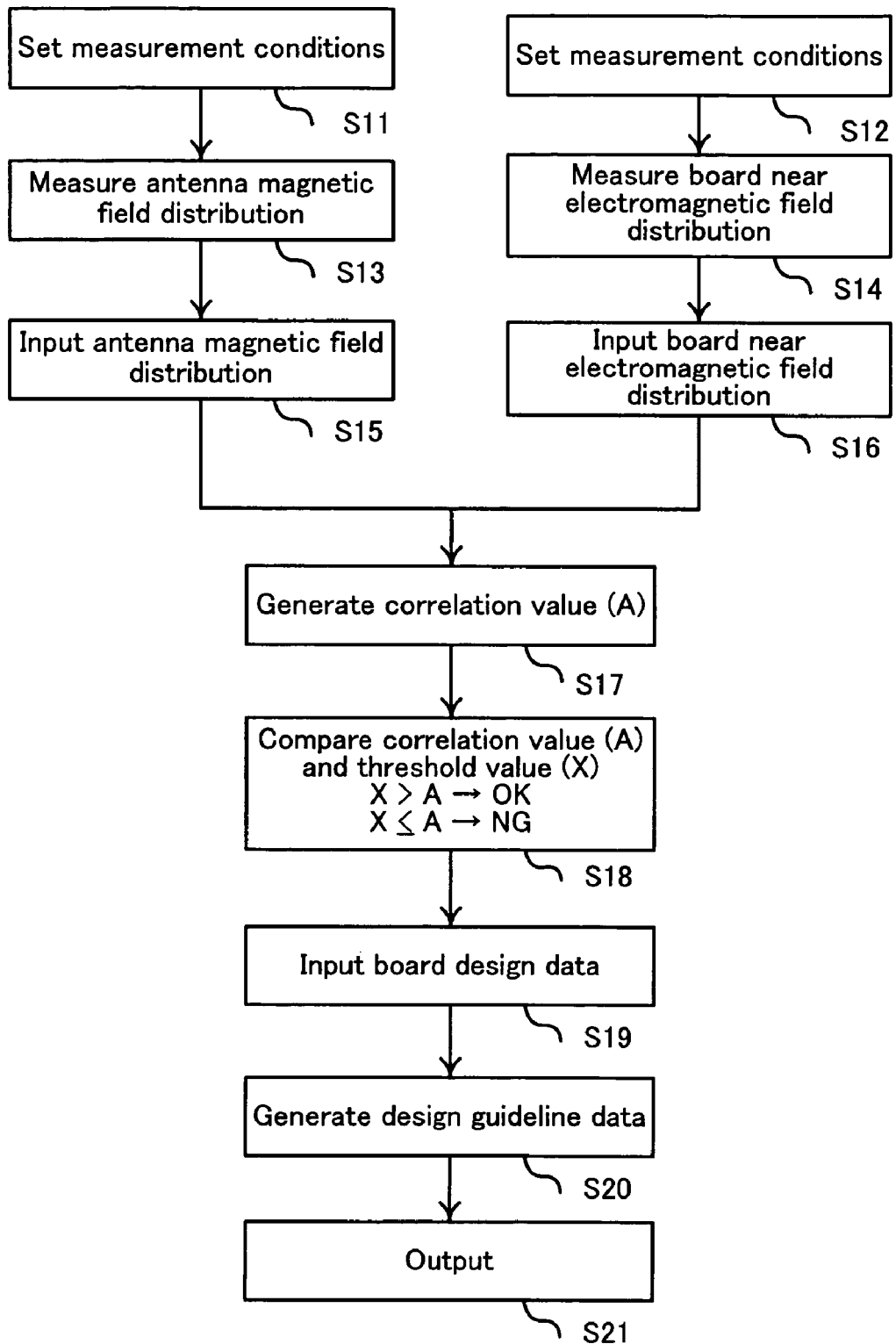
FIG. 4 is a flow chart showing the operations of processes of the design support apparatus 100.

Next, the operations of the design support apparatus 100 will be described by referring to the drawings. FIG. 4 is a flow chart showing the operations of processes of the design support apparatus 100.

As shown in FIG. 4, the processes of the design support apparatus 100 include the following: setting the measurement conditions (steps S11, S12); measuring an antenna magnetic field distribution (step S13); measuring a board near electromagnetic field distribution (step S14); generating a correlation value (step S17); comparing the correlation value and a threshold value (step S18); generating design guideline data (step S20); and display (step S21).

First, the computer 15 sets the measurement conditions for the antenna electromagnetic field distribution measurement portion 12 and the board near electromagnetic field distribution measurement portion 13 (steps S11, S12). For example, the computer 15 may set the initial conditions required for measurement such as a frequency, a spatial pitch, or a measuring range.

The measuring device (for an antenna magnetic field component) 12a measures the antenna magnetic field component in accordance with the conditions set in the step S11 under control of the controller 59 (step S13). In FIG. 1A, a plane parallel to the board 14a (measuring object) is defined as an XY plane, and a direction perpendicular to the board 14a is defined as a Z-axis direction. For example, when the detector 13b is moved on a plane that is parallel to the XY plane and at a certain distance away from the board 14a, the antenna magnetic field distribution can be measured on the plane located at the certain distance away from the board 14a. This measurement is performed on a plurality of planes parallel to the XY plane, thereby obtaining data that indicate the antenna magnetic field distribution around the board 14a. The measuring area is not limited to the plane. For example, it is also possible to measure a distribution on a spherical or curved surface of the surrounding area of the board 14a.

The antenna magnetic field distribution can be measured, e.g., during actual transmission and reception conducted by the mobile telephone. Alternatively, it can be measured simply while the antenna is excited at a predetermined frequency with an oscillator attached to the antenna feeding point.

In measuring the antenna magnetic field distribution, if the board 14a is the main board of the mobile telephone, it is preferable that the antenna magnetic field component is measured in the entire area around the mobile telephone 14 including the case, as shown in FIG. 1B. This is because the whole of the mobile telephone including the case may function as an antenna. The mobile telephone 14 or the board 14a used for measurement may be either a prototype in the early stage of design or a finished product.

The measuring device (for a board near electromagnetic field) 13a measures the board near electromagnetic field, i.e., unwanted radiation noise in accordance with the conditions set in the step S12 (step S14). For example, when the detector 13b is moved in three-dimensions within the measuring range around the board 14a, the board near electromagnetic field can be measured at a plurality of places, thereby obtaining data that indicate the board near electromagnetic field distribution around the board 14a.

The intensity of the electromagnetic waves radiated from the board is small. Therefore, if the board 14a is the main board of the mobile telephone, the measurement is performed preferably by bringing the detector 13b closer to the board 14a except for the case as a measuring object. The mobile telephone may be provided, e.g., with various applications such as a display, a camera, or an SD card (memory card). The board near electromagnetic field distribution is measured while operating any one of the applications, so that unwanted radiation noise caused by the application thus operated can be measured. Moreover, the board near electromagnetic field distribution is measured while operating all the applications, so that unwanted radiation noise including the noise from each of the applications can be measured. In other words, it is possible to measure the unwanted radiation noise under conditions close to the actual operation of the mobile telephone.

The antenna magnetic field distribution measured by the antenna electromagnetic field distribution measurement portion 12 is input to the computer 15 and stored in the memory section 18 by the antenna electromagnetic field distribution input portion 51 (step S15). The input antenna magnetic field distribution data include, e.g., information on the positions of the measuring points such as coordinates, information on the frequency, intensity, phase, and directivity of the antenna magnetic field component, mean value data when the measurement is performed two or more times to reduce variations, and maximum value data when the measurement accuracy is poor.

The board near electromagnetic field distribution measured by the board near electromagnetic field distribution measurement portion 13 is input to the computer 15 and stored in the memory section 18 by the board near electromagnetic field distribution input portion 52 (step S16). The input board near electromagnetic field distribution data include, e.g., information on the positions of the measuring points such as coordinates, information on the frequency, intensity, phase, and directivity of the magnetic or electric field, mean value data when the measurement is performed two or more times to reduce variations, and maximum value data when the measurement accuracy is poor.

The correlation value generator 53 generates a correlation value based on the antenna magnetic field distribution data and the board near electromagnetic field distribution data input in the steps S15 and S16, respectively (step S17). The correlation value shows the degree of the effect of the board near electromagnetic field (unwanted radiation noise) on the antenna magnetic field component. The correlation value is determined for each of the measuring positions by formulas including the correlation between the antenna magnetic field component and the board near electromagnetic field. Examples of the calculation for determining the correlation value will be described below.

Calculation Example 1

A correlation value A $(x_1, y_1, z_1)$ at the position having coordinates $(x_1, y_1, z_1)$ is determined by the following formula 1.

$$A(x_1, y_1, z_1) = ka^2 + ma \cdot b + nb^2 \qquad \text{Formula 1}$$

where k, m and n are constants, a is the intensity of the antenna magnetic field component at the point with coordinates $(x_1, y_1, z_1)$, and b is the intensity of the board near electromagnetic field at the point with coordinates $(x_1, y_1, z_1)$.

The correlation value A also may be determined by the following formula 2 using a simple calculation.

$$A(x_1, y_1, z_1) = ma \cdot b \qquad \text{Formula 2}$$

where m is a constant, a is the intensity of the antenna magnetic field component at the point with coordinates $(x_1, y_1, z_1)$, and b is the intensity of the board near electromagnetic field at the point with coordinates $(x_1, y_1, z_1)$.

It is preferable that the constants such as k, m and n are set appropriately depending on situations while taking into account the relationship with a threshold value (as will be described later).

Calculation Example 2

In the formulas 1 and 2, the correlation value is determined by using the intensity a of the antenna magnetic field component and the intensity b of the board near electromagnetic field. Instead of these scalar values a and b, the antenna magnetic field component and the board near electromagnetic field are expressed as vector values, and the vector values also can be used to determine the correlation value. For example, using a vector $a=(a_x, a_y, a_z)$ of the antenna magnetic field component at the point with coordinates $(x_1, y_1, z_1)$ and a vector $b=(b_x, b_y, b_z)$ of the board near electromagnetic field at the point with coordinates $(x_1, y_1, z_1)$, the correlation value generator 53 can determine a correlation value A by the following formula 3.

$$A = \{(a_x \cdot b_x)^2 + (a_y \cdot b_y)^2 + (a_z \cdot b_z)^2\}^{1/2} \qquad \text{Formula 3}$$

In the formula 3, the correlation value A is the magnitude of a vector $(a_x \cdot b_x, a_y \cdot b_y, a_z \cdot b_z)$ whose components are expressed respectively as the products of the x, y and z components of the vector a $(a_x, a_y, a_z)$ and the vector b $(b_x, b_y, b_z)$. Moreover, the product of at least one of the x, y and z components of the vectors a, b also can be used to determine the correlation value. For example, using the product $a_x \cdot b_x$ of the x components and the product $a_y \cdot b_y$ of the y components, the correlation value generator 53 can determine a correlation value A by the following formula 4.

$$A = \{(a_x \cdot b_x)^2 + (a_y \cdot b_y)^2\}^{1/2} \qquad \text{Formula 4}$$

As shown in the formula 4, the correlation value generator 53 omits the product of the z components and uses the products of the x and y components to determine the correlation value, so that the computational complexity can be reduced as compared to a calculation using the products of the x, y and z components.

Calculation Example 3

In the formulas 1 to 4, the correlation value is determined based on the antenna magnetic field component at one point $(x_1, y_1, z_1)$ and the board near electromagnetic field at the point $(x_1, y_1, z_1)$. However, the correlation value also can be determined, e.g., based on the antenna magnetic field component at one point $(x_1, y_1, z_1)$ and the board near electromagnetic field at the point $(x_1, y_1, z_1)$ and a plurality of points around that point. For example, when the intensities of the board near electromagnetic field at three points $(x_2, y_2, z_2)$, $(x_3, y_3, z_3)$ and $(x_4, y_4, z_4)$ around the point $(x_1, y_1, z_1)$ are represented respectively by c, d and e, a correlation value A can be determined by the following formula 5.

$$A = M(a \cdot b + a \cdot c + a \cdot d + a \cdot e) \qquad \text{Formula 5}$$

where M is a constant.

As shown in the formula 5, the correlation value generator 53 uses the intensities of the board near electromagnetic field at a plurality of points and the intensity of the antenna magnetic field component at one point, so that the correlation value can be determined in view of the interaction between the board near electromagnetic field and the antenna magnetic field component at the plurality of points. The correlation value generator 53 may determine the correlation value, e.g., either by using the intensities of the antenna magnetic field components at a plurality of points and the intensity of the board near electromagnetic field at one point or by using data of the antenna magnetic field component and the board near electromagnetic field expressed as vectors.

With the above calculations, the correlation value generator 53 determines correlation values at all the measuring positions in the area measured by the antenna electromagnetic field distribution measurement portion 12 and the board near electromagnetic field distribution measurement portion 13. Consequently, a distribution of the correlation values can be obtained. For example, based on the antenna magnetic field distribution measured on a plane and the board near electromagnetic field distribution measured on substantially the same plane, it is possible to provide a correlation value distribution on that plane. In other words, the correlation value distribution can be obtained by combining two distribution maps: the board near electromagnetic field distribution of unwanted radiation noise; and the antenna magnetic field distribution for transmission and reception conducted by the electronic equipment.

A formula for the correlation value is not limited to the above examples, and may be set as desired for each mobile telephone system, e.g., depending on whether there is the problem of a transmission/reception disturbance.

The comparator 54 compares the correlation value generated in the step S17 with a decision threshold value (X) that has been calculated by a different method and stored in the memory section 18 (step S18). For example, if the correlation value A is smaller than the threshold value X (X>A), the comparator 54 can decide that no transmission/reception disturbance of the electronic equipment occurs due to unwanted radiation noise. If the correlation value A is not less than the threshold value X, the comparator 54 can decide that a transmission/reception disturbance of the electronic equipment occurs due to unwanted radiation noise. This comparison is performed preferably for all the correlation values generated in the step S17. The step S17 provides the correlation values at all the measuring positions in the area measured by the antenna electromagnetic field distribution measurement portion 12 and the board near electromagnetic field distribution measurement portion 13. Therefore, when the above comparison process is performed on the individual correlation values of the measuring positions, it is possible to decide the presence or absence of a transmission/reception disturbance at each of the measuring positions. The measuring position that is considered to involve a transmission/reception disturbance may be recognized as the location of the occurrence of a transmission/reception disturbance. The result of the decision is stored in the memory section 18 as result data.

An example of a method for calculating the decision threshold value (X) will be described below. In the case of a mobile telephone employing a W-CDMA system, e.g., the specification is standardized under the 3GPP (third generation partnership project) for introduction on the market. In the standardization, there is the reception sensitivity that should be met to prevent a transmission/reception disturbance, and the value of the reception sensitivity is defined as $-117$ dBm/ 3.84 MHz. This means that the reception must succeed when the input power is larger than $-117$ dBm/3.84 MHz.

To achieve this reception sensitivity of the mobile telephone, the amount of unwanted radiation noise received by the antenna needs to be reduced to a certain reference value or less because the unwanted radiation noise is attributed to degradation of the reception sensitivity characteristics.

Figure 5:
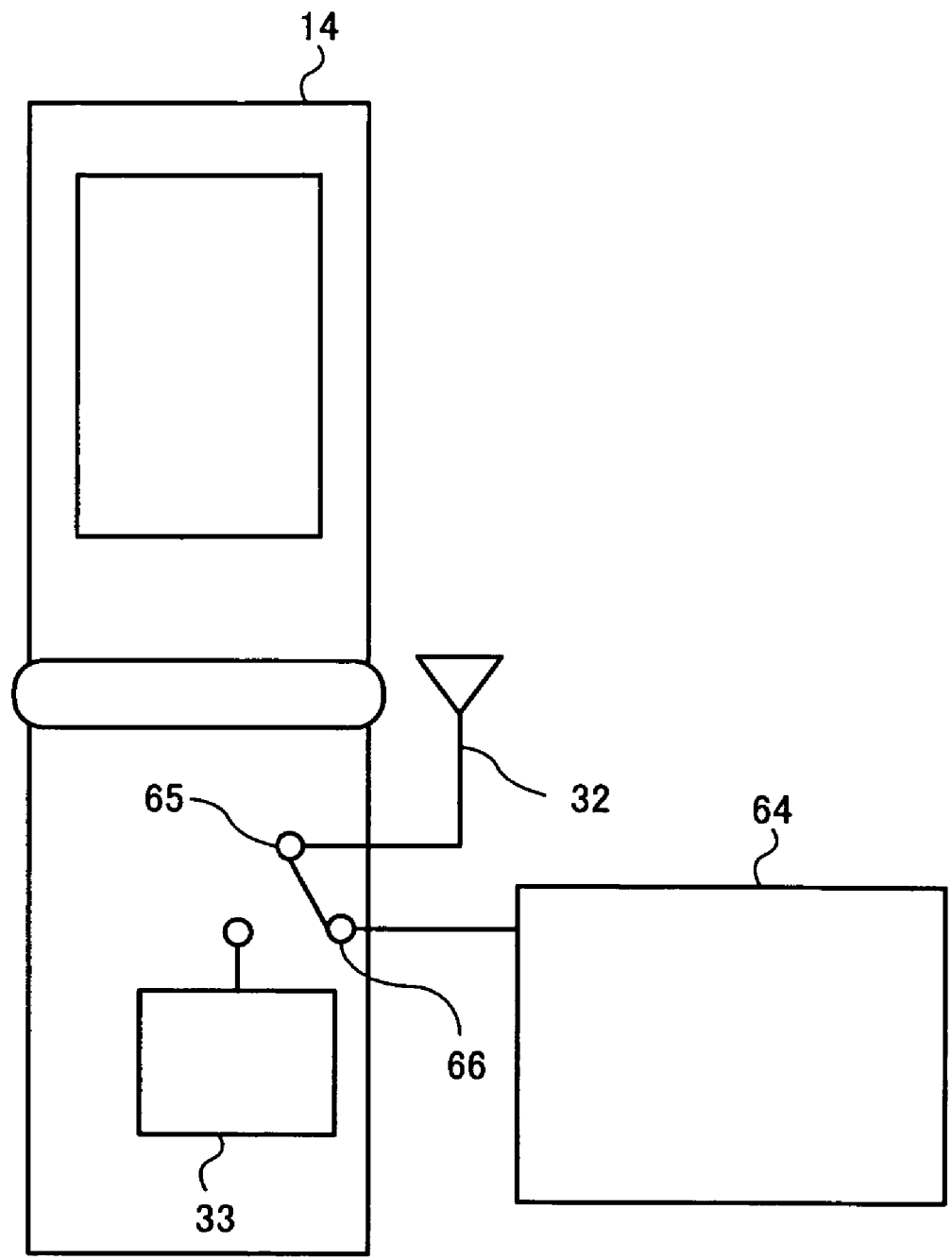
FIG. 5 shows a configuration for measuring radio waves received by an antenna of a mobile telephone.

The unwanted radiation noise received by the antenna can be measured, e.g., with a configuration as shown in FIG. 5. FIG. 5 illustrates the configuration for measuring radio waves received by the antenna of the mobile telephone. As shown in FIG. 5, a switch 65 is attached to the antenna 32 of the mobile telephone 14 so that the connection is switched between the RF circuit block 33 and an external terminal 66, and the external terminal 66 is connected to a measuring device 64. By turning the switch 65 to the external terminal 66, the electromagnetic waves received by the antenna 32 can be measured. The measuring device 64 may be, e.g., a spectrum analyzer or a vector signal analyzer.

First, the mobile telephone 14 is measured while the function other than the transmission and reception functions, e.g., a camera or SD card (memory card) is operated without using the antenna for transmission and reception, namely only unwanted radiation noise is radiated. In this manner, the unwanted radiation noise received by the antenna can be measured.

If the intensity of the unwanted radiation noise thus measured is not more than the reference value, then the antenna transmission and reception functions are operated further, and the antenna magnetic field distribution and the board near electromagnetic field distribution are measured (steps S11 to S16) under the same conditions as those of measuring the unwanted radiation noise. Subsequently, a correlation value distribution is calculated (step S17). The maximum value in the correlation value distribution can be used as a decision threshold value.

As described above, it is preferable that the decision threshold value (X) required to prevent a transmission/reception disturbance is determined in view of the close relationship between the antenna characteristics and the amount of unwanted radiation noise. The method for calculating the threshold value X is not limited to the above example, and an appropriate value may be set, e.g., based on an empirical rule.

Referring to FIG. 4, after the comparison process (step S18) is finished, the board design data input portion 55 inputs board design data indicating a structure of the board 14a from the CAD system 57 (step S19). The board design data include, e.g., design data indicating the arrangement, line pattern, size, or height of components to be mounted on the board.

The guideline information generator 56 generates information used as a guideline for designing the board 14a based on the result data of the comparison process in the step S18 and the board design data input in the step S19 (step S20). For example, the guideline information generator 56 can identify the surface mounted component that causes a transmission/reception disturbance by comparing the location of the occurrence of a transmission/reception disturbance, included in the result data, with the position of the surface mounted component on the board, included in the board design data. To avoid a transmission/reception disturbance, the guideline information generator 56 also may generate information that shows the optimum mounting position of a component by using the past case data or the like. Moreover, when a plurality of surface mounted components are responsible for a transmission/reception disturbance, the guideline information generator 56 can generate information that shows the optimum mounting position or the selection of an anti-noise component according to a predetermined order of priority with respect to those surface mounted components. The information generated by the guideline information generator 56 is stored in the memory section 18 as design guideline data.

The output section 19 displays the result data of the comparison process (step S18) and the design guideline data generated in the design guideline data generation process (step S20) on a display or the like (step S21).

Figure 6A:
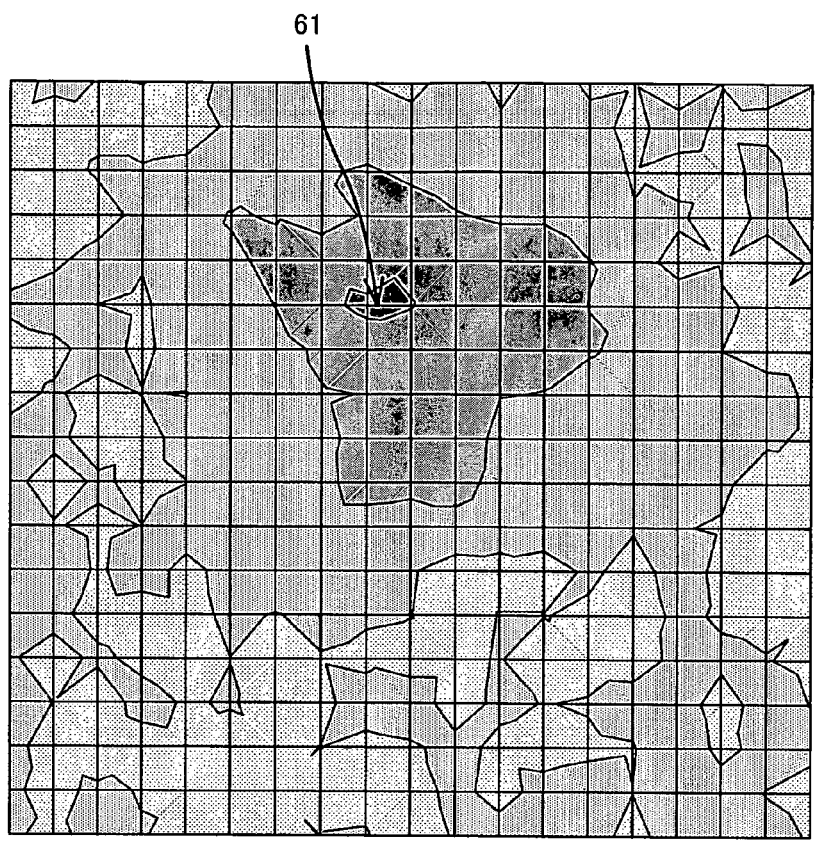
FIG. 6A shows an example of a distribution map of the correlation values.
Figure 6B:
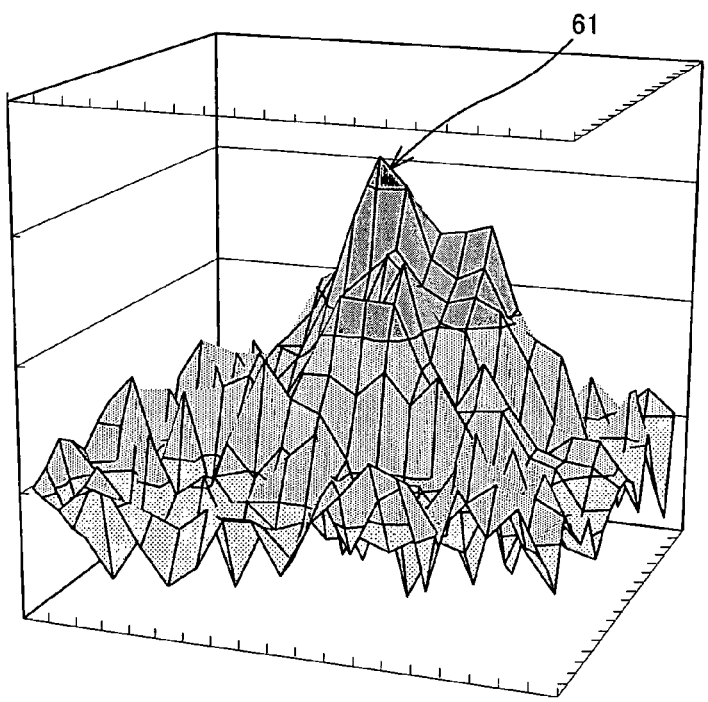
FIG. 6B shows an example of a three-dimensional distribution map of the correlation values.

FIG. 6 illustrates a representation example when the result data are displayed. FIG. 6A shows an example of a distribution map of the correlation values generated in the correlation value generation process (step S17) on a plane parallel to the XY plane. In FIG. 6A, the darkest portion 61 is the location that has been considered to involve a transmission/reception disturbance due to unwanted radiation noise in the comparison process (step S18). FIG. 6B shows an example of a three-dimensional distribution map of the correlation values generated in the correlation value generation process (step S17). A designer sees the result data obtained by measuring a prototype in the early stage of design as a visible representation in FIG. 6A or 6B, and thus can understand the presence or absence of a transmission/reception disturbance and a place where the transmission/reception disturbance occurs in the early stage of design.

The output section 19 also can superimpose the correlation value distribution and the board structure by using the board design data input in the board design data input process (step S19) so that they can be contrasted with each other for representation. Moreover, the output section 19 may display as the design guideline data the surface mounted component that causes a transmission/reception disturbance or a preferred design example to avoid the transmission/reception disturbance. As described above, e.g., when the guideline information generator 56 generates information on provision for design from the past case data and the output section 19 displays the information, it is useful enough to allow even a designer having little experience to make the design. Adding such an advisory function to the apparatus results in a general user-friendly design support apparatus.

A designer can change the board design data to appropriate design based on the design guideline data output from the output section 19 by using the CAD system 57. Moreover, the CAD system 57 automatically can read the design guideline data stored in the memory section 18 and change the board design data based on the design guideline data.

The CAD system 57 may be provided in the computer 15. In this case, the board design data generated by the CAD system 57 also are stored in the memory section 18.

In addition to the above information, the output section 19 can display, e.g., the result of measuring the antenna magnetic field distribution or the board near electromagnetic field distribution. The output section 19 also can display two- or three-dimensional graphic data indicating the shape of the electronic equipment such as a mobile telephone.

Although the operations of the design support apparatus 100 have been described above, the order of the operations is not limited to the flow chart as shown in FIG. 4. For example, the board design data input process in the step S19 may be performed before the step S17.

Moreover, the board design data input process (step S19) and the design guideline data generation process (step S20) can be omitted according to the circumstances. Further, a distribution of the correlation values generated in the correlation value generation process (step S17) may be displayed by the output section 19 without performing the comparison process (step S18). Even in this simplified manner, a designer can obtain information about the effect of unwanted radiation noise on the antenna magnetic field component from the display. For example, when a designer changes the design of a mobile telephone to take anti-noise measures, and then sees the display of a correlation value distribution calculated by measurement after the design change, the designer can understand the anti-noise effect quantitatively while estimating the actual operation of the mobile telephone terminal.

According to this embodiment of the present invention, two parameters of the antenna magnetic field distribution and the board near electromagnetic field distribution are substituted in any of the formulas to yield a correlation value, and the correlation value is compared to the threshold value, thereby determining a causal relationship between the unwanted radiation noise and a transmission/reception disturbance of the electronic equipment. Thus, it is possible to specify the presence or absence of a transmission/reception disturbance due to the unwanted radiation noise and a place where the transmission/reception disturbance occurs. Consequently, the location with a problem can be detected beforehand in the early stage of design of the electronic equipment such as radio equipment including a mobile telephone.

In the computer 15, the correlation value distribution is determined by calculation with a combination of two distributions: the board near electromagnetic field distribution of unwanted radiation noise generated from a printed circuit board of the electronic equipment; and the antenna magnetic field distribution for transmission and reception conducted by the electronic equipment. With this correlation value distribution, an antenna magnetic field distribution can be obtained under conditions close to the actual operation of the electronic equipment while taking into account the effect of the unwanted radiation noise. Based on the antenna magnetic field distribution under conditions close to the actual operation, e.g., it is also possible to calculate the main characteristics of the antenna, such as directivity, gain, and efficiency.

Generally, an antenna used in a mobile telephone is evaluated by operating the antenna alone. However, while a display, a camera, or an SD card (memory card) is operated in the mobile telephone, the ICs including a CPU, a power supply, and a memory are operated and thus may act as a wave source of unwanted radiation noise. Therefore, it is expected that the antenna characteristics will vary significantly as compared to the case where only the antenna is operated. By evaluating the antenna characteristics based on the antenna magnetic field distribution under conditions close to the actual operation, as described above, the antenna characteristics can be evaluated under conditions close to the actual operation of the mobile telephone.

Embodiment 2

Figure 7:
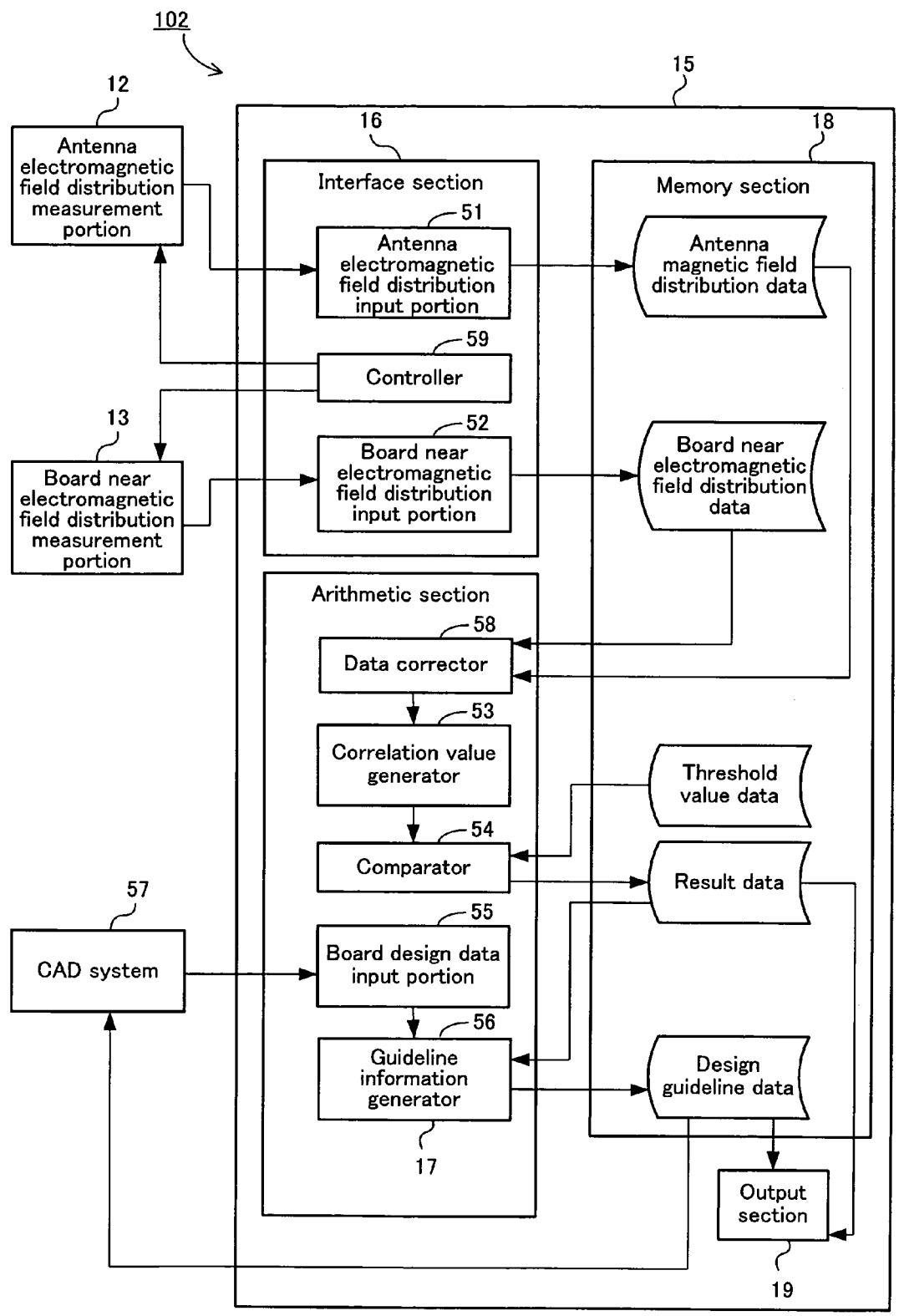
FIG. 7 is a functional block diagram showing the configuration of a computer 15 of a design support apparatus 102.

FIG. 7 is a functional block diagram showing the configuration of the computer 15 of a design support apparatus in Embodiment 2. The design support apparatus 102 of FIG. 7 differs from the design support apparatus 100 of FIG. 3 in that the arithmetic section 17 further includes a data corrector 58. The same components of the design support apparatus 102 (FIG. 7) as those of the design support apparatus 100 (FIG. 3) are denoted by the same reference numerals, and the explanation will not be repeated.

Figure 8A:
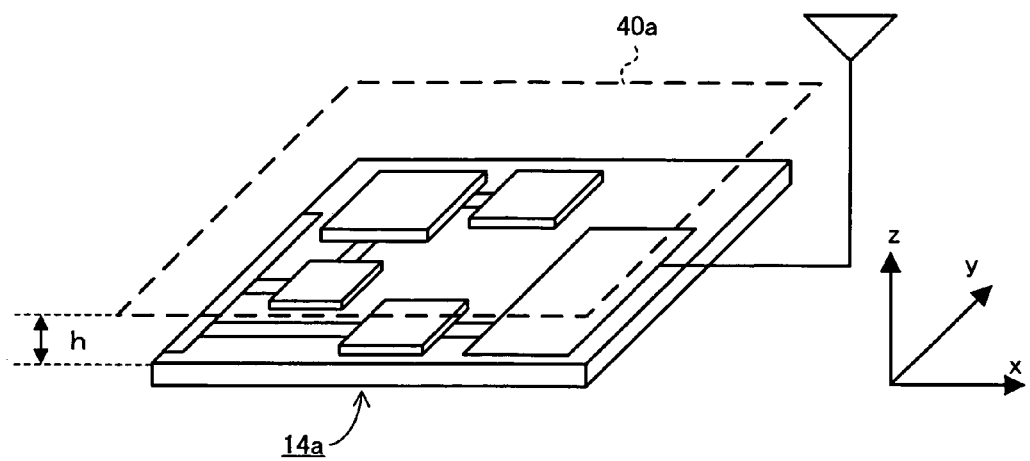
FIGS. 8A and 8B illustrate measuring positions of an antenna magnetic field distribution and a board near electromagnetic field distribution.

FIG. 8 illustrates the measuring positions of the antenna magnetic field distribution and the board near electromagnetic field distribution. In FIG. 8A, a plane 40a represented by a broken line is an example of the measuring plane of the board near electromagnetic field distribution. The detector 13b scans on the plane 40a, thereby measuring the board near electromagnetic field distribution on the plane 40a. Generally, since the unwanted radiation noise generated from the board 14a is evaluated, the board near electromagnetic field distribution often is measured at a desired height from the surface of the board 14a. The plane 40a is shifted by a height h from the surface of the board 14a in the Z direction.

Figure 8B:
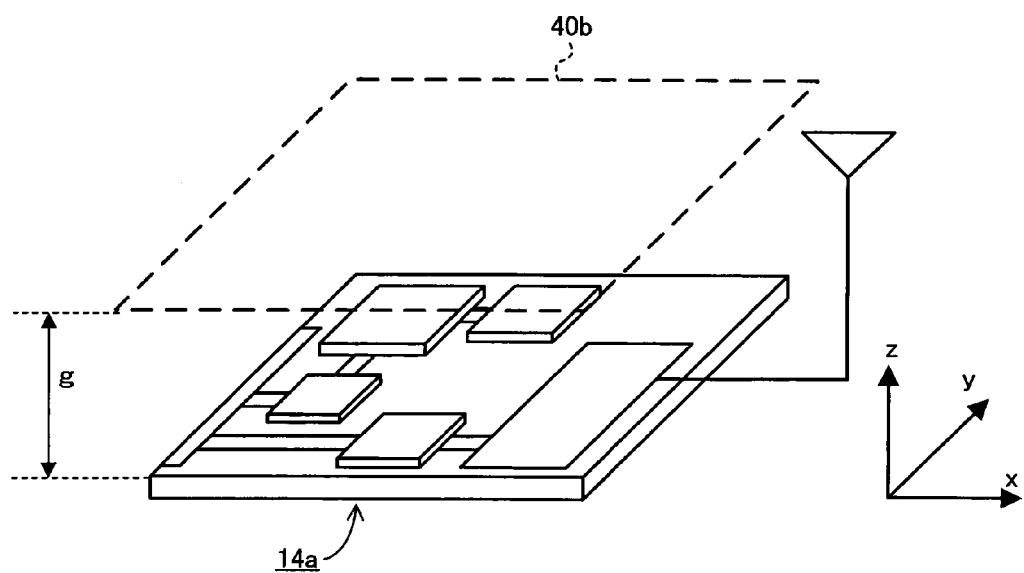

In FIG. 8B, a plane 40b represented by a broken line is an example of the measuring plane of the antenna magnetic field distribution. In some cases, the antenna magnetic field distribution is measured at a location farther from the board 14a than the measuring plane of the board near electromagnetic field distribution. This is because, e.g., when the board 14a is a mobile telephone, it often is measured with the board not being exposed, but being mounted inside a case (not shown). The plane 40b is shifted by a height g (g>h) from the surface of the board 14a in the Z direction.

As shown in FIGS. 8A and 8B, when the board near electromagnetic field distribution and the antenna magnetic field distribution are measured on different planes, the measuring position of the board near electromagnetic field always differs from that of the antenna magnetic field component. Therefore, a correlation data distribution cannot be obtained based on these distribution data. If a correlation value is determined by substituting the following values a, b in the formula 2: A $(x_1, y_1, z_1)$=ma·b, a problem may arise in the calculation or decision process because the two values a, b are at different positions.

a: intensity of the antenna magnetic field component at $(x_1, y_1, z_0+g)$ b: intensity of the board near electromagnetic field at $(x_1, y_1, z_0+h)$ $z_0$: Z coordinate on the surface of the board 14a Accordingly, the data corrector 58 converts at least one of the antenna magnetic field distribution data and the board near electromagnetic field distribution data stored in the memory section 18 so that both data have substantially the same range of distribution.

Generally, the intensity of the electromagnetic waves radiated from the board varies with a distance r from the board. When a distance from the board 14a is represented by r, it is known that the electromagnetic wave intensity is proportional to $1/r^3$ at a place closer to the board, $1/r^2$ at a place where the distance is larger than a certain value, and $1/r$ at a place where the distance is even larger than the certain value. By using this relationship and considering a difference between g and h, the electromagnetic wave intensity on the plane 40a can be converted into the electromagnetic wave intensity on the plane 40b. Thus, the data corrector 58 can have the function of shifting the antenna magnetic field distribution and the board near electromagnetic field distribution from a plane in the direction perpendicular to the plane.

The data corrector 58 either may convert the board near electromagnetic field distribution on the plane 40a into a distribution on the plane 40b or the antenna magnetic field distribution on the plane 40b into a distribution on the plane 40a. Moreover, both the board near electromagnetic field distribution on the plane 40a and the antenna magnetic field distribution on the plane 40b may be converted into distributions on a predetermined reference plane, e.g., the surface of the board 14a. Even if there are a plurality of measuring planes, or the measuring plane is not flat but spherical, a conversion can be performed in the same manner.

Embodiment 3

Figure 9:
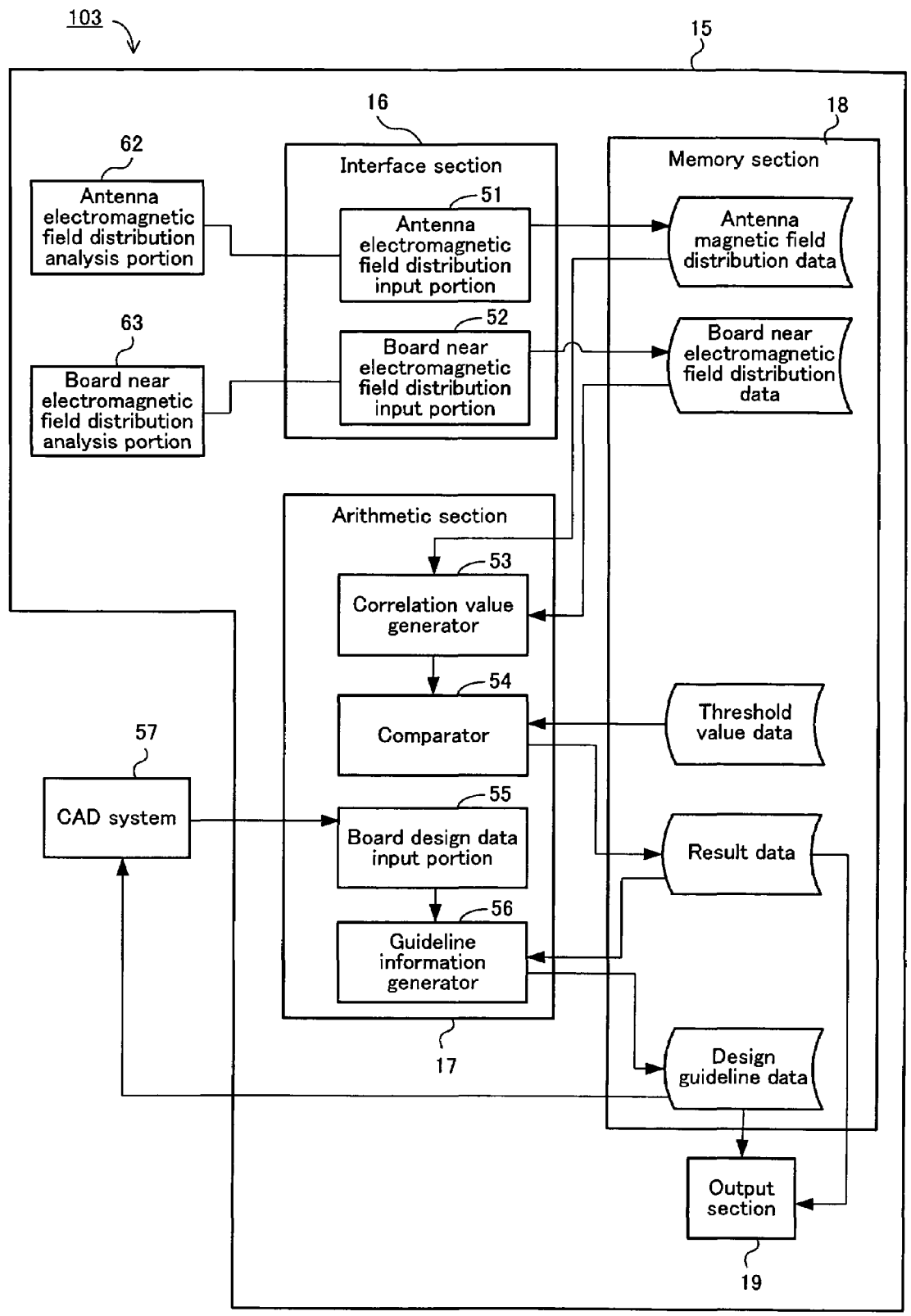
FIG. 9 is a functional block diagram showing the configuration of a design support apparatus 103.

FIG. 9 is a functional block diagram showing the configuration of a design support apparatus in Embodiment 3. The design support apparatus 103 of FIG. 9 is the same as the design support apparatus 100 of FIG. 3 except for the following points. Therefore, the same components are denoted by the same reference numerals, and the explanation will not be repeated.

The design support apparatus 103 (FIG. 9) differs from the design support apparatus 100 (FIG. 3) in that an antenna electromagnetic field distribution analysis portion 62 and a board near electromagnetic field distribution analysis portion 63 are provided instead of the antenna electromagnetic field distribution measurement portion 12, the board near electromagnetic field distribution measurement portion 13, and the controller 59. In other words, an antenna magnetic field distribution input to the antenna electromagnetic field distribution input portion 51 and a board near electromagnetic field distribution input to the board near electromagnetic field distribution input portion 52 are not the result of measurement, but the result of simulation.

As the antenna electromagnetic field distribution analysis portion 62 and the board near electromagnetic field distribution analysis portion 63, e.g., a commercially available electromagnetic field simulator, an EMI simulator, or a simulator formed by a self-produced analysis program can be used. Since the antenna magnetic field distribution and the board near electromagnetic field distribution are provided by simulation, it is not necessary to produce an actual prototype for measurement. Therefore, the two distributions can be obtained relatively easily.

In FIG. 9, although the antenna electromagnetic field distribution analysis portion 62 and the board near electromagnetic field distribution analysis portion 63 are included in the computer 15, they also may be included in an external PC or the like.

Figure 10:
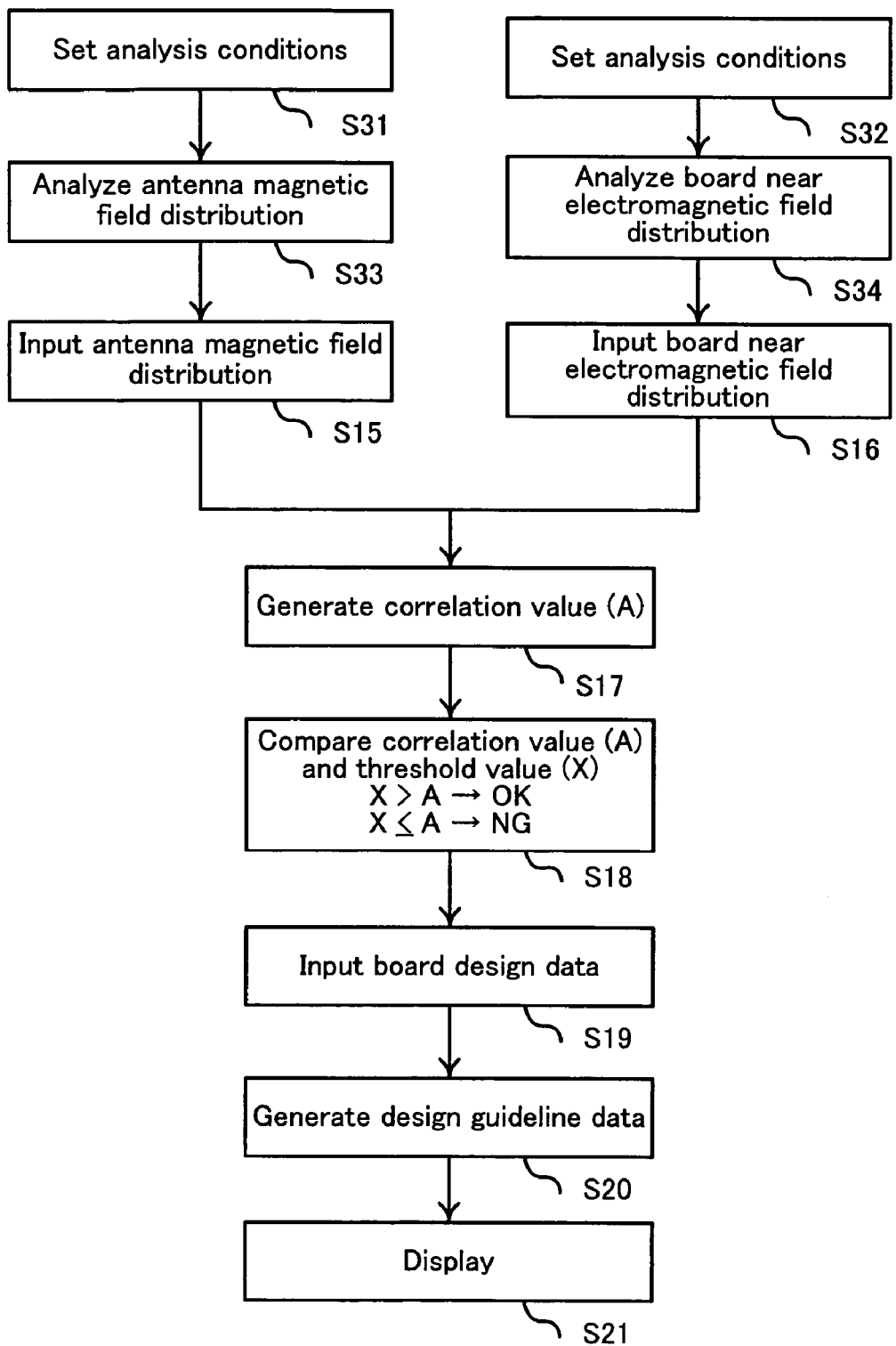
FIG. 10 is a flow chart showing the operations of processes of the design support apparatus 103.

Next, the operations of the design support apparatus 103 will be described by referring to the drawings. FIG. 10 is a flow chart showing the operations of processes of the design support apparatus 103.

First, the antenna electromagnetic field distribution analysis portion 62 and the board near electromagnetic field distribution analysis portion 63 set the analysis conditions (steps S31, S32). The analysis conditions include, e.g., structural data of the electronic equipment (e.g., a mobile telephone) to be analyzed, constants (e.g., a relative dielectric constant, a relative permeability, or a loss factor) of the materials constituting the electronic equipment, input/output excitation conditions, an analysis area (range), and boundary conditions to make the analysis area closed. The structural data of the electronic equipment may be supplied, e.g., from the CAD system 57.

The antenna electromagnetic field distribution analysis portion 62 analyzes the antenna magnetic field distribution around the electronic equipment (analyzing object) by simulation based on the analysis conditions set in the step S31 (step S33). As a result of the analysis, e.g., data are obtained that indicate the antenna magnetic field distribution on a plane located close to the electronic equipment.

The board near electromagnetic field distribution analysis portion 63 analyzes the board near electromagnetic field distribution around the electronic equipment (analyzing object) by simulation based on the analysis conditions set in the step S32 (step S34). As a result of the analysis, e.g., data are obtained that indicate the board near electromagnetic field distribution on a plane located close to the electronic equipment.

The antenna electromagnetic field distribution input portion 51 stores the result of the antenna magnetic field distribution analysis (step S33) in the memory section 18 (step S15).

The board near electromagnetic field distribution input portion 52 stores the result of the board near electromagnetic field distribution analysis (step S34) in the memory section 18 (step S16).

The processes after the steps S15 and S16 are the same as those of the design support apparatus 100 in Embodiment 1 (see FIG. 4), and therefore the explanation will not be repeated.

Embodiment 4

Figure 11:
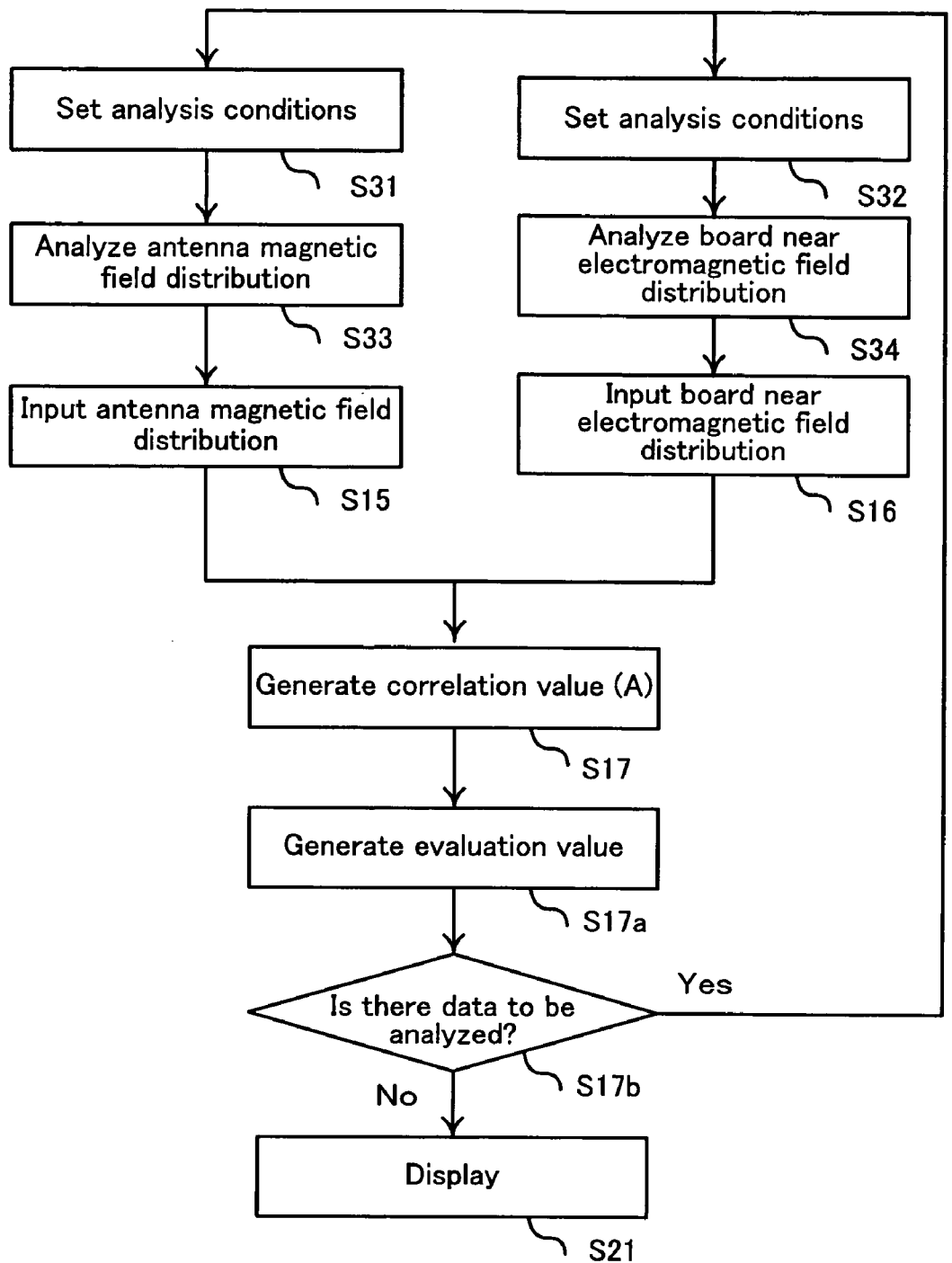
FIG. 11 is a flow chart showing a modified example of the operations of the design support apparatus 103.

This embodiment is a modified example of the operations of the design support apparatus 103 in Embodiment 3. FIG. 11 is a flow chart showing the operations of the design support apparatus 103 in this embodiment. FIG. 11 shows a process example in which the CAD system 57 produces structural data of a plurality of mobile telephones that differ in case shape and each of the mobile telephones are analyzed.

First, the antenna electromagnetic field distribution analysis portion 62 and the board near electromagnetic field distribution analysis portion 63 acquire the structural data of a first mobile telephone from the CAD system 57 and set the structural data as the analysis conditions (steps S31, S32). Like Embodiment 3, the other analysis conditions may be, e.g., the material constants, the excitation conditions, the analysis area, and the boundary conditions.

Next, the antenna electromagnetic field distribution analysis portion 62 analyzes the antenna magnetic field distribution around the electronic equipment (analyzing object) by simulation based on the analysis conditions set in the step S31

(step S33). The antenna magnetic field distribution data obtained by the analysis are stored in the memory section 18 (step S15).

The board near electromagnetic field distribution analysis portion 63 analyzes the board near electromagnetic field distribution around the electronic equipment (analyzing object) by simulation based on the analysis conditions set in the step S32 (step S34). The board near electromagnetic field distribution data obtained by the analysis are stored in the memory section 18 (step S16).

The correlation value generator 53 reads the antenna magnetic field distribution data and the board near electromagnetic field distribution data from the memory section 18 and generates correlation value distribution data (step S17). The correlation value distribution data can be generated by the same process as the correlation value generation process (step S17 of FIG. 4) in Embodiment 1.

The correlation value distribution data indicate, e.g., a distribution of the correlation values within the analysis area. In other words, the correlation value distribution data may be expressed, e.g., as the set of the correlation values at the respective points within the analysis area.

The correlation value generator 53 calculates an evaluation value by using the correlation value distribution data (step S17a). As the evaluation value, e.g., the correlation value generator 53 may generate the maximum value in the set of the correlation values indicated by the correlation value distribution data. In this case, the evaluation value shows the correlation value at a point where the degree of the effect of the board near electromagnetic field on the antenna magnetic field component is largest.

The evaluation value is not limited to the maximum value, and may be, e.g., the minimum value in the set of the correlation values, the mean value of the correlation values, the sum of the correlation values, or the product of the correlation values.

When the evaluation value for the structural data of the first mobile telephone is generated by the process in the step S17a, the design support apparatus 103 decides whether or not the structural data of a mobile telephone to be analyzed are present in the CAD system 57 (step S17b). If it is decided that there are data to be analyzed, the antenna electromagnetic field distribution analysis portion 62 and the board near electromagnetic field distribution analysis portion 63 set the data as the analysis conditions (steps S31, S32). Subsequently, the processes in the steps S33, S15, S34, S16, S17, and S17a are repeated in accordance with the analysis conditions.

In this manner, the evaluation value is generated for each of the structural data of the mobile telephones that differ in case shape, produced by the CAD system 57. The output section 19 displays these evaluation values on a display or the like so that they can be contrasted with each other (step S21). A designer sees the representation of the output section 19 and can compare the evaluation values of the structural data of the mobile telephones produced by the CAD system 57.

As described above, in Embodiments 1 to 4, a value is calculated from two distributions, i.e., the antenna magnetic field distribution and the board near electromagnetic field distribution, and this value is compared to the decision threshold value required to prevent a transmission/reception disturbance. Accordingly, the effect on the transmission and reception characteristics of unwanted radiation noise caused by a high-frequency current flowing through the line pattern that is routed between the semiconductor ICs or components mounted on a printed circuit board can be understood easily with a simple configuration. Moreover, the anti-noise effect can be understood quantitatively while estimating the actual operation of a mobile telephone terminal. In designing a mobile telephone terminal, the design support apparatus performs the processes of the flow chart as shown in FIGS. 4 and 10, so that both the period of time and cost for development can be reduced.

The design support apparatus in each of Embodiments 1 to 4 also can be used as an electromagnetic wave analysis apparatus.

Embodiment 5

This embodiment is directed to an electromagnetic wave analysis apparatus that evaluates a transmission/reception disturbance of electronic equipment such as a mobile telephone under conditions close to the actual operation of the electronic equipment. The transmission/reception disturbance to be evaluated in this embodiment is caused mainly by leakage of the unwanted radiation noise radiated from a circuit board of the electronic equipment into a radio circuit via an antenna.

Figure 12:
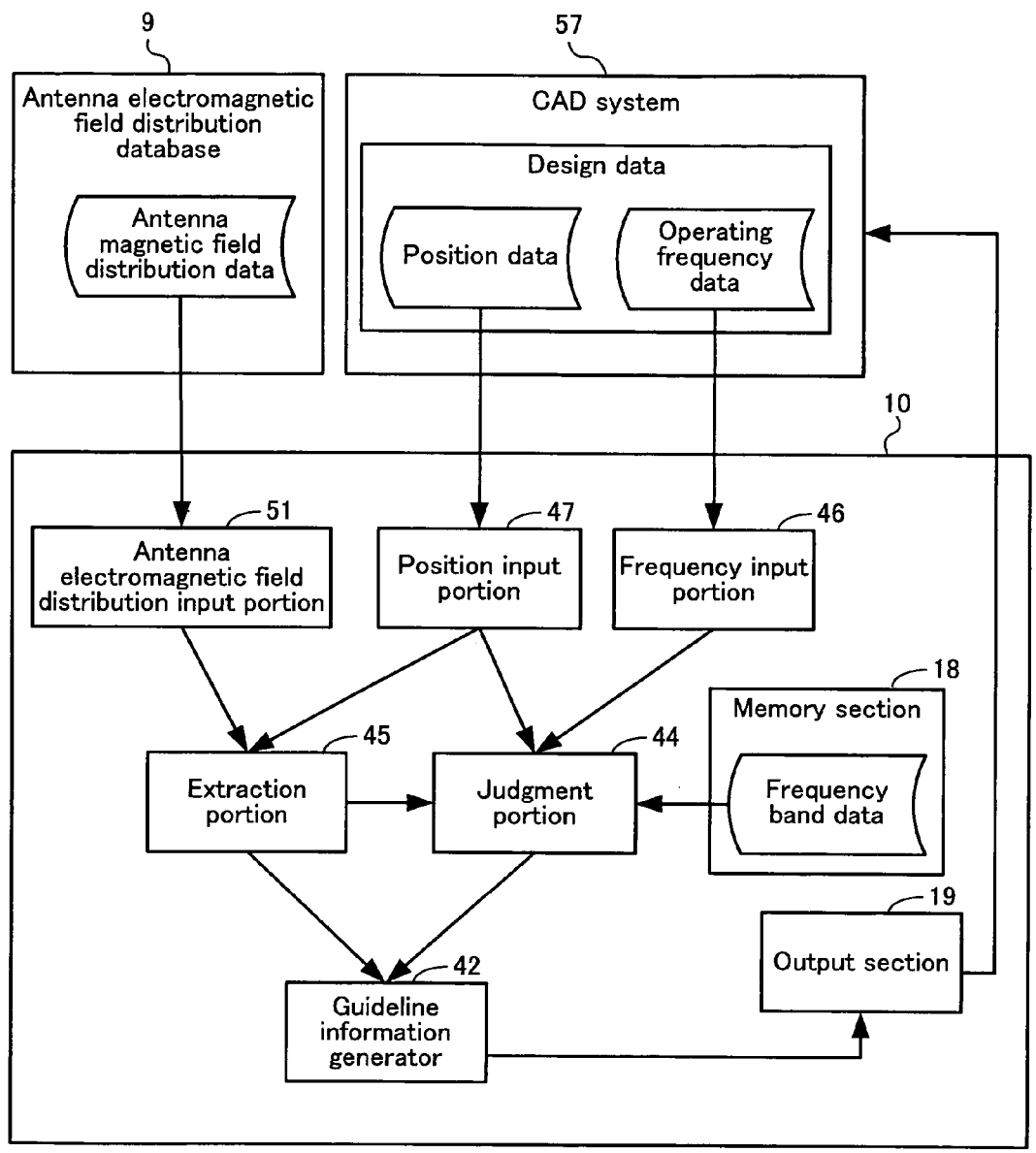
FIG. 12 is a functional block diagram showing the configuration of an electromagnetic wave analysis apparatus in Embodiment 5.

FIG. 12 is a functional block diagram showing the configuration of an electromagnetic wave analysis apparatus in this embodiment.

The electromagnetic wave analysis apparatus 10 in FIG. 12 analyzes the design data of a circuit board of electronic equipment (e.g., a mobile telephone). In other words, the electromagnetic wave analysis apparatus 10 is a system for obtaining information about the effect of the component arrangement in the circuit board on the transmission and reception functions of the electronic equipment.

The electromagnetic wave analysis apparatus 10 includes an antenna electromagnetic field distribution input portion 51, a position input portion 47, a frequency input portion 46, an extraction portion 45, a judgment portion 44, a guideline information generator 42, and an output section 19. Moreover, the electromagnetic wave analysis apparatus 10 is connected to an antenna electromagnetic field distribution database 9 and a CAD system 57.

The antenna electromagnetic field distribution database 9 stores antenna magnetic field distribution data.

The CAD system 57 stores design data of the electronic equipment to be analyzed. The design data stored in the CAD system 57 include position data and operating frequency data.

A memory section 18 stores frequency band data. The frequency band data indicate the frequency bands of electromagnetic waves transmitted and received by the electronic equipment to be analyzed.

The antenna electromagnetic field distribution input portion 51 reads the antenna magnetic field distribution data from the antenna electromagnetic field distribution database 9 so that the extraction portion 45 can utilize the antenna magnetic field distribution data. The antenna electromagnetic field distribution input portion 51 also may receive the input data directly from a designer via a mouse or a keyboard. The antenna magnetic field distribution data will be described in detail later.

The position input portion 47 reads the position data from the CAD system 57 so that the extraction portion 45 and the judgment portion 44 can utilize the position data. The position data will be described in detail later.

The frequency input portion 46 reads the operating frequency data from the CAD system 57 so that the judgment portion 44 can utilize the operating frequency data. The operating frequency data will be described in detail later.

The extraction portion 45 performs an operation to extract a terminal of a component that may affect the transmission and reception functions of the electronic equipment from the position data based on the antenna magnetic field distribution data read by the antenna electromagnetic field distribution input portion 51 and the position data read by the position input portion 47.

The judgment portion 44 performs an operation to judge whether or not the terminals of components indicated by the position data affect the transmission and reception functions of the electronic equipment based on the position data read by the position input portion 47, the operating frequency data read by the frequency input portion 46, and the frequency band data stored in the memory section 18.

The guideline information generator 42 generates information used as a guideline for designing the electronic equipment based on the results of the operations of the extraction portion 45 and the judgment portion 44.

The output section 19 outputs the results of the operations of the extraction portion 45 and the judgment portion 44 and the information generated by the guideline information generator 42 to the CAD system 57. The output section 19 also may output the above information to output equipment such as a display or a printer so that a designer can see it easily.

The electromagnetic magnetic wave analysis apparatus 10 can be configured, e.g., by using general equipment such as EWS (engineering work station) or PC (personal computer), referred to as "PC or the like" in the following. The functions of the antenna electromagnetic field distribution input portion 51, the position input portion 47, the frequency input portion 46, the extraction portion 45, the judgment portion 44, and the guideline information generator 42 can be achieved by executing a predetermined program with a CPU of the PC or the like. The memory section 18 may be, e.g., a hard disk contained in the PC or the like, a recording medium such as a RAM, a portable recording medium such as a flexible disk or a memory card, or a recording medium in a memory that is present on the network. The output section 19 may be, e.g., a display unit including a display of the PC or the like or an output unit such as a printer.

The electromagnetic wave analysis apparatus 10 also can be constructed, e.g., by installing the program that allows a computer to execute the processes of the antenna electromagnetic field distribution input portion 51, the position input portion 47, the frequency input portion 46, the extraction portion 45, the judgment portion 44, and the guideline information generator 42 on a desired PC or the like from a recording medium such as a CD-ROM or by down load through a communication line.

The hardware configuration is not limited to that shown in FIG. 12. For example, the functions of the electromagnetic wave analysis apparatus 10 may be distributed among a plurality of PCs or the like connected to perform communications over the Internet or LAN. Moreover, the CAD system 57, the antenna electromagnetic field distribution database 9, and the electromagnetic wave analysis apparatus 10 may be included in a single PC or the like.

Next, the operations of an electromagnetic wave analysis process performed by the electromagnetic wave analysis apparatus 10 for design of the electronic equipment will be described. Here, the design process of a mobile telephone is taken as an example.

Figure 13:
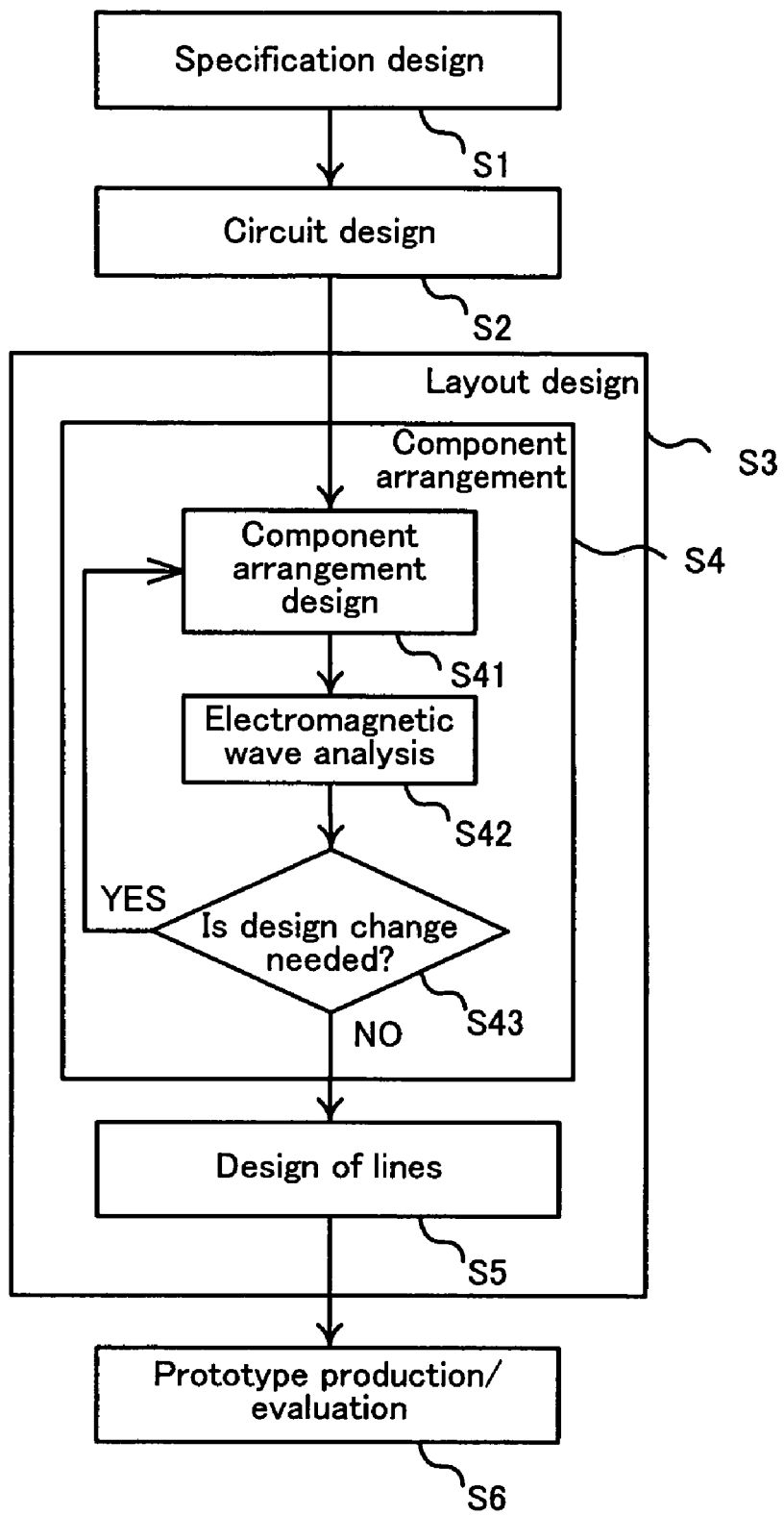
FIG. 13 is a flow chart showing the design flow of a mobile telephone.

FIG. 13 is a flow chart showing the design flow of a mobile telephone. The design of a mobile telephone includes a specification design step (S1), a circuit design step (S2), a layout design step (S3), and a prototype production/evaluation step (S6). The layout design step (S3) includes a component arrangement step (S4) of arranging devices such as ICs or chips on a circuit board and a line design step (S5) of arranging lines between the ICs. The operations of the electromagnetic wave analysis apparatus 10 in this embodiment relate mainly to the electromagnetic wave analysis process in the component arrangement step (S4).

In the component arrangement step (S4), first, the arrangement of components such as ICs provided on the circuit board of the mobile telephone is designed (S41). In the component arrangement design, the position data indicating the arrangement of the ICs on the circuit board are produced and stored in the CAD system 57. The position data include, e.g., information about the positions of power supply terminals, clock terminals, signal terminals, ground terminals, and the like of the ICs.

Moreover, the operating frequency data of the ICs arranged on the circuit board are determined and stored in the CAD system 57. The operating frequency data include, e.g., the frequency of signals transmitted through each of the terminals of the ICs, such as the power supply terminals, the clock terminals, the signal terminals, and the ground terminals.

Next, the electromagnetic wave analysis apparatus 10 performs an electromagnetic wave analysis to examine the effect of the component arrangement designed in the step S41 on the transmission and reception functions of the mobile telephone (S42).

As a result of the electromagnetic wave analysis (S42), if it is decided that a design change of the component arrangement is needed ("YES" in step S43), then the component arrangement design (S41) is performed again. If it is decided that no design change is needed ("NO" in step S43), then the component arrangement (S4) is finished and the design of lines (S5) is performed.

Figure 14:
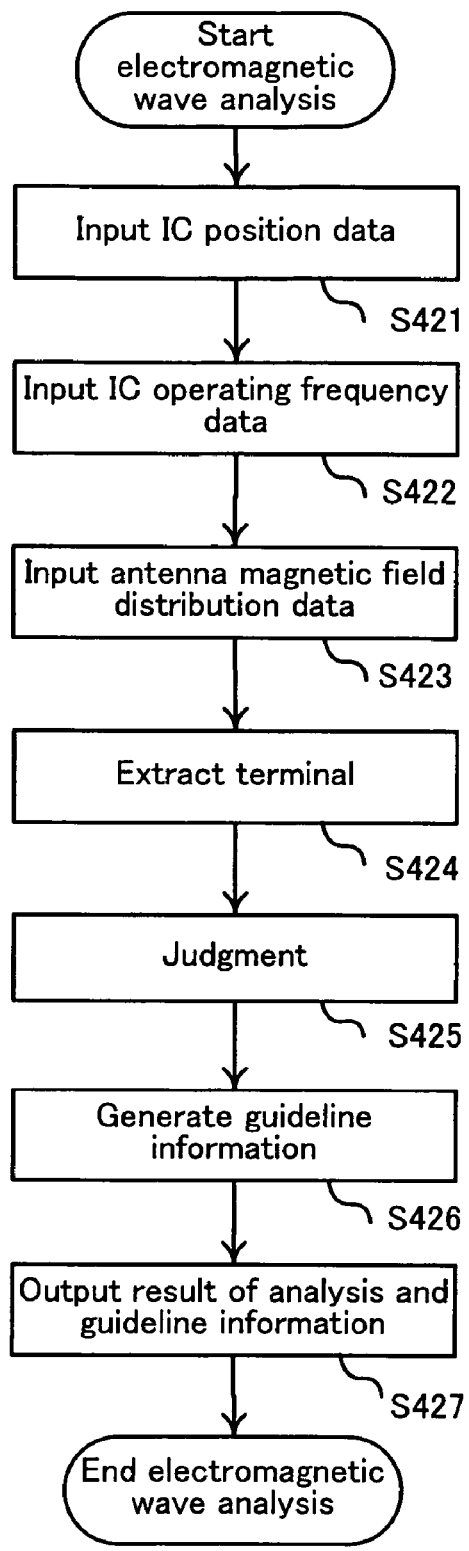
FIG. 14 is a flow chart showing the detailed processes of electromagnetic wave analysis.

FIG. 14 is a flow chart showing the detailed processes of the electromagnetic wave analysis (S42). In the following, the detailed processes of the electromagnetic wave analysis (S42) will be described by referring to FIGS. 12 and 14.

First, the position input portion 47 reads the position data of the ICs included in the design data of the CAD system 57 (S421).

FIG. 15A shows an example of the ICs arranged on a circuit board indicated by the position data. In FIG. 15A, a plane parallel to the circuit board 71 is defined as an XY plane, and a direction perpendicular to the circuit board 71 is defined as a Z-axis direction. FIG. 15A is a plan view of the circuit board 71 when viewed from the Z-axis direction.

The ICs 2a and 2b are mounted on the circuit board 71. The IC 2a includes a power supply terminal 3, a clock terminal 4, a signal terminal 5, and a ground terminal 6.

The circuit board 71 may be, e.g., the main board of the mobile telephone. The ICs 2a, 2b may be, e.g., a memory, a CPU (central processing unit), or a power supply IC. The circuit board 71 transmits and receives electromagnetic waves via an antenna (not shown). For example, when the mobile telephone including the circuit board 71 is used to make a phone call or access the Internet by radio communication, the electromagnetic waves are transmitted from or received by the antenna.

When the position data of the ICs as shown in FIG. 15A are read, the frequency input portion 46 reads the operating frequency data of the ICs included in the design data of the CAD system 57 (S422 in FIG. 14). The operating frequency data may be, e.g., information on the IC specification provided by IC suppliers.

The antenna electromagnetic field distribution input portion 51 reads the antenna magnetic field distribution data from the antenna electromagnetic field distribution database 9 (S423).

The antenna magnetic field component may be, e.g., the magnetic field component of the electromagnetic waves transmitted and received via the antenna of the electronic equipment such as a mobile telephone. The antenna magnetic field component is expressed as a current and referred to as an antenna current. In the electronic equipment, the antenna may include not only a surface mounted component, but also all members that substantially function as an antenna. For example, the circuit board 71 in FIG. 15A also acts as part of the antenna. In such a case, the antenna current flows through the circuit board 71. For the mobile telephone, in addition to the antenna mounted as a component, the whole or part of the case (frame) and the internal connector or iron sheet may function as an antenna. Therefore, the antenna current can flow through all the materials constituting the mobile telephone, such as the case and the board. Thus, the antenna magnetic field is generated even in those materials.

The antenna magnetic field distribution data include, e.g., the coordinates of each position in the distribution range and the value of the antenna current at each position with the coordinates.

FIG. 15B shows an example of the antenna magnetic field distribution 7 around the circuit board 71. The antenna magnetic field distribution 7 may be, e.g., a distribution of the antenna current flowing through the case of the mobile telephone that is located at a certain distance away from the circuit board 71.

In FIG. 15B, a plane parallel to the circuit board 71 is defined as the XY plane, and a direction perpendicular to the circuit board 71 is defined as the Z-axis direction. The antenna magnetic field distribution 7 is indicated by the antenna magnetic field distribution data input in the antenna magnetic field distribution input step (S423). The antenna magnetic field distribution 7 shows a distribution of the antenna magnetic field component in a region that is superimposed over the circuit board 71 in the Z-axis direction and is located on a plane that is parallel to the XY plane and at a certain distance away from the circuit board 71. The distribution range of the antenna magnetic field distribution 7 is the same as the region of the circuit board 71 on the XY plane.

The antenna magnetic field distribution 7 shows a distribution of the antenna magnetic field component at a predetermined frequency (e.g., 750 MHz). The frequency of the antenna magnetic field component is included in the frequency band (e.g., 700 MHz to 800 MHz) of the electromagnetic waves transmitted and received by the circuit board 71 via the antenna.

In the antenna magnetic field distribution 7, a region 8 hatched with diagonal lines is a region where the antenna magnetic field component exceeds a predetermined threshold value. FIG. 15C is a diagram superimposing the region 8 where the antenna magnetic field distribution exceeds the threshold value and the IC 2a.

The antenna electromagnetic field distribution database 9 stores the antenna magnetic field distribution data of two or more pieces of electronic equipment. The antenna magnetic field distribution data thus stored may be, e.g., actual measured data of the circuit boards of a plurality of mobile telephones. The antenna magnetic field distribution data obtained by measuring various circuit boards that were developed in the past can be accumulated to form a database. For identification, each of the antenna magnetic field distribution data is assigned ID (ID=1 to 4).

FIG. 16 shows an example of data corresponding to the antenna magnetic field distribution data of the circuit boards of the mobile telephones stored in the antenna electromagnetic field distribution database 9. In the example of FIG. 16, the type of mobile telephone, the frequency, and the type of antenna are stored in correspondence with each of the antenna magnetic field distribution data. In this manner, since there is a correspondence between the antenna magnetic field distribution data and the related data, it is possible to retrieve from the antenna electromagnetic field distribution database 9 the antenna magnetic field distribution data corresponding to the design data of the circuit board to be analyzed.

The type of mobile telephone in FIG. 16 may be, e.g., the type of system such as W-CDMA (wideband-code division multiple access) or GSM (global system for mobile communication) or the name of model.

Although the antenna electromagnetic field distribution input portion 51 inputs the antenna magnetic field distribution data stored in the antenna electromagnetic field distribution database 9, the input process is not limited thereto. For example, the antenna magnetic field distribution data obtained by measurement or simulation may be input, as will be described later.

In this embodiment, the antenna magnetic field distribution data are used as data indicating a distribution of the electromagnetic waves transmitted and received via the antenna. However, antenna voltage distribution data indicating a distribution of an antenna voltage that is the electric field component of the electromagnetic waves transmitted and received via the antenna also can be used instead of the antenna magnetic field distribution data.

After the antenna magnetic field distribution data input process (S423) is finished, the extraction portion 45 extracts a terminal that may affect the transmission and reception functions of the mobile telephone based on the IC position data read in the step S421 and the antenna magnetic field distribution data read in the step S423 (S424). The extraction portion 45 decides whether or not at least one of the power supply terminal, the clock terminal, and the signal terminal of the IC terminals is included in a region where the antenna magnetic field component exceeds a predetermined threshold value of the antenna magnetic field distribution. For example, if the power supply terminal, the clock terminal, and the signal terminal are not included in the region where the antenna magnetic field component exceeds the threshold value, the extraction portion 45 decides that no transmission/reception disturbance of the electronic equipment occurs due to unwanted radiation noise. If the power supply terminal, the clock terminal, or the signal terminal is included in the region where the antenna magnetic field component exceeds the threshold value, the extraction portion 45 decides that a transmission/reception disturbance of the electronic equipment occurs due to unwanted radiation noise.

Referring to FIG. 15, an example of a method for extracting a terminal by the extraction portion 45 will be described. The extraction portion 45 extracts a terminal or a line at the position on the circuit board that corresponds to the region 8 where the antenna magnetic field component exceeds the threshold value in the distribution range of the antenna magnetic field distribution 7, as shown in FIG. 15B.

The decision on whether or not a terminal is included in the region 8 where the antenna magnetic field component exceeds the threshold value can be made, e.g., depending on whether or not the value of the antenna magnetic field component at the position with the same XY coordinates as the terminal of the circuit board 71 exceeds the threshold value. The extraction portion 45 can decide whether or not the antenna magnetic field component exceeds the threshold value with respect to the positions of all the terminals on the circuit board 71 (the clock terminal 4, the signal terminal 5, and the power supply terminal 3), thereby extracting a terminal that overlaps the region 8 on the circuit board 71. As described above, when the XY coordinates of the terminal are compared to the antenna magnetic field component with the corresponding XY coordinates, the coordinate system of the circuit board 71 should be the same as that of the antenna magnetic field distribution 7. A method for deciding whether or not a terminal is included in the region 8 where the antenna magnetic field component exceeds the threshold value is not limited to the above example.

In FIG. 15C, the clock terminals 4a, 4b and the signal terminals 5a, 5b, 5c of the IC 2a overlap the region 8 where the antenna magnetic field component-exceeds the threshold value. Among the terminals of the IC 2a, the clock terminals 4a, 4b and the signal terminals 5a, 5b, 5c are present in the region 8. Therefore, the extraction portion 45 extracts the clock terminals 4a, 4b and the signal terminals 5a, 5b, 5c. In other words, the clock terminals 4a, 4b and the signal terminals 5a, 5b, 5c are extracted as terminals that may cause a transmission/reception disturbance of electromagnetic waves in the mobile telephone.

As shown in FIG. 15C, the clock terminals 4a, 4b are not included fully in the region 8, but partially. In this case, the extraction portion 45 also can decide that there is no chance that the clock terminals 4a, 4b will cause a transmission/reception disturbance. The extraction of a terminal that partially overlaps the region 8, such as the clock terminals 4a, 4b, as a problem terminal may be determined, e.g., according to the degree of overlapping or the properties of the terminal.

An example of a method for calculating the threshold value will be described below. In the case of a mobile telephone employing a W-CDMA system, e.g., the specification is standardized under the 3GPP (third generation partnership project) for introduction on the market. In the standardization, there is the reception sensitivity that should be met to prevent a transmission/reception disturbance, and the value of the reception sensitivity is defined as $-117$ dBm/3.84 MHz. This means that the reception must succeed when the input power is larger than $-117$ dBm/3.84 MHz. To achieve this reception sensitivity of the mobile telephone, the amount of unwanted radiation noise received by the antenna needs to be reduced to a certain reference value or less because the unwanted radiation noise is attributed to degradation of the reception sensitivity characteristics. The threshold value can be calculated to achieve such desired reception sensitivity.

Referring to FIG. 14, the judgment portion 44 judges the effect of the terminals extracted by the extraction portion 45 on the transmission and reception functions of the mobile telephone (S425). In other words, the judgment process is performed on the terminals located at the positions corresponding to the region where the antenna magnetic field component exceeds the threshold value. The judgment portion 44 judges whether or not the terminals of an IC on the circuit board affect the transmission and reception functions of the mobile telephone by comparing the operating frequency of the terminals of the IC on the circuit board with the frequency of the mobile telephone to be analyzed.

There are a plurality of methods for judgment by the judgment portion 44. A first judgment method will be described below.

The judgment portion 44 judges whether or not the operating frequency and the multiple frequency that is an integer multiple of the operating frequency of the terminals of the IC extracted in the step S424 are included in the frequency band of the electromagnetic waves transmitted and received by the mobile telephone to be analyzed (referred to as a frequency band of the mobile telephone in the following). If the operating frequency or the multiple frequency of the terminals of the IC is included in the frequency band of the mobile telephone, it is judged that the terminals of the IC affect the transmission and reception functions of the mobile telephone.

In FIG. 15C, e.g., the operating frequency of the signal terminal 5a, which is one of the extracted terminals, is defined as 375 MHz and the frequency band of the mobile telephone is defined as 700 MHz to 800 MHz. When the operating frequency is doubled, the resultant value is 750 MHz and included in the frequency band of the mobile telephone. Therefore, the signal terminal 5a is judged as a terminal that affects the transmission and reception functions of the mobile telephone.

The judgment portion 44 also may judge whether or not the operating frequency is equal to a predetermined frequency included in the frequency band of the mobile telephone. For example, the judgment portion 44 can compare the operating frequency of a terminal with a frequency of 750 MHz in the frequency band of the mobile telephone ranging from 700 MHz to 800 MHz. If the operating frequency of the terminal is 750 MHz, the terminal is judged as a terminal that affects the transmission and reception functions of the mobile telephone.

Next, a second judgment method different from the first judgment method will be described below.

The judgment portion 44 judges whether or not the operating frequency or the multiple frequency that is an integer multiple of the operating frequency of the terminals of the IC on the circuit board is equal or close to a difference between the frequency of the electromagnetic waves transmitted by the mobile telephone to be analyzed (referred to as a transmission frequency in the following) and the frequency of the electromagnetic waves received by the mobile telephone to be analyzed (referred to as a reception frequency in the following). If the operating frequency or the multiple frequency of the terminals of the IC is equal or close to a difference between the transmission frequency and the reception frequency, it is judged that the terminals of the IC affect the transmission and reception functions of the mobile telephone.

In FIG. 15C, e.g., the operating frequency of the signal terminal 5a, which is one of the extracted terminals, is defined as 50 MHz, a transmission frequency A is defined as 700 MHz, and a reception frequency B is defined as 800 MHz. When the operating frequency is doubled, the resultant value is 100 MHz and equal to a difference (|800 MHz−700 MHz|=100 MHz) between the transmission frequency A and the reception frequency B of the mobile telephone. Therefore, the signal terminal 5a is judged as a terminal that affects the transmission and reception functions of the mobile telephone.

A difference (|A−B|) between the transmission frequency A and the reception frequency B of the mobile telephone may vary to some extent. For example, the band of the transmission frequency A is defined as 790 MHz to 810 MHz and the band of the reception frequency B is defined as 890 MHz to 910 MHz. In this case, a difference (|A−B|) between the transmission frequency A and the reception frequency B can be in the range of 80 MHz to 120 MHz. For example, when the operating frequency of the signal terminal 5a is 51 MHz, twice the operating frequency (102 MHz) is included in the range of 80 MHz to 120 MHz. Therefore, the judgment portion 44 can judge the signal terminal 5a as a terminal that affects the transmission and reception functions of the mobile telephone.

In addition to a comparison of the operating frequency and a difference (|A−B|) between the transmission frequency A and the reception frequency B, the judgment portion 44 may compare the operating frequency or an integer multiple of the operating frequency with, e.g., the sum (|A+B|) of these frequencies A, B or a value of |A+(B/2)|.

As shown in FIG. 14, the terminals extracted by the extraction portion 45 in the step S424 are judged further by the judgment portion 44 in the step S425. Thus, it is possible to extract a terminal that is more likely to affect the transmission and reception functions of the mobile telephone.

After the terminal extraction step (S424) and the judgment step (S425) are finished, the guideline information generator 42 generates information used as a guideline for changing the design of the terminals extracted by the extraction portion 45 or the terminals judged by the judgment portion 44 as affecting the transmission and reception functions of the mobile telephone (S426).

In FIG. 15C, e.g., the guideline information generator 42 generates information for shifting the position of the IC 2a or rotating the IC 2a so that the extracted clock terminals 4a, 4b and signal terminals 5a, 5b, 5c do not overlap the region 8 where the antenna magnetic field component exceeds the threshold value. That is, the guideline information generator 42 calculates the optimum position of the IC 2a. The guideline information generator 42 also can generate information for changing the arrangement of the terminals in the IC 2a without shifting the position of the IC 2a.

For example, when the operating frequency of the signal terminal 5a is included in the frequency band of the electromagnetic waves transmitted and received by the mobile telephone, the guideline information generator 42 may generate information for changing the operating frequency of the signal terminal 5a.

The output section 19 displays the information generated by the guideline information generator 42 on a display or the like (S427). By displaying the information generated by the guideline information generator 42, the output section 19 can have the advisory function that gives a designer advice on the design of the circuit board. Therefore, it is easy even for a person who is not fully conversant with the design to take anti-noise measures by referring to the advisory function without requiring any special knowledge.

Moreover, the output section 19 may send the information generated by the guideline information generator 42 to the CAD system 57. The CAD system 57 can change the design data such as position data or operating frequency data of the mobile telephone automatically based on the information received from the guideline information generator 42.

The output section 19 may display not only the data generated by the guideline information generator 42, but also data indicating the terminals extracted by the extraction portion 45 or the terminals judged by the judgment portion 44 as affecting the transmission and reception functions of the mobile telephone without modifying the data.

The order of the electromagnetic wave analysis process is not limited to the flow chart as shown in FIG. 14. For example, the order of the input processes of the IC position data input (S421), the IC operating frequency data input (S422), and the antenna magnetic field distribution data input (S423) can be determined arbitrarily. Moreover, these input processes may be performed simultaneously.

In the process of extracting terminals (S424), the extraction of the terminals at the positions corresponding to the region where the antenna magnetic field component exceeds a predetermined threshold value is performed one time only with respect to the single threshold value of the antenna magnetic field component. However, the extraction process is not limited thereto, and may be performed for each of a plurality of threshold values. For example, when there are many extracted terminals corresponding to the region where the antenna magnetic field component exceeds a certain threshold value, the extraction process is performed again by setting a higher threshold value, so that the number of extracted terminals can be reduced.

In this embodiment, the judgment (S425) is performed after the terminal extraction (S424). However, even if the judgment is omitted, it is possible to obtain information about the effect of the component arrangement in the circuit board on the transmission and reception functions of the mobile telephone.

In this embodiment, although the judgment portion 44 judges the terminals extracted by the extraction portion 45, it also may judge terminals other than the extracted terminals.

Figure 17:
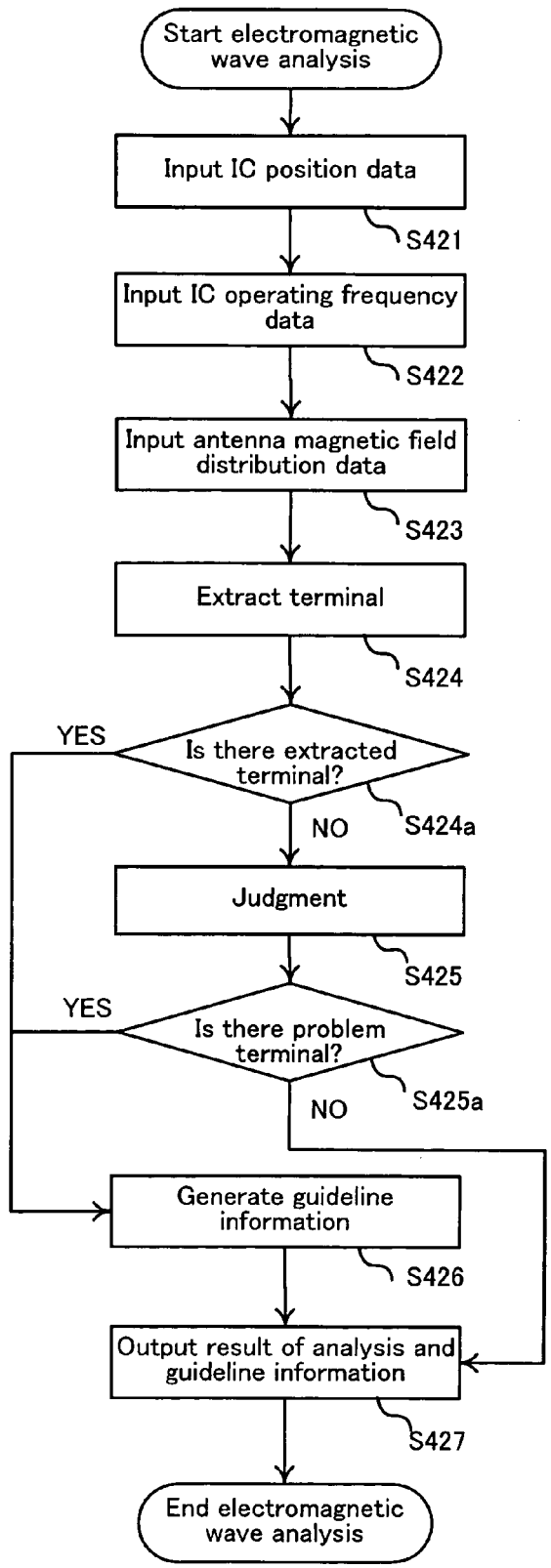
FIG. 17 is a flow chart showing a modified example of the processes in Embodiment 5.

FIG. 17 is a flow chart showing a modified example of the processes in this embodiment. The flow chart shows the processes when the output section 19 outputs the results of the terminal extraction step (S424) and the judgment step (S425). In FIG. 17, the same steps as those in FIG. 14 are denoted by the same reference numerals, and the explanation will not be repeated.

In the processes of FIG. 17, if a terminal is extracted in the terminal extraction (S424) by the extraction portion 45 ("YES" in step S424a), the guideline information generator 42 generates information used as a guideline for changing the design of the extracted terminal (S426). The output section 19 outputs information on the extracted terminal and the information generated by the guideline information generator 42 (S427). At the same time, the result of analysis that suggests the need for a design change also may be output. In this case, the electromagnetic wave analysis process is finished without performing the judgment (S425).

The output section 19 can display the circuit board indicated by the design data of the CAD system 57, e.g., by changing only the extracted terminal in color. A designer returns to the component arrangement design step (S41 in FIG. 13) and reviews the arrangement of the ICs or a design change of the antenna characteristics while seeing the representation of the output section 19. When the design of the component arrangement is changed, the electromagnetic wave analysis process starts again using the design data thus changed, as shown in FIG. 17.

If no terminal is extracted in the terminal extraction (S424) ("NO" in step S424a), the judgment (S425) is performed. Then, if there is a terminal judged by the judgment portion 44 as affecting the transmission and reception functions of the mobile telephone, i.e., a problem terminal ("YES" in step S425a), the guideline information generator 42 generates information used as a guideline for changing the design of the problem terminal (S426). The output section 19 outputs information on the problem terminal and the information generated by the guideline information generator 42 (S427). At the same time, the result of analysis that suggests the need for a design change also may be output. The electromagnetic wave analysis process is finished with output of the result of analysis that suggests the need for a design change.

The output section 19 can display the circuit board indicated by the design data of the CAD system 57, e.g., by changing only the problem terminal in color. A designer returns to the component arrangement design step (S41 in FIG. 13) and reviews the arrangement of the ICs or a design change of the antenna characteristics while seeing the representation of the output section 19. When the design of the component arrangement is changed, the electromagnetic wave analysis process starts again using the design data thus changed, as shown in FIG. 17.

If no terminal is extracted in the terminal extraction (S424) ("NO" in step S424a) and no problem terminal is found by the judgment (S425) ("NO" in step S425a), it is decided that no transmission/reception disturbance occurs due to the terminals of the IC on the circuit board. The output section 19 outputs this as a result of analysis (S427), namely the result of analysis that suggests no need for a design change is output.

According to this embodiment, a region where the antenna magnetic field component exceeds a predetermined threshold value of the antenna magnetic field distribution is combined with the position data or operating frequency data of the terminals in an IC, thereby analyzing a causal relationship between the unwanted radiation noise and a transmission/reception disturbance of the electronic equipment. Thus, it is possible to specify the presence or absence of a transmission/reception disturbance due to the unwanted radiation noise and a place where the transmission/reception disturbance occurs. Consequently, the location with a problem can be detected beforehand in the early stage of design of the electronic equipment such as radio equipment including a mobile telephone.

Embodiment 6

Figure 18:
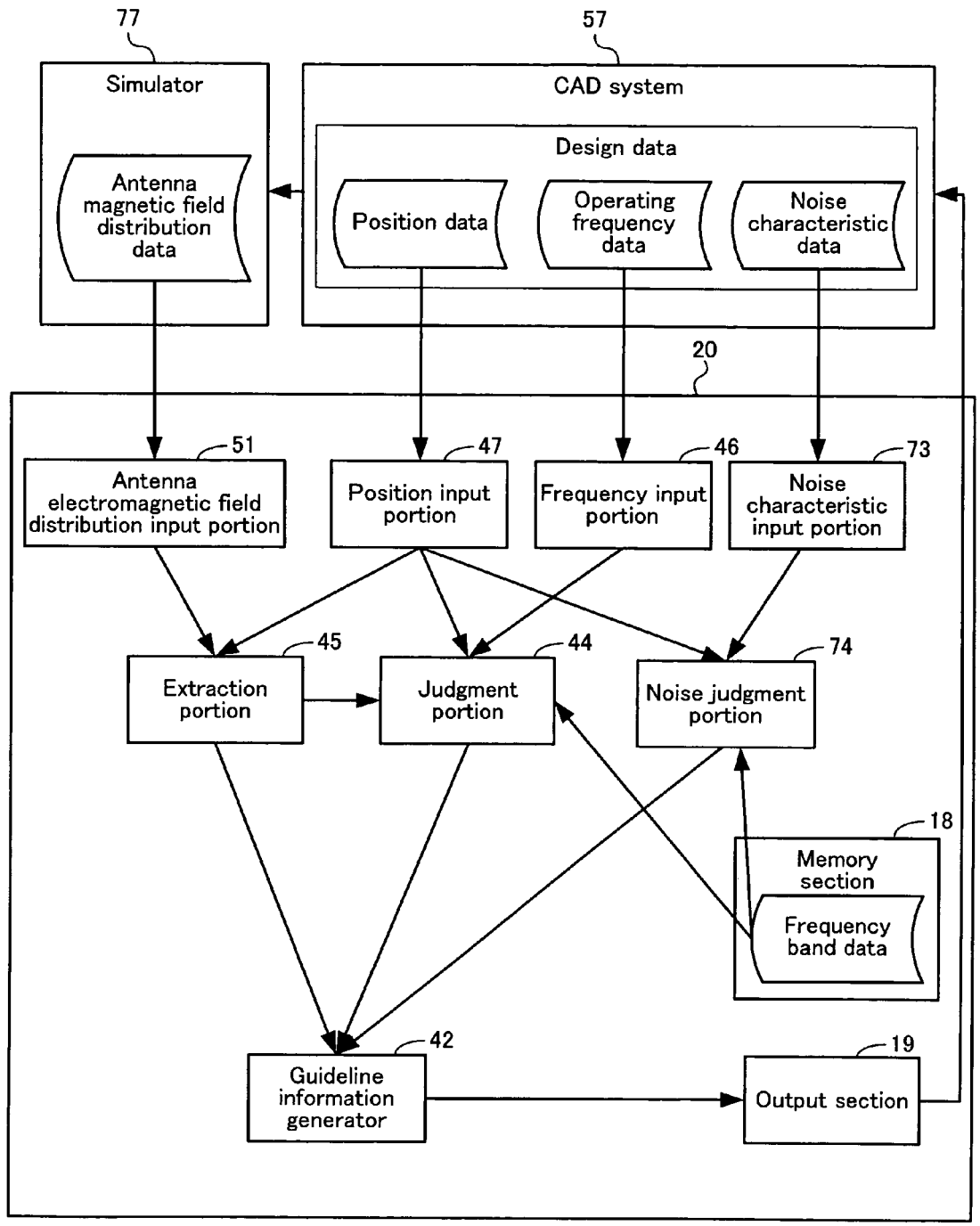
FIG. 18 is a functional block diagram showing the configuration of an electromagnetic wave analysis apparatus in Embodiment 6.

FIG. 18 is a functional block diagram showing the configuration of an electromagnetic wave analysis apparatus in Embodiment 6. In FIG. 18, the same functional blocks as those in FIG. 12 are denoted by the same reference numerals, and the explanation will not be repeated.

The electromagnetic wave analysis apparatus 20 (FIG. 18) differs from the electromagnetic wave analysis apparatus 10 (FIG. 12) in that the electromagnetic wave analysis apparatus 20 further includes a noise characteristic input portion 73 and a noise judgment portion 74, and also is connected to a simulator 77 so that data communications can be performed between them.

The design data stored in the CAD system 57 include noise characteristic data in addition to the position data and the operating frequency data.

The noise characteristic input portion 73 reads the noise characteristic data from the CAD system 57 so that the noise judgment portion 74 can utilize the noise characteristic data. The noise characteristic data show the frequency characteristics of noise generated from the terminals of components or lines indicated by the position data. The noise characteristic data will be described in detail later.

The noise judgment portion 74 performs an operation to judge whether or not the lines indicated by the position data affect the transmission and reception functions of the electronic equipment based on the position data read by the position input portion 47, the noise characteristic data read by the noise characteristic input portion 73, and the frequency band data stored in the memory section 18. The result of the operation of the noise judgment portion 74 is sent to the guideline information generator 42. The guideline information generator 42 generates guideline information based on the result of the operation of the noise judgment portion 74.

The simulator 77 determines an electromagnetic field distribution around a circuit board by calculation based on the design data of the circuit board produced by the CAD system 57. In other words, an antenna magnetic field distribution around the circuit board to be analyzed is generated and stored in the simulator 77. The simulator 77 may be, e.g., a commercially available electromagnetic field simulator, an EMI simulator, or a simulator formed by a self-produced analysis program.

Next, the operations of an electromagnetic wave analysis process performed by the electromagnetic wave analysis apparatus 20 for design of the electronic equipment will be described. The operations of the electromagnetic wave analysis apparatus 20 in this embodiment relate mainly to the electromagnetic wave analysis process in the line design step (S5 in FIG. 13). Here, the design process of a mobile telephone is taken as an example.

In Embodiment 5, the process of analyzing the effect of the terminals of a component of a circuit board on the transmission and reception functions of a mobile telephone has been described. In this embodiment, however, the process of analyzing the effect of the lines of a circuit board on the transmission and reception functions of a mobile telephone will be described.

Figure 19A:
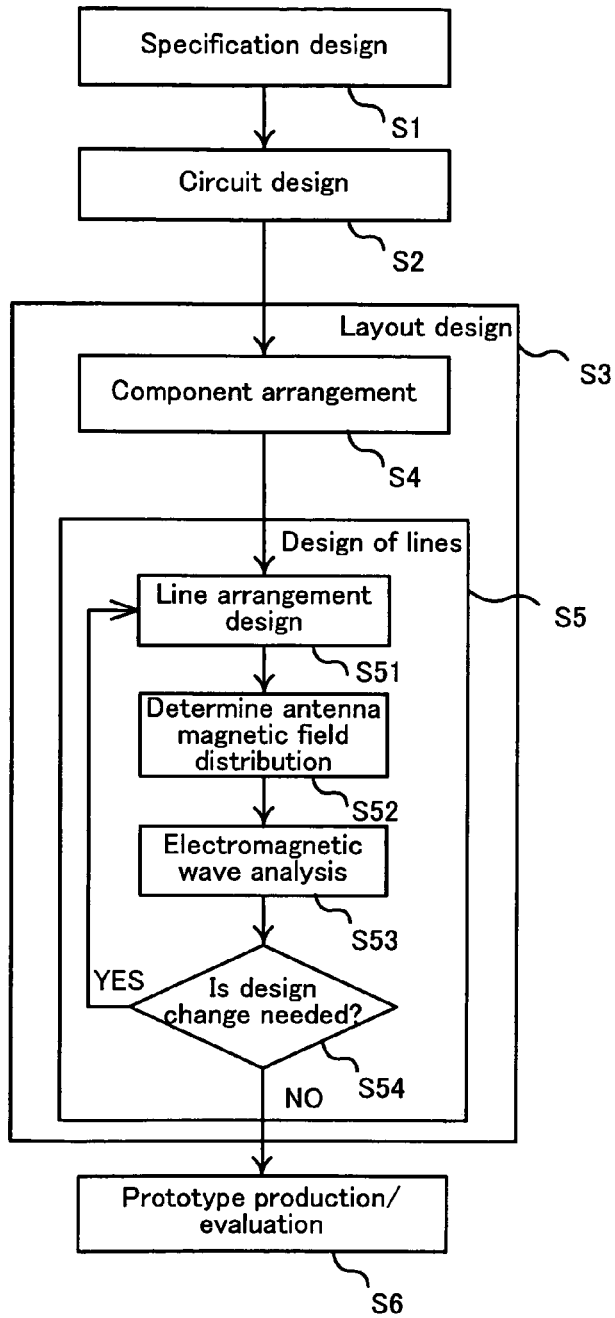
FIG. 19A is a flow chart showing the detailed processes of a line design step.

FIG. 19A is a flow chart showing the detailed processes of the line design step (S5) in FIG. 13.

In the line design step (S5), first, the arrangement of lines for connecting the terminals between ICs provided on the circuit board of the mobile telephone is designed (S51). The position data indicating the positions of the lines on the circuit board are produced and stored in the CAD system 57. The position data include, e.g., the shape of a line pattern, the positions of the terminals connected by the lines, and information about the layer in which the lines are provided (in the case of a multilayer circuit board).

Moreover, the operating frequency of the lines arranged on the circuit board is determined and stored in the CAD system 57. The operating frequency of the lines is the frequency of signals transmitted through the lines.

Next, the simulator 77 determines an antenna magnetic field distribution of the circuit board with the line arrangement designed in the step S51 by calculation (S52). The antenna magnetic field distribution is calculated during transmission and reception conducted by the circuit board.

Subsequently, the electromagnetic wave analysis apparatus 20 performs an electromagnetic wave analysis to examine the effect of the line arrangement designed in the step S51 on the transmission and reception functions of the mobile telephone (S53). The antenna magnetic field distribution data calculated by the simulator 77 in the step S52 are used for the electromagnetic wave analysis.

As a result of the electromagnetic wave analysis (S53), if it is decided that a design change of the line arrangement is needed ("YES" in step S54), then the line arrangement design (S51) is performed again. If it is decided that no design change is needed ("NO" in step S54), then the line arrangement (S5) is finished and the prototype production/evaluation (S6) is performed.

Figure 19B:
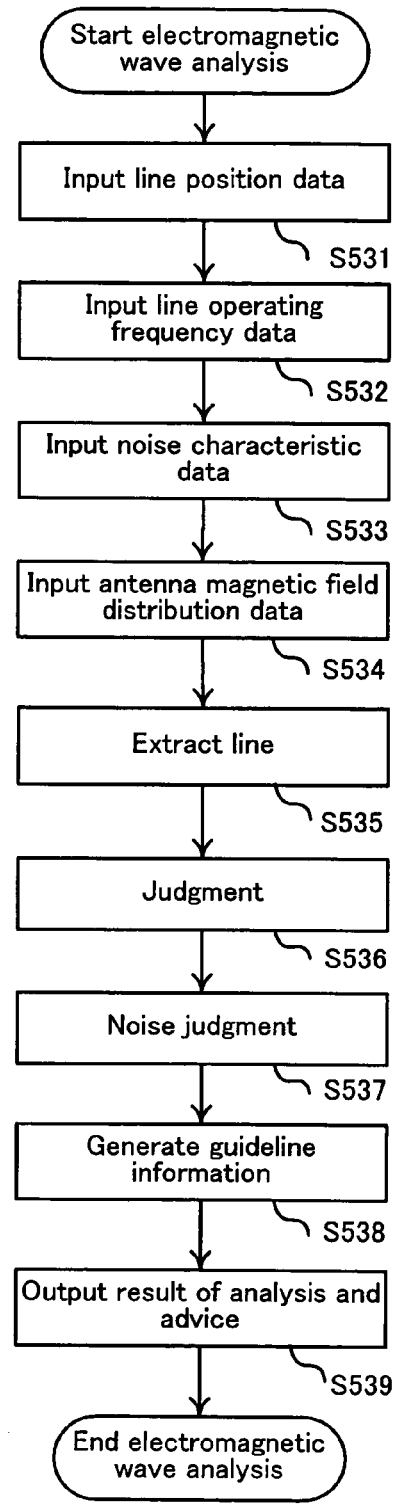
FIG. 19B is a flow chart showing the detailed processes of electromagnetic wave analysis.

FIG. 19B is a flow chart showing the detailed processes of the electromagnetic wave analysis (S53). In the following, the detailed processes of the electromagnetic wave analysis (S53) will be described by referring to FIGS. 18 and 19B.

First, the position input portion 47 reads the position data of lines stored in the CAD system 57 (S531).

FIG. 20A shows an example of the lines for connecting the terminals between the ICs on a circuit board indicated by the position data. In FIG. 20A, a plane parallel to the circuit board 72 is defined as an XY plane, and a direction perpendicular to the circuit board 72 is defined as a Z-axis direction. FIG. 20A is a plan view of the circuit board 72 when viewed from the Z-axis direction.

The ICs 22a and 22b are mounted on the circuit board 72. The IC 22a includes a power supply terminal 23, a clock terminal 24, signal terminals 25a, 25b and 25c, and a ground terminal 26. The IC 22b includes signal terminals 27a, 27b and 27c. The terminals 27a and 25a are connected by a line 28a, the terminals 27b and 25b are connected by a line 28b, and the terminals 27c and 25c are connected by a line 28c.

The frequency input portion 46 reads the operating frequency of the lines stored in the CAD system 57 (S532). As the operating frequency, e.g., information on the IC specification provided by IC suppliers can be used.

The noise characteristic input portion 73 reads the noise characteristic data of the lines stored in the CAD system 57 (S533). The noise characteristic data may be expressed, e.g., as a frequency spectrum of unwanted radiation noise generated from the lines.

Figure 21:
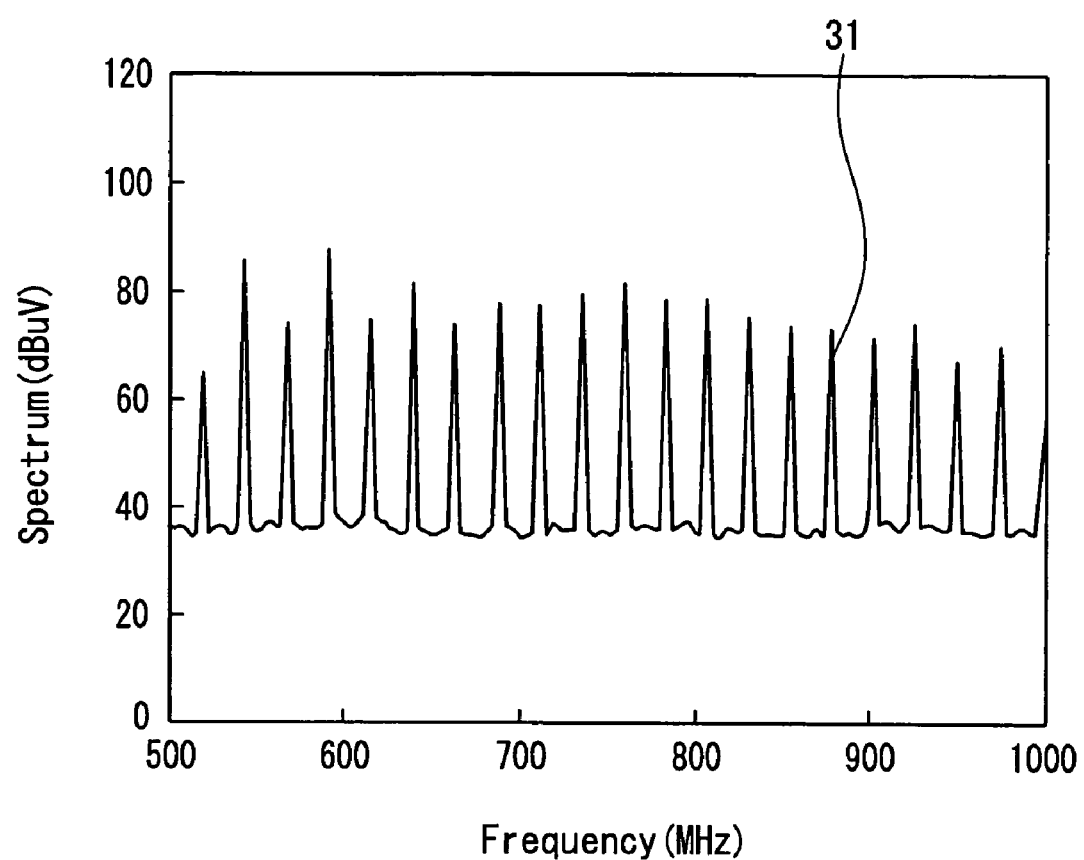
FIG. 21 shows an example of a frequency spectrum 31 of unwanted radiation noise generated from lines.

FIG. 21 shows an example of the frequency spectrum of unwanted radiation noise generated from the lines. The frequency spectrum 31 is obtained by measuring a circuit board provided with ICs and lines for evaluation. For example, when a single IC is mounted on the evaluation board, the frequency spectrum 31 can be obtained by measuring noise generated from the lines that are drawn from the terminals of the IC. As the method for measuring the noise, e.g., a magnetic probe (MP) method can be used.

Although the frequency spectrum is taken as a specific example of the noise characteristic data, a current flowing through the lines and unwanted radiation noise radiated from the whole IC also may be used as the noise characteristic data. The above frequency spectrum, current, or unwanted radiation noise can be obtained using any of the various semiconductor EMI standard evaluation methods standardized by IEC (International Electrotechnical Commission). Examples of the semiconductor EMI standard evaluation method include a VDE (Verband der Electrotecnik) method, a TEM cell method, and a WBFC (Workbench Faraday cage) method. The noise characteristic input portion 73 preferably has the interface function of reading these data in various formats so as to be used in the noise judgment portion 74.

The noise characteristic data may be, e.g., information on the IC specification provided by IC suppliers. It is also possible to use data that have been obtained by measuring a plurality of line patterns and stored in a database.

The antenna electromagnetic field distribution input portion 51 reads the antenna magnetic field distribution data produced by the simulator 77 (S534). FIG. 20B shows an example of the antenna magnetic field distribution 29 around the circuit board 72. In FIG. 20B, a plane parallel to the circuit board 72 is defined as the XY plane, and a direction perpendicular to the circuit board 72 is defined as the Z-axis direction. The antenna magnetic field distribution 29 is indicated by the antenna magnetic field distribution data input in the antenna magnetic field distribution input step (S534). The antenna magnetic field distribution 29 shows a distribution of the antenna magnetic field component in a region that is superimposed over the circuit board 72 in the Z-axis direction and is located on a plane that is parallel to the XY plane and at a certain distance away from the circuit board 72. The distribution range of the antenna magnetic field distribution 29 in FIG. 20B is the same as the region of the circuit board 72 on the XY plane in FIG. 20A.

In the antenna magnetic field distribution 29, a region 30 hatched with diagonal lines is a region where the antenna magnetic field component exceeds a predetermined threshold value. The antenna magnetic field component and the threshold value are the same as those in Embodiment 5, and the explanation will not be repeated. The threshold value of the antenna magnetic field component used in this embodiment may be either the same as the threshold value used for the electromagnetic wave analysis of the component arrangement in Embodiment 5 or different.

Since the antenna magnetic field distribution is provided by simulation, it is not necessary to produce an actual prototype for measurement. Therefore, the antenna magnetic field component can be obtained more easily as compared to the case where the antenna magnetic field distribution is obtained by measurement. In this embodiment, like Embodiment 5, the antenna electromagnetic field distribution input portion 51 also may read the antenna magnetic field distribution data from a database storing a plurality of antenna magnetic field distribution data obtained by the measurements that have been carried out in the past.

Referring to FIG. 19B, the extraction portion 45 extracts a line that may affect the transmission and reception functions of the mobile telephone based on the line position data read in the step S531 and the antenna magnetic field distribution data read in the step S534 (S535). The extraction portion 45 decides whether or not the whole or part of the lines connected between the ICs is included in a region where the antenna magnetic field component exceeds a predetermined threshold value of the antenna magnetic field distribution. For example, if the lines are not included in the region where the antenna magnetic field component exceeds the threshold value, the extraction portion 45 decides that no transmission/reception disturbance of the electronic equipment occurs due to unwanted radiation noise. If the lines are included in the region where the antenna magnetic field component exceeds the threshold value, the extraction portion 45 decides that a transmission/reception disturbance of the electronic equipment occurs due to unwanted radiation noise.

Referring to FIG. 20, an example of a method for making a decision when the extraction portion 45 extracts a line will be described. The extraction portion 45 extracts a line at the position that corresponds to the region 30 where the antenna magnetic field component exceeds the threshold value in the distribution range of the antenna magnetic field distribution 29, as shown in FIG. 20B.

FIG. 20C is a diagram superimposing the region 30 where the antenna magnetic field distribution exceeds the threshold value and the arrangement of the ICs 22a, 22b and the lines 28a, 28b and 28c. In FIG. 20C, the lines 28b, 28c overlap the region 30 where the antenna magnetic field component exceeds the threshold value. Among the lines on the circuit board 72, the lines 28b, 28c are present in the region 30. Therefore, the extraction portion 45 extracts the lines 28b, 28c. In other words, it can be decided that the lines 28b, 28c may cause a transmission/reception disturbance of electromagnetic waves in the mobile telephone.

Referring to FIG. 19B, the judgment portion 44 judges whether or not the lines indicated by the position data read in the step S531 affect the transmission and reception functions of the mobile telephone by comparing the operating frequency read in the step S532 with the frequency band of the mobile telephone to be analyzed (S536).

The judgment portion 44 judges only the lines extracted by the extraction portion 45. In other words, the judgment process is performed on the lines located at the positions corresponding to the region where the antenna magnetic field component exceeds the threshold value.

The judgment portion 44 can judge the lines using the same method with which the judgment portion 44 judges the terminals in Embodiment 5.

The noise judgment portion 74 judges whether or not the lines indicated by the position data read in the step S531 affect the transmission and reception functions of the mobile telephone by comparing the noise characteristic data read in the step S533 with the frequency band of the mobile telephone to be analyzed (S537).

The noise judgment portion 74 judges only the lines extracted by the extraction portion 45. In other words, the noise judgment process is performed on the lines located at the positions corresponding to the region where the antenna magnetic field component exceeds the threshold value.

The noise judgment portion 74 judges whether or not the frequency of noise indicated by the noise characteristic data and generated from a line of the position data is included in the frequency band of the mobile telephone. If the frequency of the noise indicated by the noise characteristic data and generated from the line is included in the frequency band of the mobile telephone, the noise judgment portion 74 judges that the line affects the transmission and reception functions of the mobile telephone.

As a first judgment method, the noise judgment portion 74 can judge the frequency of the noise indicated by the noise characteristic data in the same manner as the first judgment method of the judgment portion 44 using the operating frequency in Embodiment 5.

For example, the first judgment method will be described when the noise characteristic data are the frequency spectrum 31 as shown in FIG. 21. In the frequency spectrum 31, the noise judgment portion 74 judges whether or not the frequency at a peak position is included in the frequency band of the electromagnetic waves transmitted and received by the mobile telephone. The frequency spectrum 31 in FIG. 21 has a plurality of peak positions. Therefore, the frequency at each of the peak positions is compared to the frequency band of the mobile telephone. If at least one of the frequencies at the peak positions is included in the frequency band of the mobile telephone, it is judged that the line showing the frequency spectrum 31 affects the transmission and reception functions of the mobile telephone.

As a second judgment method, the noise judgment portion 74 can judge the frequency characteristics of the noise indicated by the noise characteristic data in the same manner as the second judgment method of the judgment portion 44 using the operating frequency in Embodiment 5.

For example, the second judgment method will be described when the noise characteristic data are the frequency spectrum 31 as shown in FIG. 21. In the frequency spectrum 31, the noise judgment portion 74 judges whether or not the frequency at a peak position is equal or close to a difference (|A−B|) between the transmission frequency A and the reception frequency B of the mobile telephone. The frequency spectrum 31 in FIG. 21 has a plurality of peak positions. Therefore, the frequency at each of the peak positions is compared to the difference |A−B|. If at least one of the frequencies at the peak positions is equal or close to the difference |A−B|, it is judged that the line showing the frequency spectrum 31 affects the transmission and reception functions of the mobile telephone.

As described above, the lines extracted by the extraction portion 45 in the step S535 are judged further by the judgment portion 44 in the step S536, and then noise is judged by the noise judgment portion 74 in the step S537. Thus, it is possible to extract a line that is more likely to affect the transmission and reception functions of the mobile telephone.

After the line extraction step (S535), the judgment step (S536), and the noise judgment step (S537) are finished, the guideline information generator 42 generates information used as a guideline for changing the design of the lines extracted by the extraction portion 45, the lines judged by the judgment portion 44 as affecting the transmission and reception functions of the mobile telephone, or the lines judged by the noise judgment portion 74 as affecting the transmission and reception functions of the mobile telephone (S538).

In FIG. 20C, e.g., the guideline information generator 42 generates information for changing the line patterns of the lines 28b, 28c so that the extracted lines 28b, 28c do not overlap the region 30 where the antenna magnetic field component exceeds the threshold value.

For example, when the operating frequency of the line 28b is included in the frequency band of the electromagnetic waves transmitted and received by the mobile telephone, the guideline information generator 42 may generate information for changing the operating frequency of the line 28b. As a method for changing the operating frequency of the line 28b, e.g., an anti-noise component may be added on the line 28b. When the line 28b and the anti-noise component that serves as a resistance component are connected in series, the operating frequency of the line can be changed. The anti-noise component may be, e.g., an inductor, a ferrite bead, or a resistor.

The output section 19 displays the information generated by the guideline information generator 42 on a display or the like (S539). Moreover, the output section 19 may send the information generated by the guideline information generator 42 to the CAD system 57.

The output section 19 may display not only the data generated by the guideline information generator 42, but also data indicating the lines extracted by the extraction portion 45 or the lines judged by the judgment portion 44 or the noise judgment portion 74 as affecting the transmission and reception functions of the mobile telephone without modifying the data.

In this embodiment, the electromagnetic wave analysis process for terminals in Embodiment 5 may be performed in addition to the electromagnetic wave analysis process for lines as shown in FIG. 19B. Accordingly, the same process as the electromagnetic wave analysis in the component arrangement (S4) can be performed again in the line design (S5). This is useful when the positions of the components arranged in the component arrangement (S4) are changed in the line design (S5).

In this embodiment, the judgment (S536) and the noise judgment (S537) are performed after the line extraction (S535). However, even if at least one of the judgment and the noise judgment is omitted, it is possible to obtain information about the effect of the lines of the circuit board on the transmission and reception functions of the mobile telephone.

In this embodiment, although the noise judgment portion 74 judges the lines extracted by the extraction portion 45, it also may judge lines other than the extracted lines.

Using the electromagnetic wave analysis apparatus 20 in this embodiment, even a person who is not a designer can make a design easily if a threshold value of the antenna magnetic field distribution is given beforehand.

Embodiment 7

In the electromagnetic wave analysis apparatus 20 of Embodiment 6, the noise characteristic input portion 73 reads the noise characteristic data that are prepared beforehand. In an electromagnetic wave analysis apparatus of Embodiment 7, however, the noise characteristic input portion 73 reads noise characteristic data obtained by measuring unwanted radiation noise generated from a circuit board that has been produced as an actual prototype.

In the electromagnetic wave analysis apparatus 20 of Embodiment 6, the antenna electromagnetic field distribution input portion 51 reads the antenna magnetic field distribution data obtained by simulation or stored in a database. In the electromagnetic wave analysis apparatus of Embodiment 7, however, the antenna electromagnetic field distribution input portion 51 reads the antenna magnetic field distribution data obtained by measuring the antenna magnetic field distribution for a circuit board that has been produced as an actual prototype.

Figure 22:
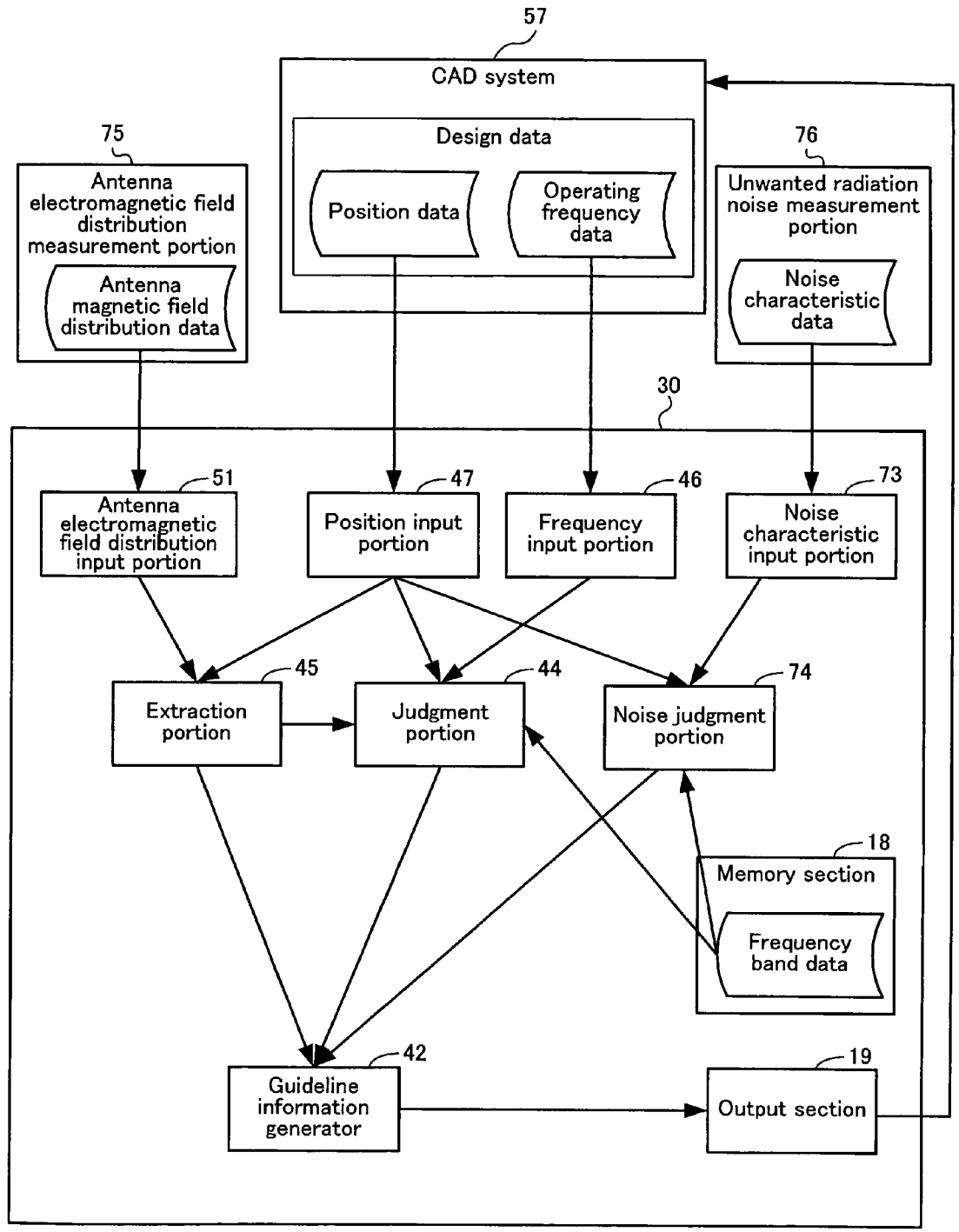
FIG. 22 is a functional block diagram showing the configuration of an electromagnetic wave analysis apparatus in Embodiment 7.

FIG. 22 is a functional block diagram showing the configuration of the electromagnetic wave analysis apparatus in Embodiment 7. In FIG. 22, the same functional blocks as those in FIG. 18 are denoted by the same reference numerals, and the explanation will not be repeated.

The electromagnetic wave analysis apparatus 30 (FIG. 22) differs from the electromagnetic wave analysis apparatus 20 (FIG. 18) in that the electromagnetic wave analysis apparatus 30 is connected to an antenna electromagnetic field distribution measurement portion 75 and an unwanted radiation noise measurement portion 76. In the electromagnetic wave analysis apparatus 30, the antenna electromagnetic field distribution input portion 51 reads the antenna magnetic field distribution data measured by the antenna electromagnetic field distribution measurement portion 75, and the noise characteristic input portion 73 reads the noise characteristic data measured by the unwanted radiation noise measurement portion 76.

The antenna electromagnetic field distribution measurement portion 75 measures the antenna magnetic field distribution for a prototype of the circuit board to be analyzed. The prototype may be produced, e.g., based on the design data stored in the CAD system 57. The antenna electromagnetic field distribution input portion 51 reads the antenna magnetic field distribution data measured by the antenna electromagnetic field distribution measurement portion 75 so that the extraction portion 45 can utilize the antenna magnetic field distribution data.

Figure 23:
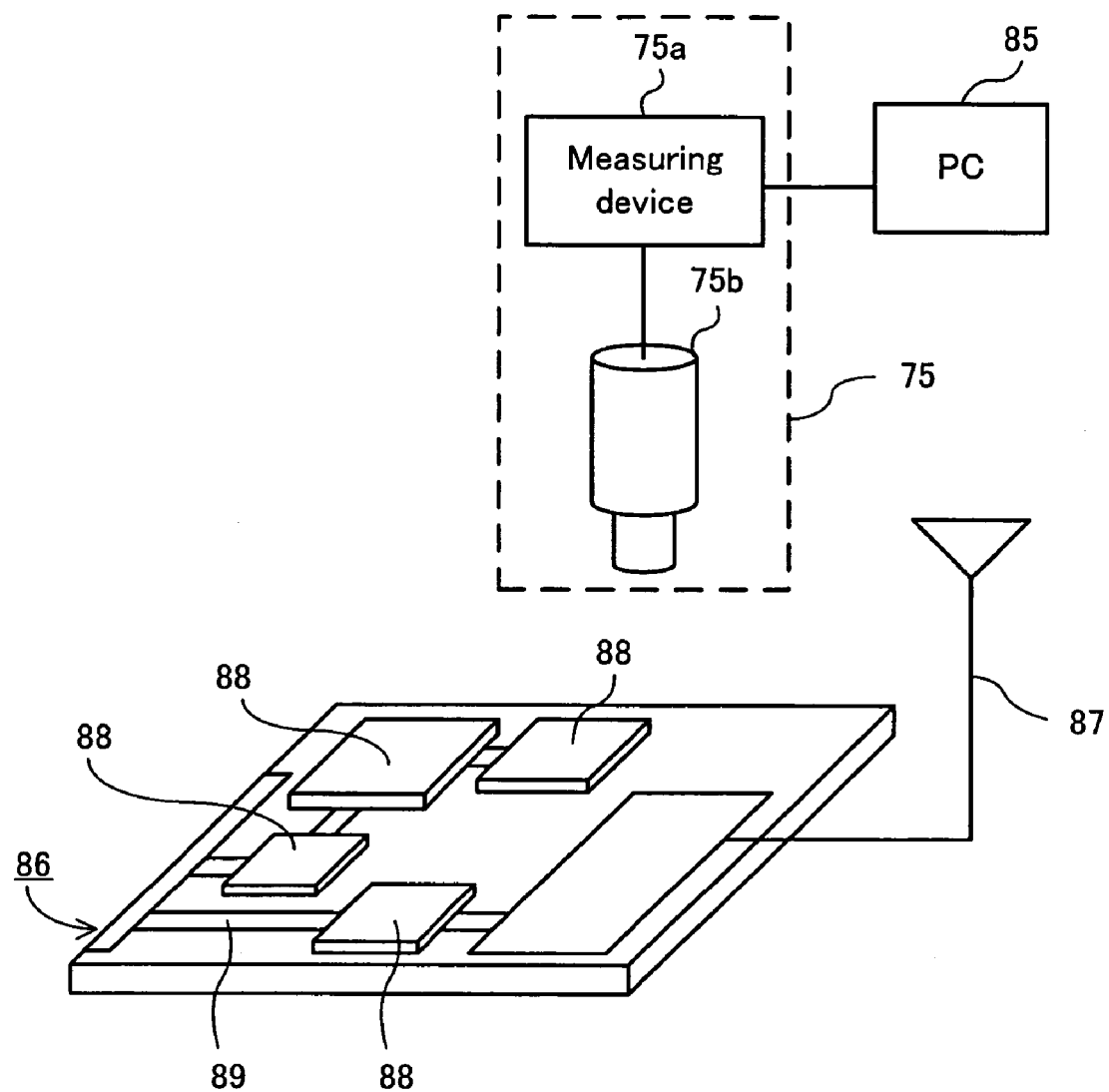
FIG. 23 is a functional block diagram showing an example of the configuration of an antenna electromagnetic field distribution measurement portion 75 for measuring an antenna magnetic field distribution.

FIG. 23 is a functional block diagram showing an example of the configuration of the antenna electromagnetic field distribution measurement portion 75 for measuring the antenna magnetic field distribution. The antenna electromagnetic field distribution measurement portion 75 includes a measuring device 75a and a detector 75b. The antenna electromagnetic field distribution measurement portion 75 is connected to a PC (personal computer) 85. The CAD system 57 and the electromagnetic wave analysis apparatus 30 are constructed to operate on the PC 85. The antenna electromagnetic field distribution measurement portion 75 measures the antenna magnetic field distribution of a circuit board 86. The circuit board 86 may be, e.g., the main board of a mobile telephone that includes an antenna 87, ICs 88, and lines 89.

The detector 75b detects the antenna magnetic field component on or around the circuit board 86. The detector 75b includes, e.g., a detection antenna (not shown). When the detection antenna is located around the circuit board 86, a current flows through the detection antenna by electromagnetic coupling between the circuit board 86 including the antenna 87 and the detection antenna. This current is measured with the measuring device 75a, so that the magnetic field component of the electromagnetic waves radiated from the circuit board 86 including the antenna 87, i.e., the antenna magnetic field component can be measured. The magnetic field component of the electromagnetic waves and the current have a relationship expressed as I (current)=$\mu$B (magnetic flux density). Therefore, if one of the values of the antenna magnetic field component and the antenna current is obtained, then the other value also can be determined by calculation.

Similarly, in the case of the electric field component of the electromagnetic waves and a voltage, if either of the two values is obtained, then the other value can be determined by calculation. In this embodiment, the antenna magnetic field component is determined by measuring the magnetic field component of the electromagnetic waves radiated from the antenna. However, an antenna electric field component may be determined by measuring the electric field component instead of the magnetic field component. The antenna electric field component is the electric field component of the electromagnetic waves radiated from the antenna. Moreover, an antenna voltage, which is the antenna electric field component expressed as a voltage, may be determined instead of the antenna electric field component.

The detector 75b may be moved around the circuit board 86 to measure the antenna magnetic field component at two or more places, thus providing an antenna magnetic field distribution around the circuit board 86.

Moreover, the detector 75b may be moved around the case of the mobile telephone with the circuit board 86 being mounted inside the case, so that the antenna magnetic field component flowing through the surface of the case also can be measured.

The measuring device 75a may be, e.g., a spectrum analyzer. The spectrum analyzer can output an intensity distribution for each frequency, i.e., a spectrum of the antenna magnetic field component detected by the detector 75b.

The unwanted radiation noise measurement portion 76 measures the unwanted radiation noise for a prototype of the circuit board to be analyzed. The noise characteristic input portion 73 reads the noise characteristic data measured by the unwanted radiation noise measurement portion 76 so that the noise judgment portion 74 can utilize the noise characteristic data.

Like Embodiment 6, the noise characteristic data show the frequency characteristics of noise generated from the terminals of components or lines indicated by the position data. The noise characteristic data may be expressed, e.g., as a frequency spectrum in FIG. 21. The noise characteristic data also may be expressed as time series data of a waveform.

The unwanted radiation noise measurement portion 76 can have a configuration similar to the antenna electromagnetic field distribution measurement portion 75 in FIG. 23. Generally, the intensity of the unwanted radiation noise is much smaller than that of the electromagnetic waves radiated from the antenna. Therefore, it is preferable that the detector for detecting the magnetic field component of the unwanted radiation noise radiated from the circuit board is more suitable than the detector 75b (for measuring the antenna magnetic field component) for the measurement of a magnetic field with a smaller intensity.

In this embodiment, although the antenna electromagnetic field distribution measurement portion 75 and the unwanted radiation noise measurement portion 76 are independent of each other, a set of measuring device and detector may be used to measure both the antenna magnetic field component and the unwanted radiation noise.

Next, the operations of an electromagnetic wave analysis process performed by the electromagnetic wave analysis apparatus 30 for design of the electronic equipment will be described. The operations of the electromagnetic wave analysis apparatus 30 in this embodiment are suitable for the electromagnetic wave analysis process in the prototype production/evaluation step (S6 in FIG. 13). Here, the design process of a mobile telephone is taken as an example.

Figure 24:
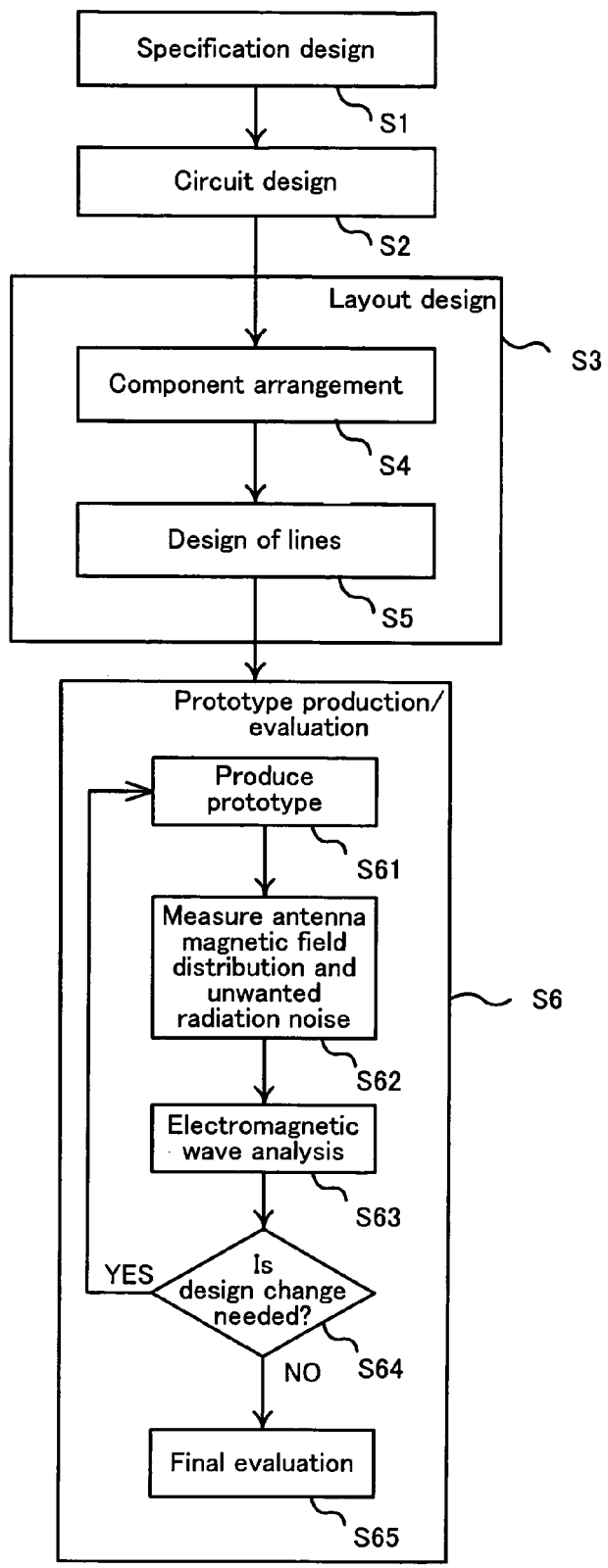
FIG. 24 is a flow chart showing the detailed processes of a prototype production/evaluation step.

FIG. 24 is a flow chart showing the detailed processes of the prototype production/evaluation step (S6) in FIG. 13.

In the prototype production/evaluation step (S6), first, a prototype of the circuit board is produced based on the design data generated by the CAD system 57 (S61).

Then, the antenna electromagnetic field distribution measurement portion 75 and the unwanted radiation noise measurement portion 76 measure the antenna magnetic field distribution and unwanted radiation noise of the circuit board 86 produced in the step S61, respectively (S62). The antenna magnetic field distribution and the unwanted radiation noise can be measured, e.g., during actual transmission and reception conducted by the mobile telephone. Alternatively, they can be measured simply while the antenna is excited at a predetermined frequency with an oscillator attached to the antenna feeding point. Thus, the antenna magnetic field distribution data and the unwanted radiation noise for transmission and reception can be obtained.

The electromagnetic wave analysis apparatus 30 performs an electromagnetic wave analysis to examine the effect of the circuit board 86 produced in the step S61 on the transmission and reception functions of the mobile telephone (S63). The electromagnetic wave analysis is performed using the antenna magnetic field distribution and the unwanted radiation noise measured in the step S62.

As a result of the electromagnetic wave analysis (S63), if it is decided that a design change of the circuit board 86 is needed ("YES" in step S64), then the design data of the circuit board 86 are changed, and a prototype of the circuit board 86 is produced again. If it is decided that no design change is needed ("NO" in step S64), then the final evaluation (S65) is performed.

The detailed processes of the electromagnetic wave analysis (S63) are the same as those in Embodiment 6, and the explanation will not be repeated.

As described above, the electromagnetic wave analysis apparatuses 10, 20 and 30 in Embodiments 5, 6 and 7 extract a terminal of an IC or a line pattern for connecting ICs that is present in a region where the antenna magnetic field component exceeds a predetermined threshold value by using the antenna magnetic field distribution data obtained by measurement or simulation and inherent information such as the positions of the terminals of ICs, the lines for connecting the ICs, or the operating frequency. Based on this extraction process, information about the effect of unwanted radiation noise of electronic equipment on the transmission and reception functions of the electronic equipment can be obtained easily with a simple system configuration. Moreover, a designer can understand the anti-noise effect quantitatively while estimating the actual operation of a mobile telephone. In designing a mobile telephone, the electromagnetic wave analysis apparatus performs the processes of the flow chart as shown in FIG. 14, 17 or 19B, so that the mobile telephone can be designed efficiently, which in turn reduces both the period of time and cost for development.

The electromagnetic wave analysis apparatus and program of the present invention can provide information about the effect of the component or line arrangement of a circuit board of electronic equipment on the antenna transmission and reception functions of the electronic equipment. Therefore, they are useful for efficient development of electronic equipment.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electromagnetic wave analysis apparatus for examining an effect on communication signals transmitted and received via an antenna of unwanted radiation noise generated from a circuit board of electronic equipment that transmits and receives communication signals via the antenna, the electromagnetic wave analysis apparatus comprising:

an antenna electromagnetic field distribution input portion that inputs antenna electromagnetic field distribution data indicating a distribution of an antenna electromagnetic field that is a magnetic field component or an electric field component of electromagnetic waves that are the communication signals transmitted and received via the antenna;

a board near electromagnetic field distribution input portion that inputs board near electromagnetic field distribution data indicating a distribution of either or both of an electric field component and a magnetic field component of a board near electromagnetic field that is unwanted radiation noise radiated from the circuit board of the electronic equipment as a result of operation of the electronic equipment; and a correlation value generator that generates a distribution of correlation values showing a correlation between the antenna electromagnetic field and the board near electromagnetic field based on the antenna electromagnetic field distribution data and the board near electromagnetic field distribution data.

2. The electromagnetic wave analysis apparatus according to claim 1, further comprising a comparator that decides the presence or absence of a transmission/reception disturbance of the electromagnetic waves in the electronic equipment by comparing each of the correlation values in the correlation value distribution with a predetermined threshold value.

3. The electromagnetic wave analysis apparatus according to claim 1, wherein the correlation values include a product of a value of the antenna electromagnetic field and a value of the board near electromagnetic field.

4. The electromagnetic wave analysis apparatus according to claim 1, wherein the correlation value generator further generates either or both of a maximum value and a minimum value of the correlation values as an evaluation value.

5. The electromagnetic wave analysis apparatus according to claim 1, wherein the antenna electromagnetic field distribution data and the board near electromagnetic field distribution data are expressed as vectors with coordinates, and the correlation value generator generates the distribution of correlation values by calculating the correlation values in such a manner that at least one component of a vector of the antenna electromagnetic field distribution data at a point with coordinates is multiplied by the at least one component of a vector of the board near electromagnetic field distribution data at a point with coordinates corresponding to the coordinates of said point.

6. The electromagnetic wave analysis apparatus according to claim 1, further comprising:

an antenna electromagnetic field distribution measurement portion that determines the distribution of an antenna electromagnetic field that is a magnetic field component or an electric field component of the electromagnetic waves transmitted and received via the antenna by measuring an electromagnetic field around the electronic equipment, and sends the result of the measurement to the antenna electromagnetic field distribution input portion as the antenna electromagnetic field distribution data; and a board near electromagnetic field distribution measurement portion that determines the distribution of either or both of an electric field component and a magnetic field component of a board near electromagnetic field that is unwanted radiation noise radiated from the circuit board of the electronic equipment as a result of operation of the electronic equipment by measuring an electromagnetic field around the electronic equipment, and then sends the result of the measurement to the board near electromagnetic field distribution input portion as the board near electromagnetic field distribution data.

7. The electromagnetic wave analysis apparatus according to claim 1, further comprising:
an antenna electromagnetic field distribution analysis portion that determines the distribution of an antenna electromagnetic field that is a magnetic field component or an electric field component of the electromagnetic waves transmitted and received via the antenna by simulation through analyzing an electromagnetic field around the electronic equipment, and sends the result of the simulation to the antenna electromagnetic field distribution input portion as the antenna electromagnetic field distribution data; and
a board near electromagnetic field distribution analysis portion that determines the distribution of either or both of an electric field component and a magnetic field component of a board near electromagnetic field that is unwanted radiation noise radiated from the circuit board of the electronic equipment as a result of operation of the electronic equipment by simulation through analyzing an electromagnetic field around the electronic equipment, and then sends the result of the simulation to the board near electromagnetic field distribution input portion as the board near electromagnetic field distribution data.

8. The electromagnetic wave analysis apparatus according to claim 1, further comprising a data corrector,
wherein each of the antenna electromagnetic field distribution data and the board near electromagnetic field distribution data indicates a distribution on at least one plane, and
when a distance between the plane of the distribution indicated by the antenna electromagnetic field distribution data and the circuit board differs from a distance between the plane of the distribution indicated by the board near electromagnetic field distribution data and the circuit board, the data corrector converts at least one of the antenna electromagnetic field distribution data and the board near electromagnetic field distribution data so that the antenna electromagnetic field distribution data and the board near electromagnetic field distribution data indicate the distributions of the antenna electromagnetic field distribution data and the board near electromagnetic field distribution data on a same plane.

9. The electromagnetic wave analysis apparatus according to claim 1, wherein the electronic equipment is a mobile telephone.

10. The electromagnetic wave analysis apparatus according to claim 1, wherein the antenna electromagnetic field distribution data indicate a distribution of an antenna current or an antenna voltage, where the magnetic field component of the electromagnetic waves transmitted and received via the antenna is expressed as a current and identified as the antenna current, and the electric field component of the electromagnetic waves is expressed as a voltage and identified as the antenna voltage.

11. A design support apparatus comprising the electromagnetic wave analysis apparatus according to claim 1.

12. A recording medium for storing an electromagnetic wave analysis program that allows a computer to execute processes of examining an effect on communication signals transmitted and received via an antenna of unwanted radiation noise generated from a circuit board of electronic equipment that transmits and receives communication signals via the antenna,
the electromagnetic wave analysis program allowing the computer to execute the following processes:
an antenna electromagnetic field distribution input process of inputting antenna electromagnetic field distribution data indicating a distribution of an antenna electromagnetic field that is a magnetic field component or an electric field component of electromagnetic waves that are the communication signals transmitted and received via the antenna;
a board near electromagnetic field distribution input process of inputting board near electromagnetic field distribution data indicating a distribution of either or both of an electric field component and a magnetic field component of a board near electromagnetic field that is unwanted radiation noise radiated from the circuit board of the electronic equipment as a result of operation of the electronic equipment; and
a correlation value generation process of generating a distribution of correlation values showing a correlation between the antenna electromagnetic field and the board near electromagnetic field based on the antenna electromagnetic field distribution data and the board near electromagnetic field distribution data.

13. A recording medium storing a design support program including the electromagnetic wave analysis program according to claim 12.

14. An electromagnetic wave analysis method using a computer for examining an effect on communication signals transmitted and received via an antenna of unwanted radiation noise generated from a circuit board of electronic equipment that transmits and receives communication signals via the antenna,
the method comprising:
allowing an antenna electromagnetic field distribution input portion of the computer to input antenna electromagnetic field distribution data indicating a distribution of an antenna electromagnetic field that is a magnetic field component or an electric field component of electromagnetic waves that are the communication signals transmitted and received via the antenna;
allowing a board near electromagnetic field distribution input portion of the computer to input board near electromagnetic field distribution data indicating a distribution of either or both of an electric field component and a magnetic field component of a board near electromagnetic field that is unwanted radiation noise radiated from the circuit board of the electronic equipment as a result of operation of the electronic equipment; and
allowing a correlation value generator of the computer to generate a distribution of correlation values showing a correlation between the antenna electromagnetic field and the board near electromagnetic field based on the antenna electromagnetic field distribution data and the board near electromagnetic field distribution data.

* * * * *